United States Patent
Terada et al.

(10) Patent No.: US 7,020,211 B2
(45) Date of Patent: Mar. 28, 2006

(54) ENCODING METHOD AND APPARATUS FOR FORWARD ERROR CORRECTION

(75) Inventors: Kazuhiko Terada, Yokohama (JP); Kenji Kawai, Yokosuka (JP); Osamu Ishida, Tokyo (JP); Haruhiko Ichino, Yokosuka (JP)

(73) Assignee: Nippon Telegraph and Telephone Corporaiton, Tokyo (JP)

( * ) Notice: Subject to any disclaimer, the term of this patent is extended or adjusted under 35 U.S.C. 154(b) by 151 days.

(21) Appl. No.: 10/257,795

(22) PCT Filed: Apr. 17, 2001

(86) PCT No.: PCT/JP01/03272

§ 371 (c)(1),
(2), (4) Date: Oct. 16, 2002

(87) PCT Pub. No.: WO01/80433

PCT Pub. Date: Oct. 25, 2001

(65) Prior Publication Data

US 2003/0202610 A1    Oct. 30, 2003

(30) Foreign Application Priority Data

Apr. 18, 2000 (JP) ............................ 2000-117025
May 2, 2000 (JP) ............................ 2000-133796

(51) Int. Cl.
*H04L 27/00* (2006.01)
*G06F 11/00* (2006.01)

(52) U.S. Cl. ....................................... 375/259; 714/701

(58) Field of Classification Search ................ 714/752, 714/701, 778, 784, 809, 758, 755, 759, 785, 714/762, 704; 341/58, 106, 95, 59; 371/35, 371/49.1; 370/537, 111, 431; 375/241, 242, 375/253, 262, 265, 121, 254; 340/347 DD See application file for complete search history.

(56) References Cited

U.S. PATENT DOCUMENTS 4,486,739 A    12/1984  Franaszek et al. .......... 340/347
4,811,361 A *  3/1989   Bacou et al. ............... 375/242

(Continued)

FOREIGN PATENT DOCUMENTS

JP    63-129750 A1    6/1988

(Continued)

OTHER PUBLICATIONS

IEEE Std 802.3, 1998 Edition□□ Chapter 36, PCS and PMA sublayer, type 1000Base-X pp. 923-952.*

(Continued)

*Primary Examiner*—Jay K. Patel
*Assistant Examiner*—Jacob Meek
(74) *Attorney, Agent, or Firm*—Darby & Darby

(57) ABSTRACT

In a transmission node, a portion of the control information is separated into M (M is an integer) parts of control information blocks having N (N is an integer) bit length. A control information parity having (8−N) bit length is added to control information block i. The control information block is encoded to M parts of control information having 8 bit length according to a predetermined control information bit array. The control information parity and the control information bit array are set such that Hamming distance of each of the control information code is d, and Hamming distance of the control information 10B code is D (d and D are integers). In a receiving node, the control information code is separated into the control information block and the control information parity. Parity check is performed. When an error is detected, error processing is performed.

6 Claims, 4 Drawing Sheets

U.S. PATENT DOCUMENTS

| | | | |
|---|---|---|---|
| 5,144,304 A * | 9/1992 | McMahon et al. | 341/58 |
| 5,253,274 A * | 10/1993 | Janniello et al. | 375/377 |
| 5,304,996 A * | 4/1994 | Hsu et al. | 341/95 |
| 5,396,239 A * | 3/1995 | McMahon et al. | 341/58 |
| 5,526,370 A * | 6/1996 | McAuley | 714/800 |
| 5,844,918 A * | 12/1998 | Kato | 714/751 |
| 6,044,482 A * | 3/2000 | Wong | 714/758 |
| 6,111,528 A * | 8/2000 | Bagley | 341/58 |
| 6,225,924 B1 * | 5/2001 | Epshtein et al. | 341/106 |
| 6,662,332 B1 * | 12/2003 | Kimmitt | 714/701 |
| 6,718,491 B1 * | 4/2004 | Walker et al. | 714/701 |
| 6,728,920 B1 * | 4/2004 | Ebersman | 714/752 |
| 6,738,935 B1 * | 5/2004 | Kimmitt | 714/701 |
| 2001/0024457 A1 * | 9/2001 | Barry et al. | |

FOREIGN PATENT DOCUMENTS

| | | |
|---|---|---|
| JP | 3297236 A1 | 12/1991 |
| JP | 07-106976 A1 | 4/1995 |
| JP | 2000092033 A1 | 3/2000 |

OTHER PUBLICATIONS

Information Theory of Data Transmission Codes; Wiley Encyclopedia of Electrical and Electronics Engineering Online; John Wiley & Sons, Inc. Article Online Posting Date: Dec. 27, 1999.*

* cited by examiner

ENCODING METHOD AND APPARATUS FOR FORWARD ERROR CORRECTION

TECHNICAL FIELD

The present invention relates to an encoding method for encoding control information in a communication system. In particularly, the present invention relates to an encoding method for encoding control information used in communication system in which the control information is detected and corrected when an error occurs during communication data transmission in communication between nodes using 8B/10B code intermediates.

BACKGROUND ART

A communication system for transmitting and receiving control information which is used for communication data transmission and processing is explained below.

A transmission node encodes communication data which is separated into a plurality of blocks having 8 bit length to a communication data code according to 8B/10B encoding rule and transmits the data. Details of 8B/10B encoding rules used here are disclosed in Japanese Unexamined Patent Application, First Publication No. Sho 59-10056. Control information transmission processing is performed for each control information which is separated into M parts (M is an integer) of blocks having 8 bit length during a period in which communication data code is not transmitted in which each block is encoded to control information 10B code according to 8B/10B encoding rule and is transmitted.

A transmission node decodes the communication data code which is received thereat according to 8B/10B encoding rules and obtains communication data which is separated into a plurality of blocks having 8-bit length. Also, the transmission node restores the control information by performing the control information transmission processing in which M parts of control information 10B code are decoded according to 8B/10B encoding rules.

In the communication system which is realized using the above-mentioned conventional technology, when a bit error occurs in the control information 10B code which is being transmitted, a control information which is received at a receiving node has a different value from a value in the control information which is transmitted from the transmission node. Such a difference may cause a control error and may be a cause of a serious problem. The 8B/10B encoding rule has an error detecting device such as running disparity in which a different code is used according to a difference (running disparity value) between total number of "1" (one) which are coded and total number of "0" (zero) which are coded. However, it is not possible all the time to identify the code in which an error occurs by running a disparity detecting method; therefore, it is difficult to determine whether or not a control information code contains an error.

Also, when a repeater which generates an 8B/10B code exists on a transmission line, a running disparity is normalized in the repeater; therefore, only an error of disparity which occurs between a repeater and a receiving node can be detected. Therefore, error detecting capacity is insufficient. Furthermore, when there is a transmission interval in which data transmission is performed in a different encoding format from the 8B/10B encoding rules in the transmission line, the running disparity detecting method cannot detect an error occurring at such an interval.

The present invention was made to solve the above-mentioned problems. An object of the present invention is to provide an encoding method for control information in a communication system for separating all of the control information or a portion of control information into M (M is an integer) parts of control information blocks having N (N is an integer from 1 to 7) bit length, adding a control information parity having a predetermined (8–N) bit length to each of the control information blocks i (i is an integer from 1 to M), encoding the control information blocks i into M parts of control information code having 8 bit length according to a predetermined control information bit array, performing a control information transmission processing. In an encoding method according to the present invention, the control information parity and the control information bit array are determined such that the Hamming distance of each of the control information code is at least d (d is an integer from 2 to 8), and the Hamming distance of each of the control information 10B code is at least D (D is an integer from 2 to 10). By doing this, it is possible to detect control information in which an error occurs during data transmission and to correct it.

Also, another object of the present invention is to provide an encoding method for control information in a communication system in which the control information code which is obtained by performing the control information receiving processing is separated into the control information block and the control information parity at the receiving node, and the parity check is performed to the control information block and the control information parity, and an error processing is executed when an error is detected. Thus, the control information in which an error occurs during the data transmission is detected and corrected.

DISCLOSURE OF INVENTION

An encoding method according to the present invention for a communication system executes processes for:

transmitting communication data;

Encoding at least a portion of control information which is added for transmitting and processing the communication data to M (M is an integer) parts of control information code according to the control information encoding rule.

performing a control information transmission processing on the control information code and transmitting it; and decoding the M parts of control information code which are obtained in a control information receiving processing into at least a portion of the control information according to a control information encoding rule.

Also, the encoding method according to the present invention comprises:

a process for separating at least a portion of the control information into M parts of control information blocks having N (N is an integer from 1 to 7) bit length;

a process for encoding each of the control information block into M parts of the control information code having a Hamming distance at least d (d is an integer from 2 to 8); and the Hamming distance of each code is at least D (D is an integer from 2 to 10) when M parts of the control information code are encoded into M parts of control information having 10 (ten) bit length according to an 8B/10B encoding rule.

Also, the encoding device in the communication apparatus according to the present invention executes:

a process for separating at least a portion of the control information into M parts of control information block having N (N is an integer from 1 to 7); and a process for encoding each of the control information block to M parts of control information code having a Hamming distance such as at least d (d is an integer from 2 to 8).

An encoding method of control information according to the present invention executes process of:

transmitting communication data;

encoding at least a portion of a control information which is added for transmitting and processing the communication data to M (M is an integer) parts of control information code according to the control information encoding rule;

performing a control information transmission processing on the control information code and transmitting it; and decoding the M parts of control information code which are obtained in a control information receiving processing into at least a portion of the control information according to a control information encoding rule.

The encoding method for a control information according to the present invention executes processes comprising:

a process for separating at least a portion of the control information into M parts of control information blocks having N (N is an integer from 1 to 7) bit length;

a process for adding a control information parity having (8−N) bit length to each of the control information block and arranging the control information block according to a predetermined control information bit array; and a process for encoding the control information block into M parts of control information code having 8 bit length having a Hamming distance of at least d (d is an integer from 2 to 8).

Also, the encoding device according to the present invention executes processes comprising:

a process for separating at least a portion of the control information into M parts of control information blocks having N (N is an integer from 1 to 7) bit length;

a process for adding a control information parity having (8−N) bit length to each of the control information block and to dispose the control information blocks according to a predetermined control information bit array; and a process for encoding each of the control information block into M parts of the control information code having a Hamming distance at least d (d is an integer from 2 to 8).

According to the present invention, it is possible to determine whether or not the encoded control information contains an error. Also, it is possible to detect an error which occurs in any relay interval. Furthermore, when there is a transmission interval in which data transmission is performed in different encoding format from the 8B/10B encoding rule in the transmission line, it is possible to detect an error and correct it.

The present invention provides an encoding method of the control information having excellent effects such as detecting and correcting of control information containing an error occurring during the data transmission in various types of communication systems.

BEST MODE FOR CARRYING OUT THE INVENTION

Figure 1:
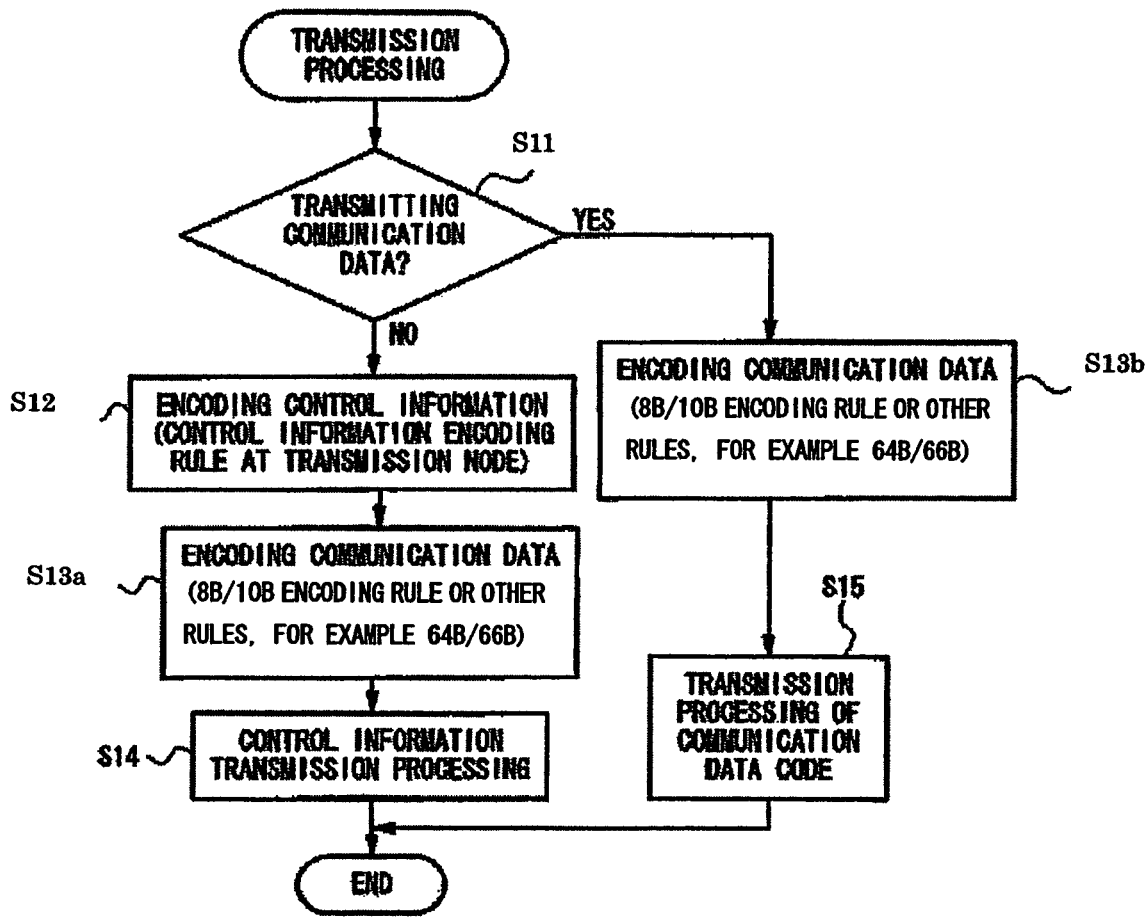
FIG. 1 is a flow chart of transmission processes in a transmission node.
Figure 2:
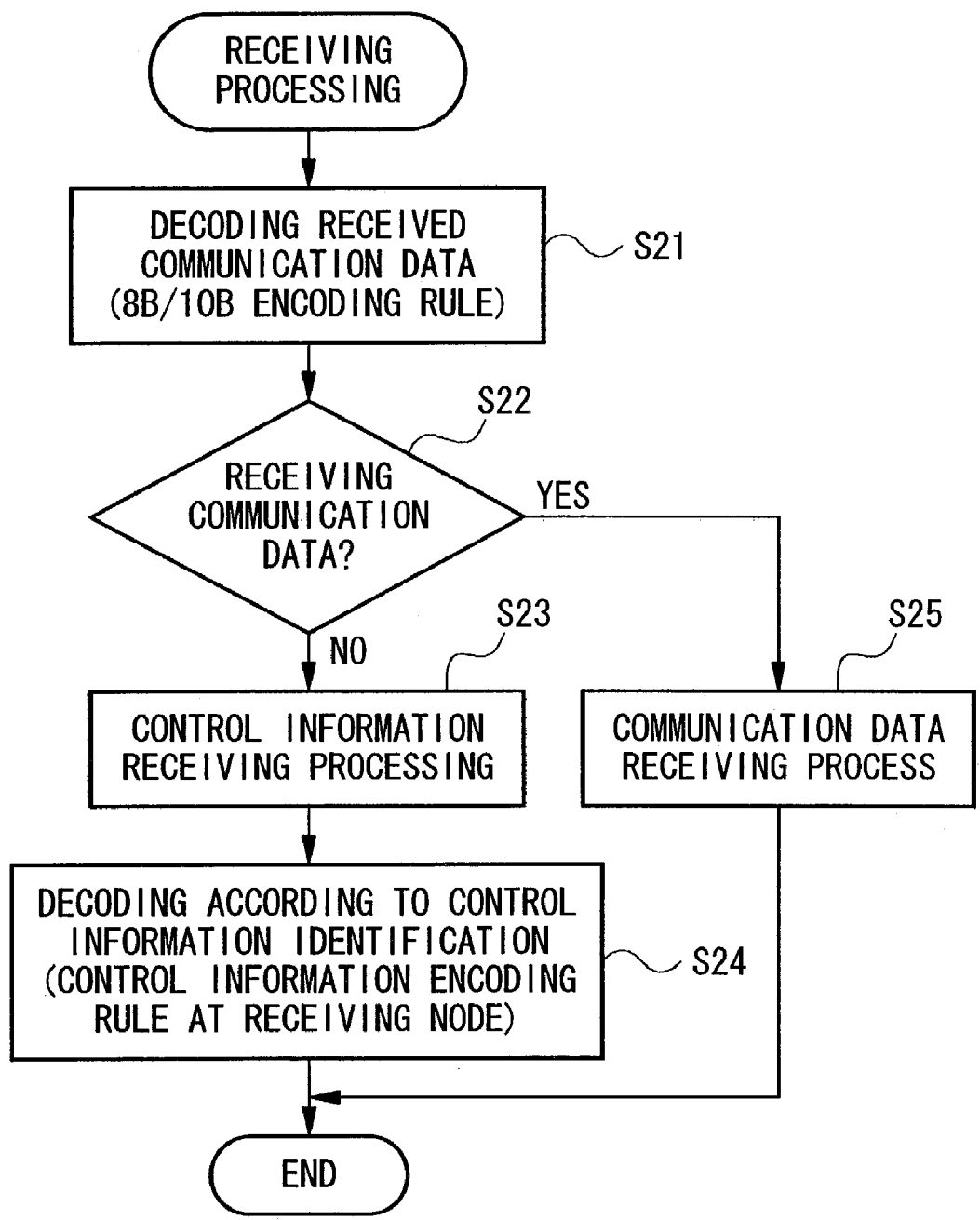
FIG. 2 is a flow chart of transmission processes in a receiving node.
Figure 3:
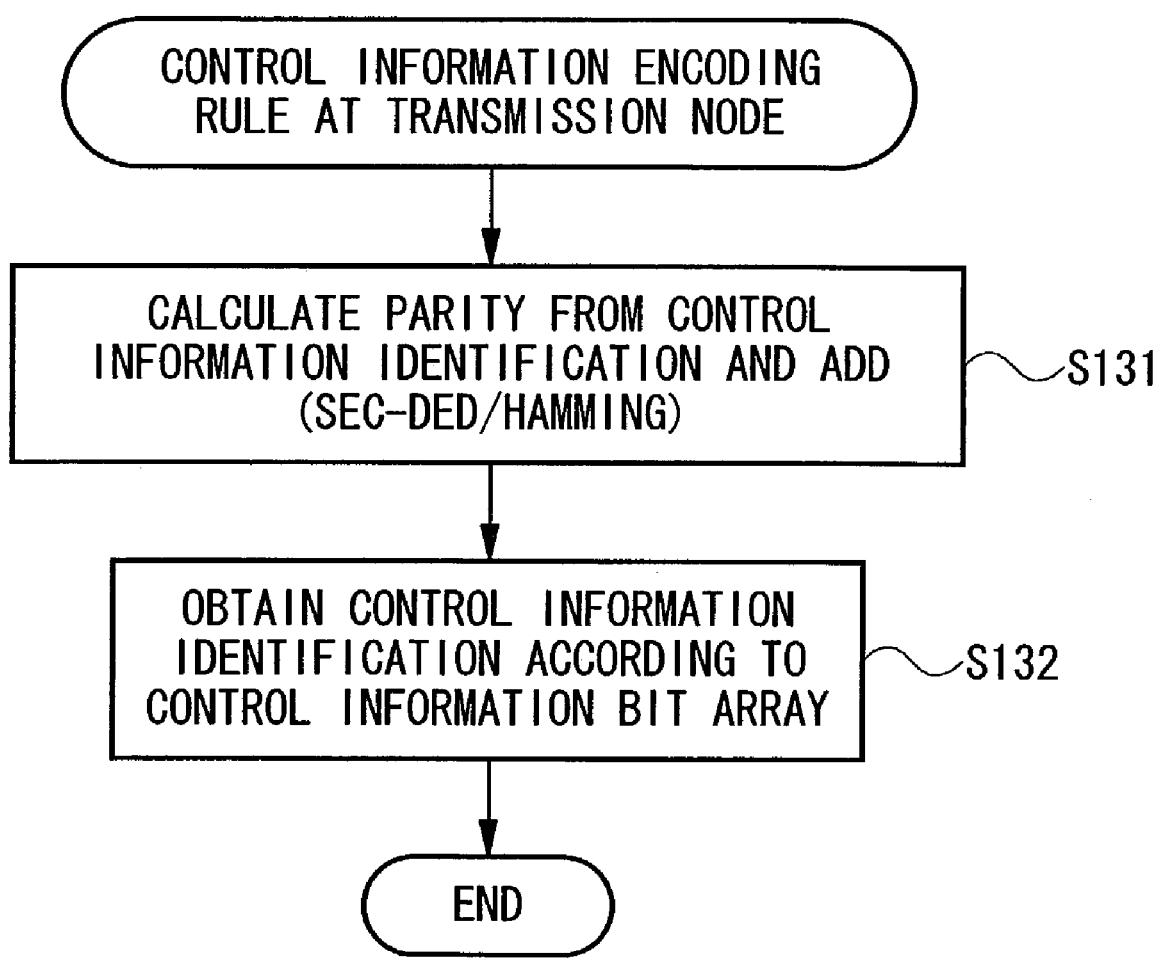
FIG. 3 is a flow chart of encoding process for control information in a transmission node.
Figure 4:
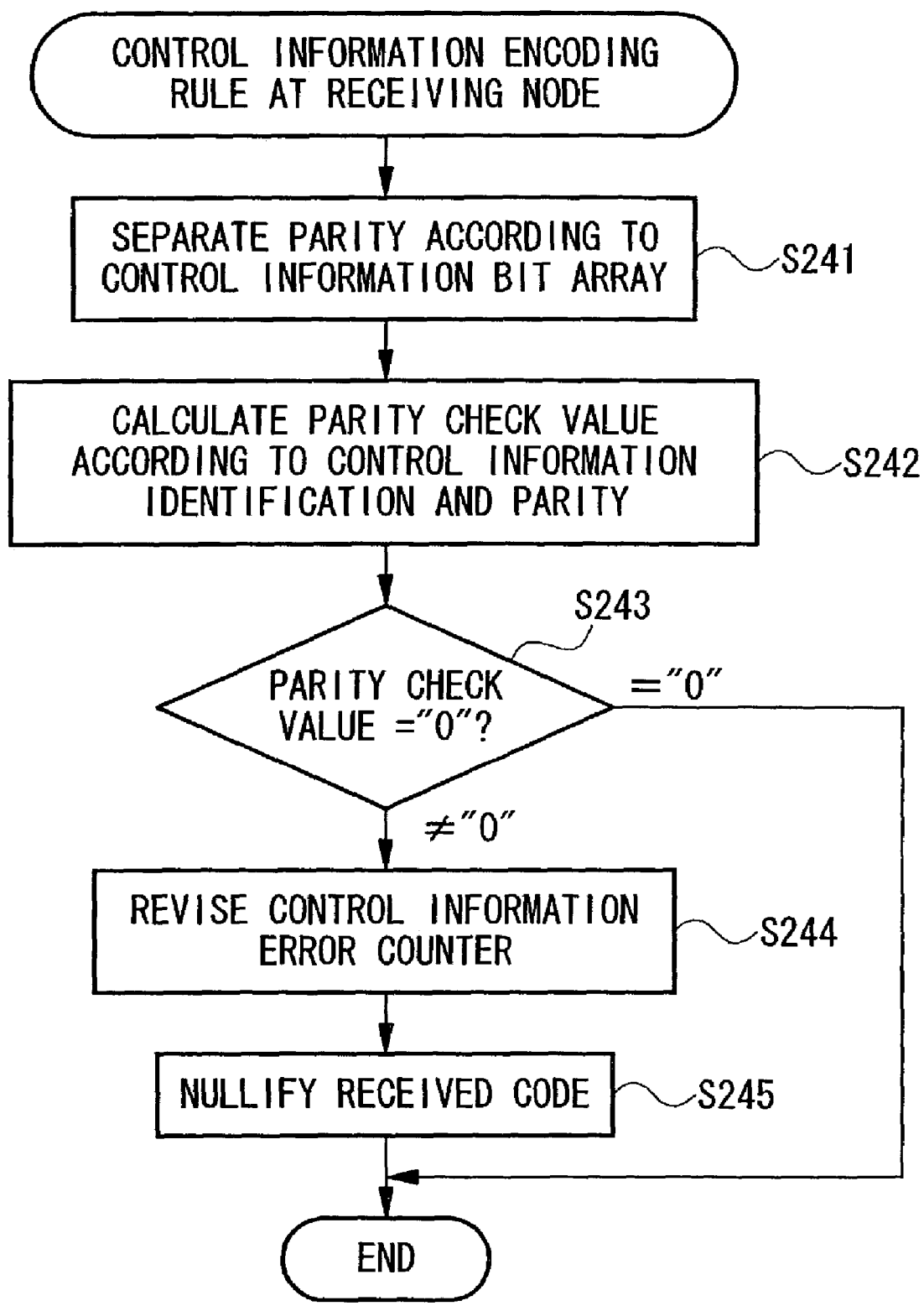
FIG. 4 is a flow chart of encoding process for control information in a receiving node.

FIGS. 1 to 4 are flow charts for explaining operations in an embodiment of the present invention. FIG. 1 shows a transmission processes in a transmission node. FIG. 2 shows a transmission processes in a receiving node. FIGS. 3 and 4 show control information encoding rules for each node.

A communication system for transmitting and receiving the control information which is used for transmitting and processing the communication data is explained with reference to FIGS. 1 to 4.

First, an encoding method for the control information in which relationships such as (minimum) Hamming distance d of an 8B code=4, and (minimum) Hamming distance D of 10B code=2, are satisfied is explained as a first embodiment of the present invention.

In FIG. 1, a transmission node encodes communication data which is separated into a plurality of 8 bit length blocks to a communication data code according to an 8B/10B encoding rule (Steps S11, S13b) and transmits the data (step S15). Also, the transmission node encodes the control information containing control information identification having a 4-bit length and control data which are used for transmitting and processing the communication data to a control information identification code and a control data code (Step S11, S12). At this time, the control information identification is encoded in the control information identification code according to a control information encoding rule of the transmission node. After that, the transmission node encodes the control information according to an 8B/10B encoding rule and transmits it (Steps S13a, S4).

The control information encoding rule of the transmission node is explained as follows with reference to the flow chart shown in FIG. 3. First, a control information identification parity containing bit such as P1 to P4 is calculated from the control information identification containing bit such as d1 to d4 according to following formulae.

$$p1 = d2 \text{ XOR } d3 \text{ XOR } d4$$

$$p2 = d1 \text{ XOR } d3 \text{ XOR } d4$$

$$p3 = d1 \text{ XOR } d2 \text{ XOR } d4$$

$$p4 = d1 \text{ XOR } d2 \text{ XOR } d3$$

"A XOR B" indicates "the exclusive OR of A and B".

Here, the above-mentioned formulae are known as (8, 4) SEC-DED (Single Error Correction-Double Error Detection) code and are disclosed on pages 72 to 74 in "Error Correction Codes and Their applications" (ISBN 4-274-03486-0), published by Ohmsha.

Each of bit d1 to d4 of the control information identification and each of bit p1 to p4 of the control information identification parity are disposed according to the control information identification bit array as follows so as to obtain the control information identification code (Step S132). Here, bit locations A to H which are described as follows indicate locations of octet bit in 8B/10B code.

| | | |
|---|---|---|
| d1: bit location A | d2: bit location B | d3: bit location C |
| d4: bit location D | p1: bit location E | p2: bit location G |
| p3: bit location H | p4: bit location F | |

Here, the control information identification bit array is not limited to the above-described array. If the control information identification bit array is selected from arrays shown in TABLES 1 to 14, the same error detecting capacity to the 10B code as the above-mentioned array is obtained.

TABLE 1

LIST (1) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| A | B | C | D | E | G | H | F | A | C | F | H | D | G | E | B | A | E | C | F | G | B | D | H |
| A | B | C | E | D | H | G | F | A | C | G | B | H | E | F | D | A | E | C | G | F | D | B | H |
| A | B | C | G | H | D | E | F | A | C | G | E | F | B | H | D | A | E | D | B | C | H | G | F |
| A | B | C | H | G | E | D | F | A | C | G | F | E | H | B | D | A | E | D | C | B | G | H | F |
| A | B | D | C | E | G | F | H | A | C | G | H | B | F | E | D | A | E | D | G | H | C | B | F |
| A | B | D | E | C | F | G | H | A | C | H | B | G | D | F | E | A | E | D | H | G | B | C | F |
| A | B | D | F | G | E | C | H | A | C | H | D | F | B | G | E | A | E | F | B | H | C | G | D |
| A | B | D | G | F | C | E | H | A | C | H | F | D | G | B | E | A | E | F | C | G | B | H | D |
| A | B | E | C | D | H | F | G | A | C | H | G | B | F | D | E | A | E | F | G | C | H | B | D |
| A | B | E | D | C | F | H | G | A | D | B | C | E | F | G | H | A | E | F | H | B | G | C | D |
| A | B | E | F | H | D | C | G | A | D | B | E | C | G | F | H | A | E | G | C | F | D | H | B |
| A | B | E | H | F | C | D | G | A | D | B | F | G | C | E | H | A | E | G | D | H | C | F | B |
| A | B | F | D | G | E | H | C | A | D | B | G | F | E | C | H | A | E | G | F | C | H | D | B |
| A | B | F | E | H | D | G | C | A | D | C | B | E | F | H | G | A | E | G | H | D | F | C | B |
| A | B | F | G | D | H | E | C | A | D | C | E | B | H | F | G | A | E | H | B | F | D | G | C |
| A | B | F | H | E | G | D | C | A | D | C | F | H | B | E | G | A | E | H | D | G | B | F | C |
| A | B | G | C | H | D | F | E | A | D | C | H | F | E | B | G | A | E | H | F | B | G | D | C |
| A | B | G | D | F | C | H | E | A | D | E | B | C | G | H | F | A | E | H | G | D | F | B | C |

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| A | F | H | C | D | E | B | G | A | H | E | B | F | G | D | C |
| A | F | H | D | C | B | E | G | A | H | E | D | G | F | B | C |
| A | F | H | E | B | C | D | G | A | H | E | F | B | D | G | C |
| A | G | B | C | H | F | D | E | A | H | E | G | D | B | F | C |
| A | G | B | D | F | H | C | E | A | H | F | B | E | C | D | G |
| A | G | B | F | D | C | H | E | A | H | F | C | D | B | E | G |
| A | G | B | H | C | D | F | E | A | H | F | D | C | E | B | G |
| A | G | C | B | H | F | E | D | A | H | F | E | B | D | C | G |
| A | G | C | E | F | H | B | D | A | H | G | B | C | E | D | F |
| A | G | C | F | E | B | H | D | A | H | G | C | B | D | E | F |
| A | G | C | H | B | E | F | D | A | H | G | D | E | C | B | F |
| A | G | D | B | F | H | E | C | A | H | G | E | D | B | C | F |
| A | G | D | E | H | F | B | C | B | A | C | D | G | E | H | F |
| A | G | D | F | B | E | H | C | B | A | C | E | H | D | G | F |
| A | G | D | H | E | B | F | C | B | A | C | G | D | H | E | F |
| A | G | E | C | F | H | D | B | B | A | C | H | E | G | D | F |
| A | G | E | D | H | F | C | B | B | A | D | C | G | E | F | H |
| A | G | E | F | C | D | H | B | B | A | D | E | F | C | G | H |

BIT LOCATION A TO H INDICATES LOCATIONS OF OCTET BIT IN 8B/10B CODE.

TABLE 2

LIST (2) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| A | B | G | F | D | H | C | E | A | D | E | C | B | H | G | F | A | F | B | D | G | H | E | C |
| A | B | G | H | C | F | D | E | A | D | E | G | H | B | C | F | A | F | B | E | H | G | D | C |
| A | B | H | C | G | E | F | D | A | D | E | H | G | C | B | F | A | F | B | G | D | E | H | C |
| A | B | H | E | F | C | G | D | A | D | F | B | G | C | H | E | A | F | B | H | E | D | G | C |
| A | B | H | F | E | G | C | D | A | D | F | C | H | B | G | E | A | F | C | D | H | G | E | B |
| A | B | H | G | C | F | E | D | A | D | F | G | B | H | C | E | A | F | C | E | G | H | D | B |
| A | C | B | D | E | H | G | F | A | D | F | H | C | G | B | E | A | F | C | G | E | D | H | B |
| A | C | B | E | D | G | H | F | A | D | G | B | F | E | H | C | A | F | C | H | D | E | G | B |
| A | C | B | G | H | E | D | F | A | D | G | E | H | B | F | C | A | F | D | B | G | H | C | E |
| A | C | B | H | G | D | E | F | A | D | G | F | B | H | E | C | A | F | D | C | H | G | B | E |
| A | C | D | B | E | H | F | G | A | D | G | H | E | F | B | C | A | F | D | G | B | C | H | E |
| A | C | D | E | B | F | H | G | A | D | H | C | F | E | G | B | A | F | D | H | C | B | G | E |
| A | C | D | F | H | E | B | G | A | D | H | E | G | C | F | B | A | F | E | B | H | G | C | D |
| A | C | D | H | F | B | E | G | A | D | H | F | C | E | G | B | A | F | E | C | G | H | B | D |
| A | C | E | B | D | G | F | H | A | D | H | G | E | F | C | B | A | F | E | G | C | B | H | D |
| A | C | E | D | B | F | G | H | A | E | B | C | D | F | H | G | A | F | E | H | B | C | G | D |
| A | C | E | F | G | D | B | H | A | E | B | D | C | H | F | G | A | F | G | B | E | D | C | H |
| A | C | E | G | F | B | D | H | A | E | B | F | H | C | D | G | A | F | G | C | E | B | D | H |
| A | C | F | D | H | E | G | B | A | E | B | H | F | D | C | G | A | F | G | D | B | C | E | H |
| A | C | F | G | E | H | D | B | A | E | C | D | B | G | F | H | A | F | H | B | E | D | C | G |

TABLE 2-continued

LIST (2) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 |
|----|----|----|----|----|----|----|----|----|----|----|----|----|----|----|----|
| A | G | E | H | D | C | F | B | B | A | D | F | E | G | C | H |
| A | G | F | B | D | C | E | H | B | A | D | G | C | F | E | H |
| A | G | F | C | E | B | D | H | B | A | E | C | H | D | F | G |
| A | G | F | D | B | E | C | H | B | A | E | D | F | C | H | G |
| A | G | F | E | C | D | B | H | B | A | E | F | D | H | C | G |
| A | G | H | B | C | D | E | F | B | A | E | H | C | F | D | G |
| A | G | H | C | B | E | D | F | B | A | F | D | E | G | H | C |
| A | G | H | D | E | B | C | F | B | A | F | E | D | H | G | C |
| A | G | H | E | D | C | B | F | B | A | F | G | H | D | E | C |
| A | H | B | C | G | F | E | D | B | A | F | H | G | E | D | C |
| A | H | B | E | F | G | C | D | B | A | G | C | D | H | F | E |
| A | H | B | F | E | C | G | D | B | A | G | D | C | F | H | E |
| A | H | B | G | C | E | F | D | B | A | G | F | H | D | C | E |
| A | H | C | B | G | F | D | E | B | A | G | H | F | C | D | E |
| A | H | C | D | F | G | B | E | B | A | H | C | E | G | F | D |
| A | H | C | F | D | B | G | E | B | A | H | E | C | F | G | D |
| A | H | C | G | B | D | F | E | B | A | H | F | G | E | C | D |
| A | H | D | C | F | G | E | B | B | A | H | G | F | C | E | D |
| A | H | D | E | G | F | C | B | B | C | A | D | G | H | E | F |
| A | H | D | F | C | E | G | B | B | C | A | E | H | G | D | F |
| A | H | D | G | E | C | F | B | B | C | A | G | D | E | H | F |

BIT LOCATION A TO H INDICATES LOCATIONS OF OCTET BIT IN 8B/10B CODE.

TABLE 3

LIST (3) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|----|----|----|----|----|----|----|----|----|----|----|----|----|----|----|----|----|----|----|----|----|----|----|----|
| B | C | A | H | E | D | G | F | B | D | G | E | H | A | C | F | B | F | D | C | H | E | A | G |
| B | C | D | A | G | H | F | E | B | D | G | H | E | C | A | F | B | F | D | E | A | C | H | G |
| B | C | D | F | H | G | A | E | B | D | H | C | F | G | E | A | B | F | D | H | C | A | E | G |
| B | C | D | G | A | F | H | E | B | D | H | E | G | F | C | A | B | F | E | A | D | G | C | H |
| B | C | D | H | F | A | G | E | B | D | H | F | C | E | G | A | B | F | E | C | G | D | A | H |
| B | C | E | A | H | G | F | D | B | D | H | G | E | C | F | A | B | F | E | D | A | C | G | H |
| B | C | E | F | G | H | A | D | B | E | A | C | H | F | D | G | B | F | E | G | C | A | D | H |
| B | C | E | G | F | A | H | D | B | E | A | D | F | H | C | G | B | F | G | A | H | E | C | D |
| B | C | E | H | A | F | G | D | B | E | A | F | D | C | H | G | B | F | G | C | E | H | A | D |
| B | C | F | D | H | G | E | A | B | E | A | H | C | D | F | G | B | F | G | E | C | A | H | D |
| B | C | F | E | G | H | D | A | B | E | C | A | H | F | G | D | B | F | H | A | G | D | C | E |
| B | C | F | G | E | D | H | A | B | E | C | F | G | A | H | D | B | F | H | C | D | G | A | E |
| B | C | F | H | D | E | G | A | B | E | C | G | F | H | A | D | B | F | H | D | C | A | G | E |
| B | C | G | A | D | E | F | H | B | E | C | H | A | G | F | D | B | F | H | G | A | C | D | E |
| B | C | G | D | A | F | E | H | B | E | D | A | F | H | G | C | B | G | A | C | D | F | H | E |
| B | C | G | E | F | A | D | H | B | E | D | F | A | G | H | C | B | G | A | D | C | H | F | E |
| B | C | G | F | E | D | A | H | B | E | D | G | H | F | A | C | B | G | A | F | H | C | D | E |
| B | C | H | A | E | D | F | G | B | E | D | H | G | A | F | C | B | G | A | F | H | C | D | E |

| d1 | d2 | d3 | d4 | p1 | p2 | p3 | p4 | d1 | d2 | d3 | d4 | p1 | p2 | p3 | p4 |
|----|----|----|----|----|----|----|----|----|----|----|----|----|----|----|----|
| B | H | A | C | E | F | G | D | C | A | F | H | G | D | E | B |
| B | H | A | E | C | G | F | D | C | A | G | B | E | H | F | D |
| B | H | A | F | G | C | E | D | C | A | G | E | B | F | H | D |
| B | H | A | G | F | E | C | D | C | A | G | F | H | E | B | D |
| B | H | C | A | E | F | D | G | C | A | G | H | F | B | E | D |
| B | H | C | D | F | E | A | G | C | A | H | B | D | G | F | E |
| B | H | C | E | A | D | F | G | C | A | H | D | B | F | G | E |
| B | H | C | F | D | A | E | G | C | A | H | F | G | D | B | E |
| B | H | D | C | F | E | G | A | C | A | H | G | F | B | D | E |
| B | H | D | E | G | C | F | A | C | B | A | D | H | G | E | F |
| B | H | D | F | C | G | E | A | C | B | A | E | G | H | D | F |
| B | H | D | G | E | F | C | A | C | B | A | G | E | D | H | F |
| B | H | E | A | C | G | D | F | C | B | A | H | D | E | G | F |
| B | H | E | C | A | D | G | F | C | B | D | A | H | G | F | E |
| B | H | E | D | G | C | A | F | C | B | D | F | G | H | A | E |
| B | H | E | G | D | A | C | F | C | B | D | G | F | A | H | E |
| B | H | F | A | G | C | D | E | C | B | D | H | A | F | G | E |
| B | H | F | C | D | A | G | E | C | B | E | A | G | H | F | D |

BIT LOCATION A TO H INDICATES LOCATIONS OF OCTET BIT IN 8B/10B CODE.

TABLE 4

LIST (4) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| B | C | H | D | F | A | E | G | B | E | F | A | D | C | G | H | B | G | A | H | F | D | C | E |
| B | C | H | E | A | F | D | G | B | E | F | C | G | A | D | H | B | G | C | A | D | F | E | H |
| B | C | H | F | D | E | A | G | B | E | F | D | A | G | C | H | B | G | C | D | A | E | F | H |
| B | D | A | C | G | F | E | H | B | E | F | G | C | D | A | H | B | G | C | E | F | D | A | H |
| B | D | A | E | F | G | C | H | B | E | G | C | F | H | D | A | B | G | C | F | E | A | D | H |
| B | D | A | F | E | C | G | H | B | E | G | D | H | F | C | A | B | G | D | A | C | H | E | F |
| B | D | A | G | C | E | F | H | B | E | G | F | C | D | H | A | B | G | D | C | A | E | H | F |
| B | D | C | A | G | F | H | E | B | E | G | H | D | C | F | A | B | G | D | E | H | C | A | F |
| B | D | C | F | H | A | G | E | B | E | H | A | C | D | G | F | B | G | D | H | E | A | C | F |
| B | D | C | G | A | H | F | E | B | E | H | C | A | G | D | F | B | G | E | C | F | D | H | A |
| B | D | C | H | F | G | A | E | B | E | H | D | G | A | C | F | B | G | E | D | H | C | F | A |
| B | D | E | A | F | G | H | C | B | E | H | G | D | C | A | F | B | G | E | F | C | H | D | A |
| B | D | E | F | A | H | G | C | B | F | A | D | E | H | G | C | B | G | E | H | D | F | C | A |
| B | D | E | G | H | A | F | C | B | F | A | E | D | G | H | C | B | G | F | A | H | C | E | D |
| B | D | E | H | G | F | A | C | B | F | A | G | H | E | D | C | B | G | F | C | E | A | H | D |
| B | D | F | A | E | C | H | G | B | F | A | H | G | D | E | C | B | G | F | E | C | H | A | D |
| B | D | F | C | H | A | E | G | B | F | C | D | H | E | G | A | B | G | F | H | A | E | C | D |
| B | D | F | E | A | H | C | G | B | F | C | E | G | D | H | A | B | G | H | A | F | D | E | C |
| B | D | F | H | C | E | A | G | B | F | C | G | E | H | D | A | B | G | H | D | E | A | F | C |
| B | D | G | A | C | E | H | F | B | F | C | H | D | G | E | A | B | G | H | E | D | F | A | C |
| B | D | G | C | A | H | E | F | B | F | D | A | E | H | C | G | B | G | H | F | A | E | D | C |

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| B | H | F | D | C | G | A | E | C | B | E | F | H | G | A | D |
| B | H | F | G | A | D | C | E | C | B | E | G | A | F | H | D |
| B | H | G | A | F | E | D | C | C | B | E | H | F | A | G | D |
| B | H | G | D | E | F | A | C | C | B | F | D | G | H | E | A |
| B | H | G | E | D | A | F | C | C | B | F | E | H | G | D | A |
| B | H | G | F | A | D | E | C | C | B | F | G | D | E | H | A |
| C | A | B | D | H | E | G | F | C | B | F | H | E | D | G | A |
| C | A | B | E | G | D | H | F | C | B | G | A | E | D | F | H |
| C | A | B | G | E | H | D | F | C | B | G | D | F | A | E | H |
| C | A | B | H | D | G | E | F | C | B | G | E | A | F | D | H |
| C | A | D | B | H | E | F | G | C | B | G | F | D | E | A | H |
| C | A | D | E | F | B | H | G | C | B | H | A | D | E | F | G |
| C | A | D | F | E | H | B | G | C | B | H | D | A | F | E | G |
| C | A | D | H | B | F | E | G | C | B | H | E | F | A | D | G |
| C | A | E | B | G | D | F | H | C | B | H | F | E | D | A | G |
| C | A | E | D | F | B | G | H | C | D | A | B | H | F | E | G |
| C | A | E | F | D | G | B | H | C | D | A | E | F | H | B | G |
| C | A | E | G | B | F | D | H | C | D | A | F | E | B | H | G |
| C | A | F | D | E | H | G | B | C | D | A | H | B | E | F | G |
| C | A | F | E | D | G | H | B | C | D | B | A | H | F | G | E |
| C | A | F | G | H | E | D | B | C | D | B | F | G | A | H | E |

BIT LOCATION A TO H INDICATES LOCATIONS OF OCTET BIT IN 8B/10B CODE.

TABLE 5

LIST (5) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| C | D | B | G | F | H | A | E | C | E | H | D | G | F | B | A | C | G | E | A | B | H | D | F |
| C | D | B | H | A | G | F | E | C | E | H | F | B | D | G | A | C | G | E | B | A | D | H | F |
| C | D | E | A | F | H | G | B | C | E | H | G | D | B | F | A | C | G | E | D | H | B | A | F |
| C | D | E | F | A | G | H | B | C | F | A | D | E | G | H | B | C | G | E | H | D | A | B | F |
| C | D | E | G | H | F | A | B | C | F | A | E | D | H | G | B | C | G | F | A | H | B | D | E |
| C | D | E | H | G | A | F | B | C | F | A | G | H | D | E | B | C | G | F | B | D | A | H | E |
| C | D | F | A | E | B | G | H | C | F | A | H | G | E | D | B | C | G | F | D | B | H | A | E |
| C | D | F | B | G | A | E | H | C | F | B | D | G | E | H | A | C | G | F | H | A | D | B | E |
| C | D | F | E | A | G | B | H | C | F | B | E | H | D | G | A | C | G | H | A | F | E | D | B |
| C | D | F | G | B | E | A | H | C | F | B | G | D | H | E | A | C | G | H | D | E | F | A | B |
| C | D | G | B | F | H | E | A | C | F | B | H | E | G | D | A | C | G | H | E | D | A | F | B |
| C | D | G | E | H | F | B | A | C | F | D | A | E | G | B | H | C | G | H | F | A | D | E | B |
| C | D | G | F | B | E | H | A | C | F | D | B | G | E | A | H | C | H | A | B | D | F | G | E |
| C | D | G | H | E | B | F | A | C | F | D | E | A | B | G | H | C | H | A | D | B | G | F | E |
| C | D | H | A | B | E | G | F | C | F | D | G | B | A | E | H | C | H | A | F | G | B | D | E |
| C | D | H | B | A | G | E | F | C | F | E | A | D | H | B | G | C | H | A | D | F | D | B | E |
| C | D | H | E | G | A | B | F | C | F | E | B | H | D | A | G | C | H | B | A | D | E | F | G |
| C | D | H | G | E | B | A | F | C | F | E | D | A | B | H | G | C | H | B | D | A | E | F | G |

TABLE 5-continued

LIST (5) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| D | A | B | G | E | F | C | H | D | B | G | E | A | H | C | F |
| D | A | C | B | F | E | H | G | D | B | G | H | C | E | A | F |
| D | A | C | E | H | B | F | G | D | B | H | C | G | F | E | A |
| D | A | C | F | B | H | E | G | D | B | H | E | F | G | C | A |
| D | A | C | H | E | F | B | G | D | B | H | F | E | C | G | A |
| D | A | E | B | G | C | H | F | D | B | H | G | C | E | F | A |
| D | A | E | C | H | B | G | F | D | C | A | B | F | H | E | G |
| D | A | E | G | B | H | C | F | D | C | A | E | H | F | B | G |
| D | A | E | H | C | G | B | F | D | C | A | F | B | E | H | G |
| D | A | F | B | C | G | H | E | D | C | A | H | E | B | F | G |
| D | A | F | C | B | H | G | E | D | C | B | A | F | H | G | E |
| D | A | F | G | H | B | C | E | D | C | B | F | A | G | H | E |
| D | A | F | H | G | C | B | E | D | C | B | G | H | F | A | E |
| D | A | G | B | E | F | H | C | D | C | B | H | G | A | F | E |
| D | A | G | E | B | H | F | C | D | C | E | A | H | F | G | B |
| D | A | G | F | H | B | E | C | D | C | E | F | G | A | H | B |
| D | A | G | H | F | E | B | C | D | C | E | G | F | H | A | B |
| D | A | H | C | E | F | G | B | D | C | E | H | A | G | F | B |

BIT LOCATION A TO H INDICATES LOCATIONS OF OCTET BIT IN 8B/10B CODE.

TABLE 6

LIST (6) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| C | E | A | B | G | F | D | H | C | F | E | H | B | A | D | G | C | H | B | E | F | D | A | G |
| C | E | A | D | F | G | B | H | C | F | G | A | H | D | B | E | C | H | B | F | E | A | D | G |
| C | E | A | F | D | B | G | H | C | F | G | B | D | H | A | E | C | H | D | A | B | G | E | F |
| C | E | A | G | B | D | F | H | C | F | G | D | B | A | H | E | C | H | D | B | A | E | G | F |
| C | E | B | A | G | F | H | D | C | F | G | H | A | B | D | E | C | H | D | E | G | B | A | F |
| C | E | B | F | H | A | G | D | C | F | H | A | G | E | B | D | C | H | D | G | E | A | B | F |
| C | E | B | G | A | H | F | D | C | F | H | B | E | G | A | D | C | H | E | B | F | D | G | A |
| C | E | B | H | F | G | A | D | C | F | H | E | B | A | G | D | C | H | E | D | G | B | F | A |
| C | E | D | A | F | G | H | B | C | F | H | G | A | B | E | D | C | H | E | F | B | G | D | A |
| C | E | D | F | A | H | G | B | C | G | A | B | E | F | H | D | C | H | E | G | D | F | B | A |
| C | E | D | G | H | A | F | B | C | G | A | E | B | H | F | D | C | H | F | A | G | B | E | D |
| C | E | D | H | G | F | A | B | C | G | A | F | H | B | E | D | C | H | F | B | E | A | G | D |
| C | E | F | A | D | B | H | G | C | G | A | H | F | E | B | D | C | H | F | E | B | G | A | D |
| C | E | F | B | H | A | D | G | C | G | B | A | E | F | D | H | C | H | F | G | A | E | B | D |
| C | E | F | D | A | H | B | G | C | G | B | D | F | E | A | H | C | H | G | A | F | D | E | B |
| C | E | F | H | B | D | A | G | C | G | B | E | A | D | F | H | C | H | G | D | E | A | F | B |
| C | E | G | A | B | D | H | F | C | G | B | F | D | A | E | H | C | H | G | E | D | F | A | B |
| C | E | G | B | A | H | D | F | C | G | D | B | F | E | H | A | C | H | G | F | A | E | D | B |
| C | E | G | D | H | A | B | F | C | G | D | E | H | B | F | A | D | A | B | C | F | E | G | H |
| C | E | G | H | D | B | A | F | C | G | D | F | B | H | E | A | D | A | B | E | G | C | F | H |
| C | E | H | B | F | G | D | A | C | G | D | H | E | F | B | A | D | A | B | F | C | G | E | H |

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| D | A | H | E | C | G | F | B | D | C | F | A | B | E | G | H |
| D | A | H | F | G | C | E | B | D | C | F | B | A | G | E | H |
| D | A | H | G | F | E | C | B | D | C | F | E | G | A | B | H |
| D | B | A | C | F | G | E | H | D | C | F | G | E | B | A | H |
| D | B | A | E | G | F | C | H | D | C | G | B | H | F | E | A |
| D | B | A | F | C | E | G | H | D | C | G | E | F | H | B | A |
| D | B | A | G | E | C | F | H | D | C | G | F | E | B | H | A |
| D | B | C | A | F | G | H | E | D | C | G | H | B | E | F | A |
| D | B | C | F | A | H | G | E | D | C | H | A | E | B | G | F |
| D | B | C | G | H | A | F | E | D | C | H | B | G | A | E | F |
| D | B | C | H | G | F | A | E | D | C | H | E | A | G | B | F |
| D | B | E | A | G | F | H | C | D | C | H | G | B | E | A | F |
| D | B | E | F | H | A | G | C | D | E | A | B | G | H | C | F |
| D | B | E | G | A | H | F | C | D | E | A | C | H | G | B | F |
| D | B | E | H | F | G | A | C | D | E | A | G | B | C | H | F |
| D | B | F | A | C | E | H | G | D | E | A | H | C | B | G | F |
| D | B | F | C | A | H | E | G | D | E | B | A | G | H | F | C |

TABLE 6-continued

LIST (6) OF CONTROL INFORMATION IDENTIFICATION BIT ARRAY

| | | | | | | | | | | | | | | |
|---|---|---|---|---|---|---|---|---|---|---|---|---|---|---|
| D | B | F | E | H | A | C | G | D | E | B | F | H | G | A | C |
| D | B | F | H | E | C | A | G | D | E | B | G | A | F | H | C |
| D | B | G | A | E | C | H | F | D | E | B | H | F | A | G | C |
| D | B | G | C | H | A | E | F | D | E | C | A | H | G | F | B |

BIT LOCATION A TO H INDICATES LOCATIONS OF OCTET BIT IN 8B/10B CODE.

TABLE 7

LIST (7) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| D | E | C | F | G | H | A | B | D | G | A | B | E | H | F | C | D | H | F | F | B | A | C | G |
| D | E | C | G | F | A | H | B | D | G | A | E | B | F | H | C | D | H | F | A | G | E | B | C |
| D | E | C | H | A | F | G | B | D | G | A | F | H | E | B | C | D | H | F | B | E | G | A | C |
| D | E | F | B | H | G | C | A | D | G | A | H | F | B | E | C | D | H | F | E | B | A | G | C |
| D | E | F | C | G | H | B | A | D | G | B | A | E | H | C | F | D | H | F | G | A | B | E | C |
| D | E | F | G | C | B | H | A | D | G | B | C | H | E | A | F | D | H | G | A | F | C | B | E |
| D | E | F | H | B | C | G | A | D | G | B | E | A | C | H | F | D | H | G | B | C | F | A | E |
| D | E | G | A | B | C | F | H | D | G | B | H | C | A | E | F | D | H | G | C | B | A | F | E |
| D | E | G | B | A | F | C | H | D | G | C | B | H | E | F | A | D | H | G | F | A | B | C | E |
| D | E | G | C | F | A | B | H | D | G | C | E | F | B | H | A | E | A | B | C | F | D | H | G |
| D | E | G | F | C | B | A | H | D | G | C | F | E | H | B | A | E | A | B | D | H | C | F | G |
| D | E | H | A | C | B | F | G | D | G | C | H | B | F | E | A | E | A | B | F | C | H | D | G |
| D | E | H | B | F | A | C | G | D | G | E | A | B | F | C | H | E | A | B | H | D | F | C | G |
| D | E | H | C | A | F | B | G | D | G | E | B | A | C | F | H | E | A | C | B | F | D | G | H |
| D | E | H | F | B | C | A | G | D | G | E | C | F | B | A | H | E | A | C | D | G | B | F | H |
| D | F | A | B | C | H | G | E | D | G | E | F | C | A | B | H | E | A | C | F | B | G | D | H |
| D | F | A | C | B | G | H | E | D | G | F | A | H | E | C | B | E | A | C | G | D | F | B | H |
| D | F | A | G | H | C | B | E | D | G | F | C | E | H | A | B | E | A | D | B | H | C | G | F |

| | | | | | | | | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| | | | | | | | | E | B | C | G | H | F | A | D | E | C | H | D | F | G | B | A |
| | | | | | | | | E | B | C | H | G | A | F | D | E | C | H | F | D | B | G | A |
| | | | | | | | | E | B | D | A | H | F | G | C | E | C | H | G | B | D | F | A |
| | | | | | | | | E | B | D | F | G | A | H | C | E | D | A | B | H | G | C | F |
| | | | | | | | | E | B | D | G | F | H | A | C | E | D | A | C | G | H | B | F |
| | | | | | | | | E | B | D | H | A | G | F | C | E | D | A | G | C | B | H | F |
| | | | | | | | | E | B | F | A | C | D | G | H | E | D | A | H | B | C | G | F |
| | | | | | | | | E | B | F | C | A | G | D | H | E | D | B | A | H | G | F | C |
| | | | | | | | | E | B | F | D | G | A | C | H | E | D | B | F | G | H | A | C |
| | | | | | | | | E | B | F | G | D | C | A | H | E | D | B | G | F | A | H | C |
| | | | | | | | | E | B | G | C | H | F | D | A | E | D | B | H | A | F | G | C |
| | | | | | | | | E | B | G | D | F | H | C | A | E | D | C | A | G | H | F | B |
| | | | | | | | | F | B | G | F | D | C | H | A | E | D | C | F | H | G | A | B |
| | | | | | | | | E | B | G | H | C | D | F | A | E | D | C | G | A | F | H | B |
| | | | | | | | | E | B | H | A | D | C | G | F | E | D | C | H | F | A | G | B |
| | | | | | | | | E | B | H | C | G | A | D | F | E | D | F | B | G | H | C | A |
| | | | | | | | | E | B | H | D | A | G | C | F | E | D | F | C | H | G | B | A |
| | | | | | | | | E | B | H | G | C | D | A | F | E | D | F | G | B | C | H | A |

BIT LOCATION A TO H INDICATES LOCATIONS OF OCTET BIT IN 8B/10B CODE.

TABLE 8

LIST (8) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| D | F | A | H | G | B | C | E | D | G | F | E | C | A | H | B | E | A | D | C | G | B | H | F |
| D | F | B | A | C | H | E | G | D | G | F | H | A | C | E | B | E | A | D | G | C | H | B | F |
| D | F | B | C | A | E | H | G | D | G | H | A | F | B | C | E | E | A | D | H | B | G | C | F |
| D | F | B | E | H | C | A | G | D | G | H | B | C | A | F | E | E | A | F | B | C | H | G | D |
| D | F | B | H | E | A | C | G | D | G | H | C | B | F | A | E | E | A | F | C | B | G | H | D |
| D | F | C | A | B | G | E | H | D | G | H | F | A | C | B | E | E | A | F | G | H | C | B | D |
| D | F | C | B | A | E | G | H | D | H | A | C | E | G | F | B | E | A | F | H | G | B | C | D |
| D | F | C | E | G | B | A | H | D | H | A | E | C | F | G | B | E | A | G | C | D | F | H | B |
| D | F | C | G | E | A | B | H | D | H | A | F | G | C | E | B | E | A | G | D | C | H | F | B |
| D | F | E | B | H | C | G | A | D | H | A | G | F | C | E | B | E | A | G | F | H | C | D | B |
| D | F | E | C | G | B | H | A | D | H | B | C | G | E | F | A | E | A | G | H | F | D | C | B |
| D | F | E | G | C | H | B | A | D | H | B | E | F | C | G | A | E | A | H | B | D | F | G | C |
| D | F | E | H | B | G | C | A | D | H | B | F | E | G | C | A | E | A | H | D | B | G | F | C |

TABLE 8-continued

LIST (8) OF CONTROL INFORMATION IDENTIFICATION BIT ARRAY

| | | | | | | | | | | | | | | | | | | | | | |
|---|---|---|---|---|---|---|---|---|---|---|---|---|---|---|---|---|---|---|---|---|---|
| D | F | G | A | H | C | E | B | D | H | B | G | C | F | E | A | E | A | H | F | G | B | D | C |
| D | F | G | C | E | A | H | B | D | H | C | A | E | G | B | F | E | A | H | G | F | D | B | C |
| D | F | G | E | C | H | A | B | D | H | C | B | G | E | A | F | E | B | A | C | F | H | D | G |
| D | F | G | H | A | E | C | B | D | H | C | E | A | B | G | F | E | B | A | D | H | F | C | G |
| D | F | H | A | G | B | E | C | D | H | C | G | B | A | E | F | E | B | A | F | C | D | H | G |
| D | F | H | B | E | A | G | C | D | H | E | A | C | F | B | G | E | B | A | H | D | C | F | G |
| D | F | H | E | B | G | A | C | D | H | E | B | F | C | A | G | E | B | C | A | F | H | G | D |
| D | F | H | G | A | E | B | C | D | H | E | C | A | B | F | G | E | B | C | F | A | G | H | D |

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| E | C | A | B | F | G | D | H | E | D | F | H | C | B | G | A |
| E | C | A | D | G | F | B | H | E | D | G | A | C | B | F | H |
| E | C | A | F | B | D | G | H | E | D | G | B | F | A | C | H |
| E | C | A | G | D | B | F | H | E | D | G | C | A | F | B | H |
| E | C | B | A | F | G | H | D | E | D | G | F | B | C | A | H |
| E | C | B | F | A | H | G | D | E | D | H | A | B | C | F | G |
| E | C | B | G | H | A | F | D | E | D | H | B | A | F | C | G |
| E | C | B | H | G | F | A | D | E | D | H | C | F | A | B | G |
| E | C | D | A | G | F | H | B | E | D | H | F | C | B | A | G |
| E | C | D | F | H | A | G | B | E | F | A | B | C | G | H | D |
| E | C | D | G | A | H | F | B | E | F | A | C | B | H | G | D |
| E | C | D | H | F | G | A | B | E | F | A | G | H | B | C | D |
| E | C | F | A | B | D | H | G | E | F | A | H | G | C | B | D |
| E | C | F | B | A | H | D | G | E | F | B | A | C | G | D | H |
| E | C | F | D | H | A | B | G | E | F | B | C | A | D | G | H |
| E | C | F | H | D | B | A | G | E | F | B | D | G | C | A | H |
| E | C | G | A | D | B | H | F | E | F | B | G | D | A | C | H |
| E | C | G | B | H | A | D | F | E | F | C | A | B | H | D | G |
| E | C | G | D | A | H | B | F | E | F | C | B | A | D | H | G |
| E | C | G | H | B | D | A | F | E | F | C | D | H | B | A | G |
| E | C | H | B | G | F | D | A | E | F | C | H | D | A | B | G |

BIT LOCATION A TO H INDICATES LOCATIONS OF OCTET BIT IN 8B/10B CODE.

TABLE 9

LIST (9) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| E | F | D | B | G | C | H | A | E | H | A | G | F | B | D | C | F | A | G | D | C | B | E | H |
| E | F | D | C | H | B | G | A | E | H | B | A | D | G | C | F | F | A | G | E | B | C | D | H |
| E | F | D | G | B | H | C | A | E | H | B | C | G | D | A | F | F | A | H | B | D | E | C | G |
| E | F | D | H | C | G | B | A | E | H | B | D | A | C | G | F | F | A | H | C | E | D | B | G |
| E | F | G | A | H | B | D | C | E | H | B | G | C | A | D | F | F | A | H | D | B | C | E | G |
| E | F | G | B | D | A | H | C | E | H | C | B | G | D | F | A | F | A | H | E | C | B | D | G |
| E | F | G | D | B | H | A | C | E | H | C | D | F | B | G | A | F | B | A | D | H | E | G | C |
| E | F | G | H | A | D | B | C | E | H | C | F | D | G | B | A | F | B | A | E | G | D | H | C |
| E | F | H | A | G | C | D | B | E | H | C | G | B | F | D | A | F | B | A | G | E | H | D | C |
| E | F | H | C | D | A | G | B | E | H | D | A | B | F | C | G | F | B | A | H | D | G | E | C |
| E | F | H | D | C | G | A | B | E | H | D | B | A | C | F | G | F | B | C | D | E | H | G | A |
| E | F | H | G | A | D | C | B | E | H | D | C | F | B | A | G | F | B | C | E | D | G | H | A |
| E | G | A | C | D | H | F | B | E | H | D | F | C | A | B | G | F | B | C | G | H | E | D | A |
| E | G | A | D | C | F | H | B | E | H | F | A | G | D | C | B | F | B | C | H | G | D | E | A |
| E | G | A | F | H | D | C | B | E | H | F | C | D | G | A | B | F | B | D | A | H | E | C | G |
| E | G | A | H | F | C | D | B | E | H | F | D | C | A | G | B | F | B | D | C | E | H | A | G |
| E | G | B | C | H | D | F | A | E | H | F | G | A | C | D | B | F | B | D | E | C | A | H | G |
| E | G | B | D | F | C | H | A | E | H | G | A | F | B | C | D | F | B | D | H | A | C | E | G |

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| F | C | D | B | E | G | H | F | E | A | B | G | C | H | D |  |
| F | C | D | E | B | A | G | H | F | E | A | C | H | B | G | D |
| F | C | D | G | A | B | E | H | F | E | A | G | B | H | C | D |
| F | C | E | A | H | D | B | G | F | E | A | H | C | G | B | D |
| F | C | E | B | D | H | A | G | F | E | B | A | G | C | D | H |
| F | C | E | D | B | A | H | G | F | E | B | C | D | A | G | H |
| F | C | E | H | A | B | D | G | F | E | B | D | C | G | A | H |
| F | C | G | A | D | H | B | E | F | E | B | G | A | D | C | H |
| F | C | G | B | H | D | A | E | F | E | C | A | H | B | D | G |
| F | C | G | D | A | B | H | E | F | E | C | B | D | A | H | G |
| F | C | G | H | B | A | D | E | F | E | C | D | B | H | A | G |
| F | C | H | A | E | G | B | D | F | E | C | H | A | D | B | G |
| F | C | H | B | G | E | A | D | F | E | D | B | C | G | H | A |

TABLE 9-continued

LIST (9) OF CONTROL INFORMATION IDENTIFICATION BIT ARRAY

| | | | | | | | | | | | | | | |
|---|---|---|---|---|---|---|---|---|---|---|---|---|---|---|
| F | C | H | E | A | B | G | D | F | E | D | C | B | H | G | A |
| F | C | H | G | B | A | E | D | F | E | D | G | H | B | C | A |
| F | D | A | B | H | C | G | E | F | E | D | H | G | C | B | A |
| F | D | A | C | G | B | H | E | F | E | G | A | B | H | D | C |
| F | D | A | G | C | H | B | E | F | E | G | B | A | D | H | C |

BIT LOCATION A TO H INDICATES LOCATIONS OF OCTET BIT IN 8B/10B CODE.

TABLE 10

LIST (10) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| E | G | B | F | D | H | C | A | E | H | G | B | C | A | F | D | F | B | E | A | G | D | C | H |
| E | G | B | H | C | F | D | A | E | H | G | C | B | F | A | D | F | B | E | C | D | G | A | H |
| E | G | C | A | D | H | B | F | E | H | G | F | A | C | B | D | F | B | E | D | C | A | G | H |
| E | G | C | B | H | D | A | F | F | A | B | D | H | G | E | C | F | B | E | G | A | C | D | H |
| E | G | C | D | A | B | H | F | F | A | B | E | G | H | D | C | F | B | G | A | E | H | C | D |
| E | G | C | H | B | A | D | F | F | A | B | G | E | D | H | C | F | B | G | C | H | E | A | D |
| E | G | D | A | C | F | B | H | F | A | B | H | D | E | G | C | F | B | G | E | A | C | H | D |
| E | G | D | B | F | C | A | H | F | A | C | D | G | H | E | B | F | B | G | H | C | A | E | D |
| E | G | D | C | A | B | F | H | F | A | C | E | H | G | D | B | F | B | H | A | D | G | C | E |
| E | G | D | F | B | A | C | H | F | A | C | G | D | E | H | B | F | B | H | C | G | D | A | E |
| E | G | F | A | H | D | B | C | F | A | C | H | E | D | G | B | F | B | H | D | A | C | G | E |
| E | G | F | B | D | H | A | C | F | A | D | B | H | G | C | E | F | B | H | G | C | A | D | E |
| E | G | F | D | B | A | H | C | F | A | D | C | G | H | B | E | F | C | A | D | G | E | H | B |
| E | G | F | H | A | B | D | C | F | A | D | G | C | B | H | E | F | C | A | E | H | D | G | B |
| E | G | H | A | F | C | B | D | F | A | D | H | B | C | G | E | F | C | A | G | D | H | E | B |
| E | G | H | B | C | F | A | D | F | A | E | B | G | H | C | D | F | C | A | H | E | G | D | B |
| E | G | H | C | B | A | F | D | F | A | E | C | H | G | B | D | F | C | B | D | E | G | H | A |
| E | G | H | F | A | B | C | D | F | A | E | G | B | C | H | D | F | C | B | E | D | H | G | A |
| E | H | A | B | D | G | F | C | F | A | E | H | C | B | G | D | F | C | B | G | H | D | E | A |
| E | H | A | D | B | F | G | C | F | A | G | B | E | D | C | H | F | C | B | H | G | E | D | A |
| E | H | A | F | G | D | B | C | F | A | G | C | D | E | B | H | F | C | D | A | G | E | B | H |

| | | | | | | | | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| | | | | | | | | F | D | A | H | B | G | C | E | F | E | G | D | H | B | A | C |
| | | | | | | | | F | D | B | A | H | C | E | G | F | E | G | H | D | A | B | C |
| | | | | | | | | F | D | B | C | E | A | H | G | F | E | H | A | C | G | D | B |
| | | | | | | | | F | D | B | E | C | H | A | G | F | E | H | C | A | D | G | B |
| | | | | | | | | F | D | B | H | A | E | C | G | F | E | H | D | G | C | A | B |
| | | | | | | | | F | D | C | A | G | B | E | H | F | E | H | G | D | A | C | B |
| | | | | | | | | F | D | C | B | E | A | G | H | F | G | A | B | E | C | D | H |
| | | | | | | | | F | D | C | E | B | G | A | H | F | G | A | C | D | B | E | H |
| | | | | | | | | F | D | C | G | A | E | B | H | F | G | A | D | C | E | B | H |
| | | | | | | | | F | D | E | B | C | H | G | A | F | G | A | E | B | D | C | H |
| | | | | | | | | F | D | E | C | B | G | H | A | F | G | B | A | E | C | H | D |
| | | | | | | | | F | D | E | G | H | C | B | A | F | G | B | C | H | A | E | D |
| | | | | | | | | F | D | E | H | G | B | C | A | F | G | B | E | A | H | C | D |
| | | | | | | | | F | D | G | A | C | H | E | B | F | G | B | H | C | E | A | D |
| | | | | | | | | F | D | G | C | A | E | H | B | F | G | C | A | D | B | H | E |
| | | | | | | | | F | D | G | E | H | C | A | B | F | G | C | B | H | A | D | E |
| | | | | | | | | F | D | G | H | E | A | C | B | F | G | C | D | A | H | B | E |
| | | | | | | | | F | D | H | A | B | G | E | C | F | G | C | H | B | D | A | E |
| | | | | | | | | F | D | H | B | A | E | G | C | F | G | D | A | C | E | H | B |
| | | | | | | | | F | D | H | E | G | B | A | C | F | G | D | C | A | H | E | B |
| | | | | | | | | F | D | H | G | E | A | B | C | F | G | D | E | H | A | C | B |

BIT LOCATION A TO H INDICATES LOCATIONS OF OCTET BIT IN 8B/10B CODE.

TABLE 11

LIST (11) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| F | G | D | H | E | C | A | B | G | A | C | F | B | E | H | D | G | B | H | D | A | E | F | C |
| F | G | E | A | B | D | H | C | G | A | C | H | E | B | F | D | G | B | H | E | F | D | A | C |
| F | G | E | B | A | H | D | C | G | A | D | B | H | F | E | C | G | B | H | F | E | A | D | C |
| F | G | E | D | H | A | B | C | G | A | D | E | F | H | B | C | G | C | A | B | F | E | H | D |
| F | G | E | H | D | B | A | C | G | A | D | F | E | B | H | C | G | C | A | E | H | B | F | D |
| F | G | H | B | C | E | D | A | G | A | D | H | B | E | F | C | G | C | A | F | B | H | E | D |

TABLE 11-continued

LIST (11) OF CONTROL INFORMATION IDENTIFICATION BIT ARRAY

| | | | | | | | | | | | | | | | | | | | | |
|---|---|---|---|---|---|---|---|---|---|---|---|---|---|---|---|---|---|---|---|---|
| F | G | H | C | B | D | E | A | G | A | E | C | H | F | D | B | G | C | A | H | E | F | B | D |
| F | G | H | D | E | C | B | A | G | A | E | D | F | H | C | B | G | C | B | A | F | E | D | H |
| F | G | H | E | D | B | C | A | G | A | E | F | D | C | H | B | G | C | B | D | E | F | A | H |
| F | H | A | B | D | C | E | G | G | A | E | H | C | D | F | B | G | C | B | E | D | A | F | H |
| F | H | A | C | E | B | D | G | G | A | F | B | C | D | E | H | G | C | B | F | A | D | E | H |
| F | H | A | D | B | E | C | G | G | A | F | C | B | E | D | H | G | C | D | B | E | F | H | A |
| F | H | A | E | C | D | B | G | G | A | F | D | E | B | C | H | G | C | D | E | B | H | F | A |
| F | H | B | A | D | C | G | E | G | A | F | E | D | C | B | H | G | C | D | F | H | B | E | A |
| F | H | B | C | G | A | D | E | G | A | H | B | D | C | E | F | G | C | D | H | F | E | B | A |
| F | H | B | D | A | G | C | E | G | A | H | C | E | B | D | F | G | C | E | A | H | B | D | F |
| F | H | B | G | C | D | A | E | G | A | H | D | B | E | C | F | G | C | E | B | D | A | H | F |
| F | H | C | A | E | B | G | D | G | A | H | E | C | D | B | F | G | C | E | D | B | H | A | F |

| | | | | | | | | | | | | | | | | | | | | |
|---|---|---|---|---|---|---|---|---|---|---|---|---|---|---|---|---|---|---|---|---|
| | | | | | | | | d1 | d2 | d3 | d4 | p1 | p2 | p3 | p4 | d1 | d2 | d3 | d4 | p1 | p2 | p3 | p4 |
| | | | | | | | | G | D | E | A | F | B | C | H | G | F | A | E | D | B | C | H |
| | | | | | | | | G | D | E | B | C | A | F | H | G | F | B | A | C | E | H | D |
| | | | | | | | | G | D | E | C | B | F | A | H | G | F | B | C | A | H | E | D |
| | | | | | | | | G | D | E | F | A | C | B | H | G | F | B | E | H | A | C | D |
| | | | | | | | | G | D | F | A | E | H | C | B | G | F | B | H | E | C | A | D |
| | | | | | | | | G | D | F | C | H | E | A | B | G | F | C | A | B | D | H | E |
| | | | | | | | | G | D | F | E | A | C | H | B | G | F | C | B | A | H | D | E |
| | | | | | | | | G | D | F | H | C | A | E | B | G | F | C | D | H | A | B | E |
| | | | | | | | | G | D | H | A | B | F | C | E | G | F | C | H | D | B | A | E |
| | | | | | | | | G | D | H | B | A | C | F | E | G | F | D | A | E | C | H | B |
| | | | | | | | | G | D | H | C | F | B | A | E | G | F | D | C | H | A | E | B |
| | | | | | | | | G | D | H | F | C | A | B | E | G | F | D | E | A | H | C | B |
| | | | | | | | | G | E | A | C | H | D | F | B | G | F | D | H | C | E | A | B |
| | | | | | | | | G | E | A | D | F | C | H | B | G | F | E | A | D | B | H | C |
| | | | | | | | | G | E | A | F | D | H | C | B | G | F | E | B | H | A | D | C |
| | | | | | | | | G | E | A | H | C | F | D | B | G | F | E | D | A | H | B | C |
| | | | | | | | | G | E | B | C | D | H | F | A | G | F | E | H | B | D | A | C |
| | | | | | | | | G | E | B | D | C | F | H | A | G | F | H | B | E | C | D | A |

BIT LOCATION A TO H INDICATES LOCATIONS OF OCTET BIT IN 8B/10B CODE.

TABLE 12

LIST (12) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| F | H | C | B | G | A | E | D | G | B | A | C | F | D | H | E | G | C | E | H | A | D | B | F |
| F | H | C | E | A | G | B | D | G | B | A | D | H | C | F | E | G | C | F | A | B | H | D | E |
| F | H | C | G | B | E | A | D | G | B | A | F | C | H | D | E | G | C | F | B | A | D | H | E |
| F | H | D | A | B | E | G | C | G | B | A | H | D | F | C | E | G | C | F | D | H | B | A | E |
| F | H | D | B | A | G | E | C | G | B | C | A | F | D | E | H | G | C | F | H | D | A | B | E |
| F | H | D | E | G | A | B | C | G | B | C | D | E | A | F | H | G | C | H | A | E | F | D | B |
| F | H | D | G | E | B | A | C | G | B | C | E | D | F | A | H | G | C | H | D | F | E | A | B |
| F | H | E | A | C | D | G | B | G | B | C | F | A | E | D | H | G | C | H | E | A | D | F | B |
| F | H | E | C | A | G | D | B | G | B | D | A | H | C | E | F | G | C | H | F | D | A | E | B |
| F | H | E | D | G | A | C | B | G | B | D | C | E | A | H | F | G | D | A | B | H | E | F | C |
| F | H | E | G | D | C | A | B | G | B | D | E | C | H | A | F | G | D | A | E | F | B | H | C |
| F | H | G | B | C | D | E | A | G | B | D | H | A | E | C | F | G | D | A | F | E | H | B | C |
| F | H | G | C | B | E | D | A | G | B | E | C | D | F | H | A | G | D | A | H | B | F | E | C |
| F | H | G | D | E | B | C | A | G | B | E | D | C | H | F | A | G | D | B | A | H | E | C | F |
| F | H | G | E | D | C | B | A | G | B | E | F | H | C | D | A | G | D | B | C | E | H | A | F |
| G | A | B | C | F | H | D | E | G | B | E | H | F | D | C | A | G | D | B | E | C | A | H | F |
| G | A | B | D | H | F | C | E | G | B | F | A | C | H | E | D | G | D | B | H | A | C | E | F |
| G | A | B | F | C | D | H | E | G | B | F | C | A | E | H | D | G | D | C | B | E | H | F | A |
| G | A | B | H | D | C | F | E | G | B | F | E | H | C | A | D | G | D | C | E | B | F | H | A |
| G | A | C | B | F | H | E | D | G | B | F | H | E | A | C | D | G | D | C | F | H | E | B | A |
| G | A | C | E | H | F | B | D | G | B | H | A | D | F | E | C | G | D | C | H | F | B | E | A |

| | | | | | | | | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| | | | | | | | | G | E | B | F | H | D | C | A | G | F | H | C | D | B | E | A |
| | | | | | | | | G | E | B | H | F | C | D | A | G | F | H | D | C | E | B | A |
| | | | | | | | | G | E | C | A | H | D | B | F | G | F | H | E | B | D | C | A |
| | | | | | | | | G | E | C | B | D | H | A | F | G | H | A | B | D | E | C | F |
| | | | | | | | | G | E | C | D | B | A | H | F | G | H | A | C | E | D | B | F |
| | | | | | | | | G | E | C | H | A | B | D | F | G | H | A | D | B | C | E | F |
| | | | | | | | | G | E | D | A | F | C | B | H | G | H | A | E | C | B | D | F |
| | | | | | | | | G | E | D | B | C | F | A | H | G | H | B | A | D | E | F | C |
| | | | | | | | | G | E | D | C | B | A | F | H | G | H | B | D | A | F | E | C |

TABLE 12-continued

LIST (12) OF CONTROL INFORMATION IDENTIFICATION BIT ARRAY

| | | | | | | | | | | | | | | |
|---|---|---|---|---|---|---|---|---|---|---|---|---|---|---|
| G | E | D | F | A | B | C | H | G | H | B | E | F | A | D | C |
| G | E | F | A | D | H | B | C | G | H | B | F | E | D | A | C |
| G | E | F | B | H | D | A | C | G | H | C | A | E | D | F | B |
| G | E | F | D | A | B | H | C | G | H | C | D | F | A | E | B |
| G | E | F | H | B | A | D | C | G | H | C | E | A | F | D | B |
| G | E | H | A | C | F | B | D | G | H | C | F | D | E | A | B |
| G | E | H | B | F | C | A | D | G | H | D | A | B | C | F | E |
| G | E | H | C | A | B | F | D | G | H | D | B | A | F | C | E |
| G | E | H | F | B | A | C | D | G | H | D | C | F | A | B | E |
| G | F | A | B | C | E | D | H | G | H | D | F | C | B | A | E |
| G | F | A | C | B | D | E | H | G | H | E | A | C | B | F | D |
| G | F | A | D | E | C | B | H | G | H | E | B | F | A | C | D |

BIT LOCATION A TO H INDICATES LOCATIONS OF OCTET BIT IN 8B/10B CODE.

TABLE 13

LIST (13) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| G | H | E | C | A | F | B | D | H | B | D | E | C | G | F | A | H | D | A | C | G | E | F | B |
| G | H | E | F | B | C | A | D | H | B | D | F | G | C | E | A | H | D | A | E | F | C | G | B |
| G | H | F | B | E | D | C | A | H | B | D | G | F | E | C | A | H | D | A | F | E | G | C | B |
| G | H | F | C | D | E | B | A | H | B | E | A | G | C | D | F | H | D | A | G | C | F | E | B |
| G | H | F | D | C | B | E | A | H | B | E | C | D | A | G | F | H | D | B | C | E | G | F | A |
| G | H | F | E | B | C | D | A | H | B | E | D | C | G | A | F | H | D | B | E | C | F | G | A |
| H | A | B | C | F | G | E | D | H | B | E | G | A | D | C | F | H | D | B | F | G | E | C | A |
| H | A | B | E | G | F | C | D | H | B | F | A | C | G | D | E | H | D | B | G | F | C | E | A |
| H | A | B | F | C | E | G | D | H | B | F | C | A | D | G | E | H | D | C | A | G | E | B | F |
| H | A | B | G | E | C | F | D | H | B | F | D | G | C | A | E | H | D | C | B | E | G | A | F |
| H | A | C | B | F | G | D | E | H | B | F | G | D | A | C | E | H | D | C | E | B | A | G | F |
| H | A | C | D | G | F | B | E | H | B | G | A | E | F | D | C | H | D | C | G | A | B | E | F |
| H | A | C | F | B | D | G | E | H | B | G | D | F | E | A | C | H | D | E | A | F | C | B | G |
| H | A | C | G | D | B | F | E | H | B | G | E | A | D | F | C | H | D | E | B | C | F | A | G |
| H | A | D | C | G | F | E | B | H | B | G | F | D | A | E | C | H | D | E | C | B | A | F | G |
| H | A | D | E | F | G | C | B | H | C | A | B | F | D | G | E | H | D | E | F | A | B | C | G |
| H | A | D | F | E | C | G | B | H | C | A | D | G | B | F | E | H | D | F | A | E | G | B | C |
| H | A | D | G | C | E | F | B | H | C | A | F | B | G | D | E | H | D | F | B | G | E | A | C |

| | | | | | | | | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| | | | | | | | | H | E | D | F | A | C | B | G | H | G | B | E | A | F | D | C |
| | | | | | | | | H | E | F | A | D | G | C | B | H | G | B | F | D | E | A | C |
| | | | | | | | | H | E | F | C | G | D | A | B | H | G | C | A | D | E | F | B |
| | | | | | | | | H | E | F | D | A | C | G | B | H | G | C | D | A | F | E | B |
| | | | | | | | | H | E | F | G | C | A | D | B | H | G | C | E | F | A | D | B |
| | | | | | | | | H | E | G | A | B | F | C | D | H | G | C | F | E | D | A | B |
| | | | | | | | | H | E | G | B | A | C | F | D | H | G | D | A | C | B | F | E |
| | | | | | | | | H | E | G | C | F | B | A | D | H | G | D | B | F | A | C | E |
| | | | | | | | | H | E | G | F | C | A | B | D | H | G | D | C | A | F | B | E |
| | | | | | | | | H | F | A | B | C | D | E | G | H | G | D | F | B | C | A | E |
| | | | | | | | | H | F | A | C | B | E | D | G | H | G | E | A | B | C | F | D |
| | | | | | | | | H | F | A | D | E | B | C | G | H | G | E | B | A | F | C | D |
| | | | | | | | | H | F | A | E | D | C | B | G | H | G | E | C | F | A | B | D |
| | | | | | | | | H | F | B | A | C | D | G | E | H | G | E | F | C | B | A | D |
| | | | | | | | | H | F | B | C | A | G | D | E | H | G | F | B | D | E | C | A |
| | | | | | | | | H | F | B | D | G | A | C | E | H | G | F | C | E | D | B | A |
| | | | | | | | | H | F | B | G | D | C | A | E | H | G | F | D | B | C | E | A |
| | | | | | | | | H | F | C | A | B | E | G | D | H | G | F | E | C | B | D | A |

BIT LOCATION A TO H INDICATES LOCATIONS OF OCTET BIT IN 8B/10B CODE.

TABLE 14

LIST (14) OF CONTROL INFORMATION IDENTIFICATION BIT ARRAY

| d1 | d2 | d3 | d4 | p1 | p2 | p3 | p4 | d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|---|---|---|---|---|---|---|---|
| H | A | E | B | G | F | D | C | H | C | A | G | D | F | B | E | H | D | F | E | A | B | G | C |
| H | A | E | D | F | G | B | C | H | C | B | A | F | D | E | G | H | D | F | G | B | A | E | C |
| H | A | E | F | D | B | G | C | H | C | B | D | E | A | F | G | H | D | G | A | C | F | B | E |
| H | A | E | G | B | D | F | C | H | C | B | E | D | F | A | G | H | D | G | B | F | C | A | E |
| H | A | F | B | C | E | D | G | H | C | B | F | A | E | D | G | H | D | G | C | A | B | F | E |

TABLE 14-continued

LIST (14) OF CONTROL INFORMATION IDENTIFICATION BIT ARRAY

| | | | | | | | | | | | | | | | | | | | | | | | |
|---|---|---|---|---|---|---|---|---|---|---|---|---|---|---|---|---|---|---|---|---|---|---|---|
| H | A | F | C | B | D | E | G | H | C | D | A | G | B | E | F | H | D | G | F | B | A | C | E |
| H | A | F | D | E | C | B | G | H | C | D | B | E | A | G | F | H | E | A | B | G | D | F | C |
| H | A | F | E | D | B | C | G | H | C | D | E | B | G | A | F | H | E | A | D | F | B | G | C |
| H | A | G | B | E | C | D | F | H | C | D | G | A | E | B | F | H | E | A | F | D | G | B | C |
| H | A | G | C | D | B | E | F | H | C | E | B | D | F | G | A | H | E | A | G | B | F | D | C |
| H | A | G | D | C | E | B | F | H | C | E | D | B | G | F | A | H | E | B | A | G | D | C | F |
| H | A | G | E | B | D | C | F | H | C | E | F | G | B | D | A | H | E | B | C | D | G | A | F |
| H | B | A | C | F | E | G | D | H | C | E | G | F | D | B | A | H | E | B | D | C | A | G | F |
| H | B | A | E | G | C | F | D | H | C | F | A | B | G | E | D | H | E | B | G | A | C | D | F |
| H | B | A | F | C | G | E | D | H | C | F | B | A | E | G | D | H | E | C | B | D | G | F | A |
| H | B | A | G | E | F | C | D | H | C | F | E | G | B | A | D | H | E | C | D | B | F | G | A |
| H | B | C | A | F | E | D | G | H | C | F | G | E | A | B | D | H | E | C | F | G | D | B | A |
| H | B | C | D | E | F | A | G | H | C | G | A | D | F | E | B | H | E | C | G | F | B | D | A |
| H | B | C | E | D | A | F | G | H | C | G | D | A | E | F | B | H | E | D | A | F | B | C | G |
| H | B | C | F | A | D | E | G | H | C | G | E | F | D | A | B | H | E | D | B | C | A | F | G |
| H | B | D | C | E | F | G | A | H | C | G | F | E | A | D | B | H | E | D | C | B | F | A | G |

| d1 | d2 | d3 | d4 | p1 | p2 | p3 | p4 | d1 | d2 | d3 | d4 | p1 | p2 | p3 | p4 |
|---|---|---|---|---|---|---|---|---|---|---|---|---|---|---|---|
| H | F | C | B | A | G | E | D | | | | | | | | |
| H | F | C | E | G | A | B | D | | | | | | | | |
| H | F | C | G | E | B | A | D | | | | | | | | |
| H | F | D | A | E | B | G | C | | | | | | | | |
| H | F | D | B | G | A | E | C | | | | | | | | |
| H | F | D | E | A | G | B | C | | | | | | | | |
| H | F | D | G | B | E | A | C | | | | | | | | |
| H | F | E | A | D | C | G | B | | | | | | | | |
| H | F | E | C | G | A | D | B | | | | | | | | |
| H | F | E | D | A | G | C | B | | | | | | | | |
| H | F | E | G | C | D | A | B | | | | | | | | |
| H | F | G | B | D | C | E | A | | | | | | | | |
| H | F | G | C | E | B | D | A | | | | | | | | |
| H | F | G | D | B | E | C | A | | | | | | | | |
| H | F | G | E | C | D | B | A | | | | | | | | |
| H | G | A | B | E | D | C | F | | | | | | | | |
| H | G | A | C | D | E | B | F | | | | | | | | |
| H | G | A | D | C | B | E | F | | | | | | | | |
| H | G | A | E | B | C | D | F | | | | | | | | |
| H | G | B | A | E | D | F | C | | | | | | | | |
| H | G | B | D | F | A | E | C | | | | | | | | |

BIT LOCATION A TO H INDICATES LOCATIONS OF OCTET BIT IN 8B/10B CODE.

In FIG. 2, a receiving node decodes the received communication data code according to the 8B/10B encoding rules and obtains communication data which is separated into a plurality of blocks having 8 bit length (Step S21). Also, a receiving node obtains a control information identification code and a control data code by performing control information receiving process (Steps S22, S23) during a period in which the communication data is not transmitted. After that, the receiving node decodes the control information identification code to a control information identification according to the control information encoding rules at the receiving node (Step S24).

The control information encoding rules at the receiving node are explained with reference to the flow chart shown in FIG. 4. Here, first, each of bit d1' to d4' in the control information identification and each of bit p1' to p4' in the control information identification parity are separated from the control information identification code according to the control information identification bit array as shown as follows (Step S241). Here, bit location A to H indicate locations of octet bits in the 8B/10B code.

d1': bit location A  d2': bit location B  d3': bit location C
d4': bit location D  p1': bit location E  p2': bit location G
p3': bit location H  p4': bit location F Here, the control information identification bit array is not limited to the above-described array as long as the control information identification bit array coincides with the array at the transmission node.

Next, the control information identification containing bit d1' to d4' and the control information identification parity check value containing bit p1' to p4' are determined using the following formula (Step S243).

Parity Check Value=(p1' XOR d2' XOR d3' XOR d4')+(p2' XOR d1' XOR d3' XOR d4')+(p3' XOR d1' XOR d2' XOR d4')+(p4' XOR d1' XOR d2' XOR d3')

"A XOR B" indicates "the exclusive OR of A and B".

If a parity check value is not 0 (zero), an error process is performed which is described as follows. The error process advances a control information error counter and nullifies the received control information identification code and the control data code (Steps S244, S245).

By the control information encoding rules which are described above, it is possible to detect at least one error in the control information identification code which occurs in the transmission interval in which the 10B code is used. Also, it is possible to detect one to three errors which occur in the transmission interval in which a code is used in which the 8B code or each bit of 8B code corresponds one-to-one (for example, 64B/66B code). Also, an erroneous control information is not used in transmission and processing operation for the communication data and is nullified. Therefore, the reliability of the communication system increases. Furthermore, there is little parity calculation and parity check processing; therefore, error detection is easily realized.

Next, an encoding method for the control information in which formulae such as (minimum) Hamming distance d of the 8B code=3, (minimum) Hamming distance D of the 10B code=3, are satisfied are explained as follows as a second embodiment of the present invention.

Operations in the transmission node are the same as the operation disclosed in the first embodiment, except for the control information encoding rule. The control information encoding rule is explained as follows.

First, a control information identification parity containing bit such as p1 to p4 is calculated from the control information identification containing bit such as d1 to d4 according to following formulae (Step S131).

p1=d1 XOR d2 XOR d3 p2=d2 XOR d3 XOR d4 p3=d1 XOR d2 XOR d4 p4=d1 XOR d3 XOR d4

"A XOR B" indicates "the exclusive OR of A and B".

The above-mentioned parity such as p1, p2, and p3 are known as the Hamming code. The above-mentioned parity is disclosed on page 138 of "Information Theory" published by Shokodo Co., Ltd. (ISBN 4-7856-1133-1).

Here, only when parity selection condition 10 (d1, d2, d3, d4)=(1, 0, 1, 1), p4 is determined such that p4=~(d1 XOR d3 XOR d4).

Here, "~A" indicates "the logical negation of A".

Next, each of bit d1 to d4 in the control information identification and each of bit p1 to p4 in the control information identification parity are disposed according to the control information identification bit array so as to obtain the control information identification code as follows (Step S132). Here, bit location A to H indicate locations of octet bit in the 8B/10B code.

| | | |
|---|---|---|
| d1: bit location A | d2: bit location B | d3: bit location C |
| d4: bit location D | p1: bit location E | p2: bit location G |
| p3: bit location H | p4: bit location F | |

Here, the parity formula selection condition and the control information identification bit array are not limited to the above-described condition and array. As long as the parity formula selection condition and the control information identification bit array are selected from conditions and arrays described in TABLES 15 to 24, the second embodiment of the present invention has the same error detecting capacity for 10B code as the above mentioned array. Here, in TABLES 15 to 24, bit array is shown in a column such as "bit array", and a parity selection condition which corresponds to the control information identification bit array is shown in a column such as "condition formula".

TABLE 15

LIST (1) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| A | B | D | E | H | C | G | F | 1 | 1 | 0 | 0 | A | E | G | H | B | D | C | F | 1 | 0 | 0 | 0 |
| A | B | D | E | H | C | G | F | 1 | 0 | 1 | 1 | A | E | G | H | B | D | C | F | 1 | 1 | 0 | 0 |
| A | B | E | D | G | C | H | F | 1 | 1 | 0 | 0 | A | E | H | G | C | D | B | F | 1 | 0 | 0 | 0 |
| A | B | E | D | G | C | H | F | 1 | 0 | 1 | 1 | A | E | H | G | C | D | B | F | 1 | 1 | 0 | 0 |
| A | B | E | F | G | H | C | D | 1 | 1 | 0 | 1 | A | G | B | C | E | H | D | F | 1 | 0 | 0 | 0 |
| A | B | F | E | C | H | G | D | 1 | 1 | 1 | 0 | A | G | B | C | E | H | D | F | 1 | 0 | 1 | 1 |
| A | B | G | H | E | C | D | F | 1 | 0 | 0 | 0 | A | G | C | B | D | H | E | F | 1 | 0 | 0 | 0 |
| A | B | G | H | E | C | D | F | 1 | 1 | 0 | 0 | A | G | C | B | D | H | E | F | 1 | 0 | 1 | 1 |
| A | B | H | G | D | C | E | F | 1 | 0 | 0 | 0 | A | G | D | E | C | H | B | F | 1 | 0 | 0 | 0 |
| A | B | H | G | D | C | E | F | 1 | 1 | 0 | 0 | A | G | D | E | C | H | B | F | 1 | 0 | 1 | 1 |
| A | C | D | E | G | B | H | F | 1 | 1 | 0 | 0 | A | G | E | D | B | H | C | F | 1 | 0 | 0 | 0 |
| A | C | D | E | G | B | H | F | 1 | 0 | 1 | 1 | A | G | E | D | B | H | C | F | 1 | 0 | 1 | 1 |
| A | C | E | D | H | B | G | F | 1 | 1 | 0 | 0 | A | G | E | F | B | C | H | D | 1 | 0 | 0 | 1 |
| A | C | E | D | H | B | G | F | 1 | 0 | 1 | 1 | A | G | F | E | H | C | B | D | 1 | 0 | 1 | 0 |
| A | C | E | F | H | G | B | D | 1 | 1 | 0 | 1 | A | H | B | C | D | G | E | F | 1 | 0 | 0 | 0 |
| A | C | F | E | B | G | H | D | 1 | 1 | 1 | 0 | A | H | B | C | D | G | E | F | 1 | 0 | 1 | 1 |

| BIT ARRAY 7 | | | | | | | | CONDITION FORMULA 10 | | | |
|---|---|---|---|---|---|---|---|---|---|---|---|
| d1 | d2 | d3 | d4 | p1 | p2 | p3 | p4 | d1 | d2 | d3 | d4 |
| B | A | H | E | D | C | G | F | 0 | 1 | 0 | 1 |
| B | C | D | G | E | A | H | F | 1 | 1 | 0 | 0 |
| B | C | D | G | E | A | H | F | 0 | 0 | 1 | 0 |
| B | C | E | H | D | A | G | F | 1 | 1 | 0 | 0 |
| B | C | E | H | D | A | G | F | 0 | 0 | 1 | 0 |
| B | C | G | D | H | A | E | F | 1 | 1 | 0 | 0 |
| B | C | G | D | H | A | E | F | 0 | 0 | 0 | 1 |
| B | C | H | E | G | A | D | F | 1 | 1 | 0 | 0 |
| B | C | H | E | G | A | D | F | 0 | 0 | 0 | 1 |
| B | D | A | C | H | G | E | F | 0 | 1 | 1 | 0 |

TABLE 15-continued

LIST (1) OF CONTROL INFORMATION IDENTIFICATION BIT ARRAY AND PARITY SELECTION CONDITION

| | | | | | | | | | | |
|---|---|---|---|---|---|---|---|---|---|---|
| B | D | A | C | H | G | E | F | 1 | 0 | 1 | 1 |
| B | D | C | A | E | G | H | F | 0 | 1 | 0 | 1 |
| B | D | C | A | E | G | H | F | 1 | 0 | 1 | 1 |
| B | D | C | F | E | H | G | A | 0 | 1 | 0 | 1 |
| B | D | E | H | C | G | A | F | 1 | 0 | 0 | 0 |
| B | D | E | H | C | G | A | F | 0 | 1 | 1 | 0 |

BIT LOCATION A TO H INDICATES LOCATIONS OF OCTET BIT IN 8B/10B CODE.

TABLE 16

LIST (2) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| A | C | G | H | D | B | E | F | 1 | 0 | 0 | 0 | A | H | C | B | E | G | D | F | 1 | 0 | 0 | 0 |
| A | C | G | H | D | B | E | F | 1 | 1 | 0 | 0 | A | H | C | B | E | G | D | F | 1 | 0 | 1 | 1 |
| A | C | H | G | E | B | D | F | 1 | 0 | 0 | 0 | A | H | D | E | B | G | C | F | 1 | 0 | 0 | 0 |
| A | C | H | G | E | B | D | F | 1 | 1 | 0 | 0 | A | H | D | E | B | G | C | F | 1 | 0 | 1 | 1 |
| A | D | B | C | H | E | G | F | 1 | 1 | 0 | 0 | A | H | E | D | C | G | B | F | 1 | 0 | 0 | 0 |
| A | D | B | C | H | E | G | F | 1 | 0 | 1 | 1 | A | H | E | D | C | G | B | F | 1 | 0 | 1 | 1 |
| A | D | C | B | G | E | H | F | 1 | 1 | 0 | 0 | A | H | E | F | C | B | G | D | 1 | 0 | 0 | 1 |
| A | D | C | B | G | E | H | F | 1 | 0 | 1 | 1 | A | H | F | E | G | B | C | D | 1 | 0 | 1 | 0 |
| A | D | G | H | C | E | B | F | 1 | 0 | 0 | 0 | B | A | C | E | F | H | G | D | 1 | 1 | 1 | 0 |
| A | D | G | H | C | E | B | F | 1 | 1 | 0 | 0 | B | A | D | G | H | C | E | F | 1 | 1 | 0 | 0 |
| A | D | H | G | B | E | C | F | 1 | 0 | 0 | 0 | B | A | D | G | H | C | E | F | 0 | 1 | 1 | 0 |
| A | D | H | G | B | E | C | F | 1 | 1 | 0 | 0 | B | A | E | H | G | C | D | F | 1 | 1 | 0 | 0 |
| A | E | B | C | G | D | H | F | 1 | 1 | 0 | 0 | B | A | E | H | G | C | D | F | 0 | 1 | 1 | 0 |
| A | E | B | C | G | D | H | F | 1 | 0 | 1 | 1 | B | A | G | D | E | C | H | F | 1 | 1 | 0 | 0 |
| A | E | C | B | H | D | G | F | 1 | 1 | 0 | 0 | B | A | G | D | E | C | H | F | 0 | 1 | 0 | 1 |
| A | E | C | B | H | D | G | F | 1 | 0 | 1 | 1 | B | A | H | E | D | C | G | F | 1 | 1 | 0 | 0 |

| | | | | | | | | BIT ARRAY 7 | | | | | | | | CONDITION FORMULA 10 | | | |
|---|---|---|---|---|---|---|---|---|---|---|---|---|---|---|---|---|---|---|---|
| | | | | | | | | d1 | d2 | d3 | d4 | p1 | p2 | p3 | p4 | d1 | d2 | d3 | d4 |
| | | | | | | | | B | D | F | C | G | H | E | A | 0 | 1 | 1 | 0 |
| | | | | | | | | B | D | H | E | A | G | C | F | 1 | 0 | 0 | 0 |
| | | | | | | | | B | D | H | E | A | G | C | F | 0 | 1 | 0 | 1 |
| | | | | | | | | B | E | A | C | G | H | D | F | 0 | 1 | 1 | 0 |
| | | | | | | | | B | E | A | C | G | H | D | F | 1 | 0 | 1 | 1 |
| | | | | | | | | B | E | A | H | G | C | F | D | 1 | 0 | 1 | 0 |
| | | | | | | | | B | E | C | A | D | H | G | F | 0 | 1 | 0 | 1 |
| | | | | | | | | B | E | C | A | D | H | G | F | 1 | 0 | 1 | 1 |
| | | | | | | | | B | E | C | F | D | G | H | A | 0 | 1 | 0 | 1 |
| | | | | | | | | B | E | D | G | C | H | A | F | 1 | 0 | 0 | 0 |
| | | | | | | | | B | E | D | G | C | H | A | F | 0 | 1 | 1 | 0 |
| | | | | | | | | B | E | F | C | H | G | D | A | 0 | 1 | 1 | 0 |
| | | | | | | | | B | E | F | G | H | C | A | D | 1 | 0 | 1 | 0 |
| | | | | | | | | B | E | G | D | A | H | C | F | 1 | 0 | 0 | 0 |
| | | | | | | | | B | E | G | D | A | H | C | F | 0 | 1 | 0 | 1 |
| | | | | | | | | B | E | G | F | A | C | H | D | 1 | 0 | 0 | 1 |

BIT LOCATION A TO H INDICATES LOCATIONS OF OCTET BIT IN 8B/10B CODE.

TABLE 17

LIST (3) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| B | E | H | A | F | C | G | D | 1 | 0 | 0 | 1 | C | A | H | D | E | B | G | F | 0 | 1 | 0 | 1 |
| B | F | C | E | A | G | H | D | 1 | 1 | 1 | 0 | C | B | D | H | E | A | G | F | 1 | 1 | 0 | 0 |
| B | G | A | C | E | D | H | F | 0 | 0 | 1 | 0 | C | B | D | H | E | A | G | F | 0 | 0 | 1 | 0 |

TABLE 17-continued

LIST (3) OF CONTROL INFORMATION IDENTIFICATION BIT ARRAY AND PARITY SELECTION CONDITION

| B | G | A | C | E | D | H | F | 1 | 0 | 1 | 1 | C | B | E | G | D | A | H | F | 1 | 1 | 0 | 0 |
| B | G | C | A | H | D | E | F | 0 | 0 | 0 | 1 | C | B | E | G | D | A | H | F | 0 | 0 | 1 | 0 |
| B | G | C | A | H | D | E | F | 1 | 0 | 1 | 1 | C | B | G | E | H | A | D | F | 1 | 1 | 0 | 0 |
| B | G | C | E | H | F | A | D | 1 | 0 | 1 | 0 | C | B | G | E | H | A | D | F | 0 | 0 | 0 | 1 |
| B | G | C | F | H | E | D | A | 0 | 0 | 0 | 1 | C | B | H | D | G | A | E | F | 1 | 1 | 0 | 0 |
| B | G | E | H | A | D | C | F | 1 | 0 | 0 | 0 | C | B | H | D | G | A | E | F | 0 | 0 | 0 | 1 |
| B | G | E | H | A | D | C | F | 0 | 0 | 1 | 0 | C | D | A | B | G | H | E | F | 0 | 1 | 1 | 0 |
| B | G | F | C | D | E | H | A | 0 | 0 | 1 | 0 | C | D | A | B | G | H | E | F | 1 | 0 | 1 | 1 |
| B | G | H | E | C | D | A | F | 1 | 0 | 0 | 0 | C | D | B | A | E | H | G | F | 0 | 1 | 0 | 1 |
| B | G | H | E | C | D | A | F | 0 | 0 | 0 | 1 | C | D | B | A | E | H | G | F | 1 | 0 | 1 | 1 |
| B | H | A | C | D | E | G | F | 0 | 0 | 1 | 0 | C | D | B | F | E | G | H | A | 0 | 1 | 0 | 1 |
| B | H | A | C | D | E | G | F | 1 | 0 | 1 | 1 | C | D | E | G | B | H | A | F | 1 | 0 | 0 | 0 |
| B | H | C | A | G | E | D | F | 0 | 0 | 0 | 1 | C | D | E | G | B | H | A | F | 0 | 1 | 1 | 0 |

|  | BIT ARRAY 7 |  |  |  |  |  |  | CONDITION FORMULA 10 |  |  |  |
|---|---|---|---|---|---|---|---|---|---|---|---|
| d1 | d2 | d3 | d4 | p1 | p2 | p3 | p4 | d1 | d2 | d3 | d4 |
| C | E | H | F | A | B | G | D | 1 | 0 | 0 | 1 |
| C | F | B | E | A | H | G | D | 1 | 1 | 1 | 0 |
| C | G | A | B | D | E | H | F | 0 | 0 | 1 | 0 |
| C | G | A | B | D | E | H | F | 1 | 0 | 1 | 1 |
| C | G | B | A | H | E | D | F | 0 | 0 | 0 | 1 |
| C | G | B | A | H | E | D | F | 1 | 0 | 1 | 1 |
| C | G | B | E | H | A | F | D | 1 | 0 | 1 | 0 |
| C | G | B | F | H | D | E | A | 0 | 0 | 0 | 1 |
| C | G | D | H | A | E | B | F | 1 | 0 | 0 | 0 |
| C | G | D | H | A | E | B | F | 0 | 0 | 1 | 0 |
| C | G | F | B | E | D | H | A | 0 | 0 | 1 | 0 |
| C | G | H | D | B | E | A | F | 1 | 0 | 0 | 0 |
| C | G | H | D | B | E | A | F | 0 | 0 | 0 | 1 |
| C | H | A | B | E | D | G | F | 0 | 0 | 1 | 0 |
| C | H | A | B | E | D | G | F | 1 | 0 | 1 | 1 |
| C | H | B | A | G | D | E | F | 0 | 0 | 0 | 1 |

BIT LOCATION A TO H INDICATES LOCATIONS OF OCTET BIT IN 8B/10B CODE.

TABLE 18

LIST (4) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| B | H | C | A | G | E | D | F | 1 | 0 | 1 | 1 | C | D | F | B | H | G | E | A | 0 | 1 | 1 | 0 |
| B | H | C | E | G | A | F | D | 1 | 0 | 1 | 0 | C | D | G | E | A | H | B | F | 1 | 0 | 0 | 0 |
| B | H | C | F | G | D | E | A | 0 | 0 | 0 | 1 | C | D | G | E | A | H | B | F | 0 | 1 | 0 | 1 |
| B | H | D | G | A | E | C | F | 1 | 0 | 0 | 0 | C | E | A | B | H | G | D | F | 0 | 1 | 1 | 0 |
| B | H | D | G | A | E | C | F | 0 | 0 | 1 | 0 | C | E | A | B | H | G | D | F | 1 | 0 | 1 | 1 |
| B | H | F | C | E | D | G | A | 0 | 0 | 1 | 0 | C | E | A | G | H | B | F | D | 1 | 0 | 1 | 0 |
| B | H | G | D | C | E | A | F | 1 | 0 | 0 | 0 | C | E | B | A | D | G | H | F | 0 | 1 | 0 | 1 |
| B | H | G | D | C | E | A | F | 0 | 0 | 0 | 1 | C | E | B | A | D | G | H | F | 1 | 0 | 1 | 1 |
| C | A | B | E | F | G | H | D | 1 | 1 | 1 | 0 | C | E | B | F | D | H | G | A | 0 | 1 | 0 | 1 |
| C | A | D | H | G | B | E | F | 1 | 1 | 0 | 0 | C | E | D | H | B | G | A | F | 1 | 0 | 1 | 0 |
| C | A | D | H | G | B | E | F | 0 | 1 | 1 | 0 | C | E | D | H | B | G | A | F | 0 | 1 | 1 | 0 |
| C | A | E | G | H | B | D | F | 1 | 1 | 0 | 0 | C | E | F | B | G | H | D | A | 0 | 1 | 1 | 0 |
| C | A | E | G | H | B | D | F | 0 | 0 | 1 | 0 | C | E | F | H | G | B | A | D | 0 | 1 | 0 | 1 |
| C | A | G | E | D | B | H | F | 1 | 1 | 0 | 0 | C | E | G | A | F | B | H | D | 1 | 0 | 0 | 1 |
| C | A | G | E | D | B | H | F | 0 | 1 | 0 | 1 | C | E | H | D | A | G | B | F | 1 | 0 | 0 | 0 |
| C | A | H | D | E | B | G | F | 1 | 1 | 0 | 0 | C | E | H | D | A | G | B | F | 0 | 1 | 0 | 1 |

|  | BIT ARRAY 7 |  |  |  |  |  |  | CONDITION FORMULA 10 |  |  |  |
|---|---|---|---|---|---|---|---|---|---|---|---|
| d1 | d2 | d3 | d4 | p1 | p2 | p3 | p4 | d1 | d2 | d3 | d4 |
| C | H | B | A | G | D | E | F | 1 | 0 | 1 | 1 |
| C | H | B | E | G | F | A | D | 1 | 0 | 1 | 0 |
| C | H | B | F | G | E | D | A | 0 | 0 | 0 | 1 |
| C | H | E | G | A | D | B | F | 1 | 0 | 0 | 0 |

TABLE 18-continued

LIST (4) OF CONTROL INFORMATION IDENTIFICATION BIT ARRAY AND PARITY SELECTION CONDITION

| | | | | | | | | | | |
|---|---|---|---|---|---|---|---|---|---|---|
| C | H | E | G | A | D | B | F | 0 | 0 | 1 | 0 |
| C | H | F | B | D | E | G | A | 0 | 0 | 1 | 0 |
| C | H | G | E | B | D | A | F | 1 | 0 | 0 | 0 |
| C | H | G | E | B | D | A | F | 0 | 0 | 0 | 1 |
| D | A | B | G | H | E | C | F | 1 | 1 | 0 | 0 |
| D | A | B | G | H | E | C | F | 0 | 1 | 1 | 0 |
| D | A | C | H | G | E | B | F | 1 | 1 | 0 | 0 |
| D | A | C | H | G | E | B | F | 0 | 1 | 1 | 0 |
| D | A | G | B | C | E | H | F | 1 | 1 | 0 | 0 |
| D | A | G | B | C | E | H | F | 0 | 1 | 0 | 1 |
| D | A | H | C | B | E | G | F | 1 | 1 | 0 | 0 |
| D | A | H | C | B | E | G | F | 0 | 1 | 0 | 1 |

BIT LOCATION A TO H INDICATES LOCATIONS OF OCTET BIT IN 8B/10B CODE.

TABLE 19

LIST (5) OF CONTROL INFORMATION IDENTIFICATION BIT ARRAY AND PARITY SELECTION CONDITION

| BIT ARRAY 7 | | | | | | | CONDITION FORMULA 10 | | | | BIT ARRAY 7 | | | | | | | CONDITION FORMULA 10 | | | |
|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| D | B | A | E | H | G | C | F | 0 | 1 | 1 | 0 | D | F | B | H | G | E | C | A | 1 | 1 | 0 | 0 |
| D | B | A | E | H | G | C | F | 1 | 0 | 1 | 1 | D | F | C | G | H | E | B | A | 1 | 1 | 0 | 0 |
| D | B | C | G | E | H | F | A | 1 | 0 | 0 | 0 | D | F | G | C | B | E | H | A | 1 | 1 | 0 | 0 |
| D | B | C | H | E | G | A | F | 1 | 0 | 0 | 0 | D | F | H | B | C | E | G | A | 1 | 1 | 0 | 0 |
| D | B | C | H | E | G | A | F | 0 | 1 | 1 | 0 | D | G | A | E | C | B | H | F | 0 | 0 | 1 | 0 |
| D | B | E | A | C | G | H | F | 0 | 1 | 0 | 1 | D | G | A | E | C | B | H | F | 1 | 0 | 1 | 1 |
| D | B | E | A | C | G | H | F | 1 | 0 | 1 | 1 | D | G | B | H | F | C | E | A | 1 | 0 | 0 | 0 |
| D | B | G | C | F | H | E | A | 1 | 0 | 0 | 0 | D | G | C | H | A | B | E | F | 1 | 0 | 0 | 0 |
| D | B | H | C | A | G | E | F | 1 | 0 | 0 | 0 | D | G | C | H | A | B | E | F | 0 | 0 | 1 | 0 |
| D | B | H | C | A | G | E | F | 0 | 1 | 0 | 1 | D | G | E | A | H | B | C | F | 0 | 0 | 0 | 1 |
| D | C | A | E | G | H | B | F | 0 | 1 | 1 | 0 | D | G | E | A | H | B | C | F | 1 | 0 | 1 | 1 |
| D | C | A | E | G | H | B | F | 1 | 0 | 1 | 1 | D | G | H | B | E | C | F | A | 1 | 0 | 0 | 0 |
| D | C | B | G | E | H | A | F | 1 | 0 | 0 | 0 | D | G | H | C | E | B | A | F | 1 | 0 | 0 | 0 |
| D | C | B | G | E | H | A | F | 0 | 1 | 1 | 0 | D | G | H | C | E | B | A | F | 0 | 0 | 0 | 1 |
| D | C | B | H | E | G | F | A | 1 | 0 | 0 | 0 | D | H | A | E | B | C | G | F | 0 | 0 | 1 | 0 |
| D | C | E | A | B | H | G | F | 0 | 1 | 0 | 1 | D | H | A | E | B | C | G | F | 1 | 0 | 1 | 1 |

| BIT ARRAY 7 | | | | | | | CONDITION FORMULA 10 | | | |
|---|---|---|---|---|---|---|---|---|---|---|
| d1 | d2 | d3 | d4 | p1 | p2 | p3 | p4 | d1 | d2 | d3 | d4 |
| E | A | H | B | C | D | G | F | 0 | 1 | 0 | 1 |
| E | A | H | G | C | F | B | D | 0 | 1 | 0 | 0 |
| E | B | A | D | G | H | C | F | 0 | 1 | 1 | 0 |
| E | B | A | D | G | H | C | F | 1 | 0 | 1 | 1 |
| E | B | C | G | D | H | A | F | 1 | 0 | 0 | 0 |
| E | B | C | G | D | H | A | F | 0 | 1 | 1 | 0 |
| E | B | C | H | D | G | F | A | 1 | 0 | 0 | 0 |
| E | B | D | A | C | H | G | F | 0 | 1 | 0 | 1 |
| E | B | D | A | C | H | G | F | 1 | 0 | 1 | 1 |
| E | B | G | C | A | H | D | F | 1 | 0 | 0 | 0 |
| E | B | G | C | A | H | D | F | 0 | 1 | 0 | 1 |
| E | B | H | C | F | G | D | A | 1 | 0 | 0 | 0 |
| E | C | A | D | H | G | B | F | 0 | 1 | 1 | 0 |
| E | C | A | D | H | G | B | F | 1 | 0 | 1 | 1 |
| E | C | B | G | D | H | F | A | 1 | 0 | 0 | 0 |
| E | C | B | H | D | G | A | F | 1 | 0 | 0 | 0 |

BIT LOCATION A TO H INDICATES LOCATIONS OF OCTET BIT IN 8B/10B CODE.

TABLE 20

LIST (6) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| D | C | E | A | B | H | G | F | 1 | 0 | 1 | 1 | D | H | B | G | A | C | E | F | 1 | 0 | 0 | 0 |
| D | C | G | B | A | H | E | F | 1 | 0 | 0 | 0 | D | H | B | G | A | C | E | F | 0 | 0 | 1 | 0 |
| D | C | G | B | A | H | E | F | 0 | 1 | 0 | 1 | D | H | C | G | F | B | E | A | 1 | 0 | 0 | 0 |
| D | C | H | B | F | G | E | A | 1 | 0 | 0 | 0 | D | H | E | A | G | C | B | F | 0 | 0 | 0 | 1 |
| D | E | B | G | C | A | H | F | 1 | 1 | 0 | 0 | D | H | E | A | G | C | B | F | 1 | 0 | 1 | 1 |
| D | E | B | G | C | A | H | F | 0 | 0 | 1 | 0 | D | H | G | B | E | C | A | F | 1 | 0 | 0 | 0 |
| D | E | B | H | C | F | G | A | 1 | 1 | 0 | 0 | D | H | G | B | E | C | A | F | 0 | 0 | 0 | 1 |
| D | E | C | G | B | F | H | A | 1 | 1 | 0 | 0 | D | H | G | C | E | B | F | A | 1 | 0 | 0 | 0 |
| D | E | C | H | B | A | G | F | 1 | 1 | 0 | 0 | E | A | B | H | G | D | C | F | 1 | 1 | 0 | 0 |
| D | E | C | H | B | A | G | F | 0 | 0 | 1 | 0 | E | A | B | H | G | D | C | F | 0 | 1 | 1 | 0 |
| D | E | G | B | H | A | C | F | 1 | 1 | 0 | 0 | E | A | C | G | H | D | B | F | 1 | 1 | 0 | 0 |
| D | E | G | B | H | A | C | F | 0 | 0 | 0 | 1 | E | A | C | G | H | D | B | F | 0 | 1 | 1 | 0 |
| D | E | G | C | H | F | B | A | 1 | 1 | 0 | 0 | E | A | G | C | B | D | H | F | 1 | 1 | 0 | 0 |
| D | E | H | B | G | F | C | A | 1 | 1 | 0 | 0 | E | A | G | C | B | D | H | F | 0 | 1 | 0 | 1 |
| D | E | H | C | G | A | B | F | 1 | 1 | 0 | 0 | E | A | G | H | B | F | C | D | 0 | 1 | 0 | 0 |
| D | E | H | C | G | A | B | F | 0 | 0 | 0 | 1 | E | A | H | B | C | D | G | F | 1 | 1 | 0 | 0 |

| BIT ARRAY 7 | | | | | | | | CONDITION FORMULA 10 | | | |
|---|---|---|---|---|---|---|---|---|---|---|---|
| d1 | d2 | d3 | d4 | p1 | p2 | p3 | p4 | d1 | d2 | d3 | d4 |
| E | C | B | H | D | G | A | F | 0 | 1 | 1 | 0 |
| E | C | D | A | B | G | H | F | 0 | 1 | 0 | 1 |
| E | C | D | A | B | G | H | F | 1 | 0 | 1 | 1 |
| E | C | G | B | F | H | D | A | 1 | 0 | 0 | 0 |
| E | C | H | B | A | G | D | F | 1 | 0 | 0 | 0 |
| E | C | H | B | A | G | D | F | 0 | 1 | 0 | 1 |
| E | D | B | G | C | F | H | A | 1 | 1 | 0 | 0 |
| E | D | B | H | C | A | G | F | 1 | 1 | 0 | 0 |
| E | D | B | H | C | A | G | F | 0 | 0 | 1 | 0 |
| E | D | C | G | B | A | H | F | 1 | 1 | 0 | 0 |
| E | D | C | G | B | A | H | F | 0 | 0 | 1 | 0 |
| E | D | C | H | B | F | G | A | 1 | 1 | 0 | 0 |
| E | D | G | B | H | F | C | A | 1 | 1 | 0 | 0 |
| E | D | G | C | H | A | B | F | 1 | 1 | 0 | 0 |
| E | D | G | C | H | A | B | F | 0 | 0 | 0 | 1 |
| E | D | H | B | G | A | C | F | 1 | 1 | 0 | 0 |

BIT LOCATION A TO H INDICATES LOCATIONS OF OCTET BIT IN 8B/10B CODE.

TABLE 21

LIST (7) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| E | D | H | B | G | A | C | F | 0 | 0 | 0 | 1 | F | B | A | E | C | G | H | D | 1 | 1 | 1 | 0 |
| E | D | H | C | G | F | B | A | 1 | 1 | 0 | 0 | F | B | E | A | H | G | C | D | 1 | 1 | 0 | 1 |
| E | F | B | G | H | D | C | A | 1 | 1 | 0 | 0 | F | B | G | H | D | C | E | A | 1 | 0 | 0 | 0 |
| E | F | C | H | G | D | B | A | 1 | 1 | 0 | 0 | F | B | H | G | E | C | D | A | 1 | 0 | 0 | 0 |
| E | F | G | B | C | D | H | A | 1 | 1 | 0 | 0 | F | C | A | E | B | H | G | D | 1 | 1 | 1 | 0 |
| E | F | G | H | C | A | B | D | 0 | 1 | 0 | 0 | F | C | E | A | G | H | B | D | 1 | 1 | 0 | 1 |
| E | F | H | C | B | D | G | A | 1 | 1 | 0 | 0 | F | C | G | H | E | B | D | A | 1 | 0 | 0 | 0 |
| E | F | H | G | B | A | C | D | 0 | 1 | 0 | 0 | F | C | H | G | D | B | E | A | 1 | 0 | 0 | 0 |
| E | G | A | D | B | C | H | F | 0 | 0 | 1 | 0 | F | D | B | C | G | E | H | A | 1 | 1 | 0 | 0 |
| E | G | A | D | B | C | H | F | 1 | 0 | 1 | 1 | F | D | C | B | H | E | G | A | 1 | 1 | 0 | 0 |
| E | G | A | F | B | H | C | D | 0 | 0 | 1 | 1 | F | E | B | C | H | D | G | A | 1 | 1 | 0 | 0 |
| E | G | B | H | A | C | D | F | 1 | 0 | 0 | 0 | F | E | C | B | G | D | H | A | 1 | 1 | 0 | 0 |
| E | G | B | H | A | C | D | F | 0 | 0 | 1 | 0 | F | G | A | E | H | B | C | D | 1 | 0 | 1 | 0 |
| E | G | C | H | F | B | D | A | 1 | 0 | 0 | 0 | F | G | B | C | D | H | E | A | 1 | 0 | 0 | 0 |
| E | G | D | A | H | C | B | F | 0 | 0 | 0 | 1 | F | G | C | B | E | H | D | A | 1 | 0 | 0 | 0 |
| E | G | D | A | H | C | B | F | 1 | 0 | 1 | 1 | F | G | E | A | C | B | H | D | 1 | 0 | 0 | 1 |

TABLE 21-continued

LIST (7) OF CONTROL INFORMATION IDENTIFICATION BIT ARRAY AND PARITY SELECTION CONDITION

| | | | | | | | | BIT ARRAY 7 | | | | | | | CONDITION FORMULA 10 | | | |
|---|---|---|---|---|---|---|---|---|---|---|---|---|---|---|---|---|---|---|
| | | | | | | | d1 | d2 | d3 | d4 | p1 | p2 | p3 | p4 | d1 | d2 | d3 | d4 |
| | | | | | | | G | B | C | E | H | D | A | F | 0 | 1 | 1 | 0 |
| | | | | | | | G | B | C | E | H | D | A | F | 0 | 0 | 0 | 1 |
| | | | | | | | G | B | D | C | F | E | H | A | 0 | 0 | 1 | 0 |
| | | | | | | | G | B | E | C | A | D | H | F | 0 | 0 | 1 | 0 |
| | | | | | | | G | B | E | C | A | D | H | F | 0 | 1 | 0 | 1 |
| | | | | | | | G | B | E | H | A | F | C | D | 0 | 1 | 0 | 0 |
| | | | | | | | G | B | F | H | D | E | C | A | 0 | 0 | 1 | 0 |
| | | | | | | | G | B | H | A | C | D | E | F | 0 | 0 | 0 | 1 |
| | | | | | | | G | B | H | A | C | D | E | F | 0 | 1 | 0 | 1 |
| | | | | | | | G | B | H | E | C | F | A | D | 0 | 1 | 0 | 0 |
| | | | | | | | G | B | H | F | C | E | D | A | 0 | 0 | 0 | 1 |
| | | | | | | | G | C | A | H | D | E | B | F | 0 | 0 | 1 | 0 |
| | | | | | | | G | C | A | H | D | E | B | F | 0 | 1 | 1 | 0 |
| | | | | | | | G | C | B | D | H | E | A | F | 0 | 1 | 1 | 0 |
| | | | | | | | G | C | B | D | H | E | A | F | 0 | 0 | 0 | 1 |
| | | | | | | | G | C | D | B | A | E | H | F | 0 | 0 | 1 | 0 |

BIT LOCATION A TO H INDICATES LOCATIONS OF OCTET BIT IN 8B/10B CODE.

TABLE 22

LIST (8) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| E | G | F | A | C | H | B | D | 0 | 0 | 1 | 1 | F | H | A | E | G | C | B | D | 1 | 0 | 1 | 0 |
| E | G | H | B | D | C | A | F | 1 | 0 | 0 | 0 | F | H | B | C | E | G | D | A | 1 | 0 | 0 | 0 |
| E | G | H | B | D | C | A | F | 0 | 0 | 0 | 1 | F | H | C | B | D | G | E | A | 1 | 0 | 0 | 0 |
| E | G | H | C | D | B | F | A | 1 | 0 | 0 | 0 | F | H | E | A | B | C | G | D | 1 | 0 | 0 | 1 |
| E | H | A | D | C | B | G | F | 0 | 0 | 1 | 0 | G | A | B | D | E | H | C | F | 0 | 1 | 1 | 0 |
| E | H | A | D | C | B | G | F | 1 | 0 | 1 | 1 | G | A | B | D | E | H | C | F | 0 | 1 | 0 | 1 |
| E | H | A | F | C | G | B | D | 0 | 0 | 1 | 1 | G | A | C | E | D | H | B | F | 0 | 1 | 1 | 0 |
| E | H | B | G | F | C | D | A | 1 | 0 | 0 | 0 | G | A | C | E | D | H | B | F | 0 | 1 | 0 | 1 |
| E | H | C | G | A | B | D | F | 1 | 0 | 0 | 0 | G | A | D | B | C | H | E | F | 0 | 1 | 1 | 0 |
| E | H | C | G | A | B | D | F | 0 | 0 | 1 | 0 | G | A | D | B | C | H | E | F | 0 | 1 | 0 | 1 |
| E | H | D | A | G | B | C | F | 0 | 0 | 0 | 1 | G | A | E | C | B | H | D | F | 0 | 1 | 1 | 0 |
| E | H | D | A | G | B | C | F | 1 | 0 | 1 | 1 | G | A | E | C | B | H | D | F | 0 | 1 | 0 | 1 |
| E | H | F | A | B | G | C | D | 0 | 0 | 1 | 1 | G | A | E | H | B | C | F | D | 0 | 1 | 0 | 0 |
| E | H | G | B | D | C | F | A | 1 | 0 | 0 | 0 | G | A | H | E | F | C | B | D | 0 | 1 | 0 | 0 |
| E | H | G | C | D | B | A | F | 1 | 0 | 0 | 0 | G | B | A | H | E | D | C | F | 0 | 1 | 0 | 0 |
| E | H | G | C | D | B | A | F | 0 | 0 | 0 | 1 | G | B | A | H | E | D | C | F | 0 | 1 | 1 | 0 |

| | | | | | | | | BIT ARRAY 7 | | | | | | | CONDITION FORMULA 10 | | | |
|---|---|---|---|---|---|---|---|---|---|---|---|---|---|---|---|---|---|---|
| | | | | | | | d1 | d2 | d3 | d4 | p1 | p2 | p3 | p4 | d1 | d2 | d3 | d4 |
| | | | | | | | G | C | D | B | A | E | H | F | 0 | 1 | 0 | 1 |
| | | | | | | | G | C | E | B | F | D | H | A | 0 | 0 | 1 | 0 |
| | | | | | | | G | C | E | H | F | A | B | D | 0 | 1 | 0 | 0 |
| | | | | | | | G | C | F | H | E | D | B | A | 0 | 0 | 1 | 0 |
| | | | | | | | G | C | H | A | B | E | D | F | 0 | 0 | 0 | 1 |
| | | | | | | | G | C | H | A | B | E | D | F | 0 | 1 | 0 | 1 |
| | | | | | | | G | C | H | E | B | A | F | D | 0 | 1 | 0 | 0 |
| | | | | | | | G | C | H | F | B | D | E | A | 0 | 0 | 0 | 1 |
| | | | | | | | G | D | A | H | C | B | E | F | 0 | 0 | 0 | 1 |
| | | | | | | | G | D | A | H | C | B | E | F | 0 | 1 | 1 | 0 |
| | | | | | | | G | D | C | E | A | B | H | F | 0 | 0 | 1 | 0 |
| | | | | | | | G | D | C | E | A | B | H | F | 0 | 1 | 0 | 1 |
| | | | | | | | G | D | E | B | H | C | F | A | 0 | 1 | 1 | 0 |
| | | | | | | | G | D | E | C | H | B | A | F | 0 | 1 | 1 | 0 |
| | | | | | | | G | D | E | C | H | B | A | F | 0 | 0 | 0 | 1 |
| | | | | | | | G | D | H | A | E | B | C | F | 0 | 0 | 0 | 1 |

BIT LOCATION A TO H INDICATES LOCATIONS OF OCTET BIT IN 8B/10B CODE.

TABLE 23

LIST (9) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| G | D | H | A | E | B | C | F | 0 | 1 | 0 | 1 | H | A | E | G | C | B | F | D | 0 | 1 | 0 | 0 |
| G | E | A | H | B | C | D | F | 0 | 0 | 1 | 0 | H | A | G | E | F | B | C | D | 0 | 1 | 0 | 0 |
| G | E | A | H | B | C | D | F | 0 | 1 | 1 | 0 | H | B | A | G | D | E | C | F | 0 | 0 | 1 | 0 |
| G | E | B | D | A | C | H | F | 0 | 0 | 1 | 0 | H | B | A | G | D | E | C | F | 0 | 1 | 1 | 0 |
| G | E | B | D | A | C | H | F | 0 | 1 | 0 | 1 | H | B | C | D | G | E | A | F | 0 | 1 | 1 | 0 |
| G | E | D | B | H | C | A | F | 0 | 1 | 1 | 0 | H | B | C | D | G | E | A | F | 0 | 0 | 0 | 1 |
| G | E | D | B | H | C | A | F | 0 | 0 | 0 | 1 | H | B | D | C | A | E | G | F | 0 | 0 | 1 | 0 |
| G | E | D | C | H | B | F | A | 0 | 1 | 1 | 0 | H | B | D | C | A | E | G | F | 0 | 1 | 0 | 1 |
| G | E | H | A | D | C | B | F | 0 | 0 | 0 | 1 | H | B | E | C | F | D | G | A | 0 | 0 | 1 | 0 |
| G | E | H | A | D | C | B | F | 0 | 1 | 0 | 1 | H | B | E | G | F | A | C | D | 0 | 1 | 0 | 0 |
| G | F | D | C | B | H | E | A | 0 | 1 | 1 | 0 | H | B | F | G | E | D | C | A | 0 | 0 | 1 | 0 |
| G | F | E | B | C | H | D | A | 0 | 1 | 1 | 0 | H | B | G | A | C | E | D | F | 0 | 0 | 0 | 1 |
| G | F | E | H | C | B | A | D | 0 | 1 | 0 | 0 | H | B | G | A | C | E | D | F | 0 | 1 | 0 | 1 |
| G | F | H | E | A | B | C | D | 0 | 1 | 0 | 0 | H | B | G | E | C | A | F | D | 0 | 1 | 0 | 0 |
| G | H | B | D | C | A | E | F | 0 | 0 | 1 | 0 | H | B | G | F | C | D | E | A | 0 | 0 | 0 | 1 |
| G | H | B | D | C | A | E | F | 0 | 0 | 0 | 1 | H | C | A | G | E | D | B | F | 0 | 0 | 1 | 0 |

| BIT ARRAY 7 | | | | | | | | CONDITION FORMULA 10 | | | |
|---|---|---|---|---|---|---|---|---|---|---|---|
| d1 | d2 | d3 | d4 | p1 | p2 | p3 | p4 | d1 | d2 | d3 | d4 |
| H | D | E | B | G | C | A | F | 0 | 1 | 1 | 0 |
| H | D | E | B | G | C | A | F | 0 | 0 | 0 | 1 |
| H | D | E | C | G | B | F | A | 0 | 1 | 1 | 0 |
| H | D | G | A | E | C | B | F | 0 | 0 | 0 | 1 |
| H | D | G | A | E | C | B | F | 0 | 1 | 0 | 1 |
| H | E | A | G | C | B | D | F | 0 | 0 | 1 | 0 |
| H | E | A | G | C | B | D | F | 0 | 1 | 1 | 0 |
| H | E | C | D | A | B | G | F | 0 | 0 | 1 | 0 |
| H | E | C | D | A | B | G | F | 0 | 1 | 0 | 1 |
| H | E | D | B | G | C | F | A | 0 | 1 | 1 | 0 |
| H | E | D | C | G | B | A | F | 0 | 1 | 1 | 0 |
| H | E | D | C | G | B | A | F | 0 | 0 | 0 | 1 |
| H | E | G | A | D | B | C | F | 0 | 0 | 0 | 1 |
| H | E | G | A | D | B | C | F | 0 | 1 | 0 | 1 |
| H | F | D | B | C | G | E | A | 0 | 1 | 1 | 0 |
| H | F | E | C | B | G | D | A | 0 | 1 | 1 | 0 |

BIT LOCATION A TO H INDICATES LOCATIONS OF OCTET BIT IN 8B/10B CODE.

TABLE 24

LIST (10) OF CONTROL INFORMATION IDENTIFICATION BIT ARRAY AND PARITY SELECTION CONDITION

| BIT ARRAY 7 | | | | | | | | CONDITION FORMULA 10 | | | | BIT ARRAY 7 | | | | | | | | CONDITION FORMULA 10 | | | |
|---|---|---|---|---|---|---|---|---|---|---|---|---|---|---|---|---|---|---|---|---|---|---|---|
| d1 | d2 | d3 | d4 | p1 | p2 | p3 | p4 | d1 | d2 | d3 | d4 | d1 | d2 | d3 | d4 | p1 | p2 | p3 | p4 | d1 | d2 | d3 | d4 |
| G | H | C | E | B | A | D | F | 0 | 0 | 1 | 0 | H | C | A | G | E | D | B | F | 0 | 1 | 1 | 0 |
| G | H | C | E | B | A | D | F | 0 | 0 | 0 | 1 | H | C | B | E | G | D | A | F | 0 | 1 | 1 | 0 |
| G | H | D | B | E | A | C | F | 0 | 0 | 0 | 1 | H | C | B | E | G | D | A | F | 0 | 0 | 0 | 1 |
| G | H | D | B | E | A | C | F | 0 | 0 | 0 | 1 | H | C | D | B | F | E | G | A | 0 | 0 | 1 | 0 |
| G | H | D | C | E | F | B | A | 0 | 0 | 1 | 0 | H | C | E | B | A | D | G | F | 0 | 0 | 1 | 0 |
| G | H | E | B | D | F | C | A | 0 | 0 | 1 | 0 | H | C | E | B | A | D | G | F | 0 | 1 | 0 | 1 |
| G | H | E | C | D | A | B | F | 0 | 0 | 1 | 0 | H | C | E | G | A | F | B | D | 0 | 1 | 0 | 0 |
| G | H | E | C | D | A | B | F | 0 | 0 | 0 | 1 | H | C | F | G | D | E | B | A | 0 | 0 | 1 | 0 |
| H | A | B | E | D | G | C | F | 0 | 1 | 1 | 0 | H | C | G | A | B | D | E | F | 0 | 0 | 0 | 1 |
| H | A | B | E | D | G | C | F | 0 | 1 | 0 | 1 | H | C | G | A | B | D | E | F | 0 | 1 | 0 | 1 |
| H | A | C | D | E | G | B | F | 0 | 1 | 1 | 0 | H | C | G | B | F | A | D | E | 0 | 1 | 0 | 0 |
| H | A | C | D | E | G | B | F | 0 | 1 | 0 | 1 | H | C | G | F | B | E | D | A | 0 | 0 | 0 | 1 |
| H | A | D | C | B | G | E | F | 0 | 1 | 1 | 0 | H | D | A | G | B | C | E | F | 0 | 0 | 1 | 0 |
| H | A | D | C | B | G | E | F | 0 | 1 | 0 | 1 | H | D | A | G | B | C | E | F | 0 | 1 | 1 | 0 |
| H | A | E | B | C | G | D | F | 0 | 1 | 1 | 0 | H | D | B | E | A | C | G | F | 0 | 0 | 1 | 0 |
| H | A | E | B | C | G | D | F | 0 | 1 | 0 | 1 | H | D | B | E | A | C | G | F | 0 | 1 | 0 | 1 |

TABLE 24-continued

LIST (10) OF CONTROL INFORMATION IDENTIFICATION BIT ARRAY AND PARITY SELECTION CONDITION

| BIT ARRAY 7 | | | | | | | | CONDITION FORMULA 10 | | | |
|---|---|---|---|---|---|---|---|---|---|---|---|
| d1 | d2 | d3 | d4 | p1 | p2 | p3 | p4 | d1 | d2 | d3 | d4 |
| H | F | E | G | B | C | A | D | 0 | 1 | 0 | 0 |
| H | F | G | E | A | C | B | D | 0 | 1 | 0 | 0 |
| H | G | B | E | C | A | D | F | 0 | 0 | 1 | 0 |
| H | G | B | E | C | A | D | F | 0 | 0 | 0 | 1 |
| H | G | C | D | B | A | E | F | 0 | 0 | 1 | 0 |
| H | G | C | D | B | A | E | F | 0 | 0 | 0 | 1 |
| H | G | D | B | E | F | C | A | 0 | 0 | 1 | 0 |
| H | G | D | C | E | A | B | F | 0 | 0 | 1 | 0 |
| H | G | D | C | E | A | B | F | 0 | 0 | 0 | 1 |
| H | G | E | B | D | A | C | F | 0 | 0 | 1 | 0 |
| H | G | E | B | D | A | C | F | 0 | 0 | 0 | 1 |
| H | G | E | C | D | F | B | A | 0 | 0 | 1 | 0 |

BIT LOCATION A TO H INDICATES LOCATIONS OF OCTET BIT IN 8B/10B CODE.

Operation at the receiving node is the same as the operation which is described in the first embodiment except the control information encoding rules. The control information encoding rules in the third embodiment according to the present invention is explained as follows.

Here, each of bit d1' to d4' in the control information identification and each of bit p1' to p4' in the control information identification parity are separated from the control information identification code according to the control information identification bit array as shown as follows (Step S241). Here, bit location A to H indicate locations of octet bit in the 8B/10B code.

| d1': bit location A | d2': bit location B | d3': bit location C |
|---|---|---|
| d4': bit location D | p1': bit location E | p2': bit location G |
| p3': bit location H | p4': bit location F | |

Next, parity check value are determined by using the control information identification containing bit d1' to d4' and the control information identification parity containing bit p1' to p4' according to the following formula (Step S243).

Parity Check Value=(p1' XOR d1' XOR d2' XOR d3')+(p2' XOR d2' XOR d3' XOR d4')+(p3' XOR d1' XOR d2' XOR d4')+P Here, P is a formula which depends on the parity formula selecting condition 10 (d1, d2, d3, d4)=(x1, x2, x3, x4). Here, P can be represented by following formula.

$P=(p4' \cdot (D1' \cdot D2' \cdot D3' \cdot D4'))+(\sim(D1' \cdot D2' \cdot D3' \cdot D4')) \cdot (p4'$ XOR $D1'$ XOR $D3'$ XOR $D4')$ "A·B" indicates "the logical product of A and B"
"A XOR B" indicates "the exclusive OR of A and B".
"~A" indicates "the logical negation of A".

At this time, Di (i=1, 2, 3, 4) becomes di when xi' is "1". Di (i=1, 2, 3, 4) becomes (~di') when xi' is "0 (zero)". Under condition such as (d1, d2, d3, d4)=(1, 0, 1, 1) according to the present embodiment, P is determined as follows.

$P=(p4' \cdot (d1' \cdot (\sim d2') \cdot d3' \cdot d4'))+(\sim(d1' \cdot (\sim d2') \cdot d3' \cdot d4')) \cdot (p4'$ XOR $d1'$ XOR $d3'$ XOR $d4')$ "A·B" indicates "the logical product of A and B"
"A XOR B" indicates "the exclusive OR of A and B".
"~A" indicates "the logical negation of A".

If a parity check value is not 0 (zero), an error process is performed as follows. The error process advances a control information error counter and nullifies the received control information identification code and the control data code (Steps S244, S245).

By the control information encoding rule as explained above, an encoding method in which the minimum Hamming distance of the 8B code and the minimum Hamming distance of the 10B code is 3 can be realized. By using the encoding method, it is possible to detect at least two errors in the control information identification code which occur in the transmission interval in which the 10B code is used. Also, it is possible to detect one or two errors which occur in the transmission interval in which a code is used in which 8B code or each bit of 8B code corresponds one-to-one.

Next, an encoding method of the control information in which formulae such as (minimum) Hamming distance d of the 8B code=4, (minimum) Hamming distance D of the 10B code=4 are satisfied are explained as follows as a third embodiment of the present invention.

Operations in the transmission node is the same as the operation disclosed in the first and the second embodiment except for the control information encoding rule 3. The control information encoding rule is explained as follows.

As a result of an entire search in the communication system, there are not more than twelve control information identification codes having 8 bit length in which formulae such as (minimum) Hamming distance d of the 8B code=4, and (minimum) hamming distance D of the 10B code=4 are satisfied. Therefore, at first, in the control information encoding rule 3, eleven control information identification codes having 8 bit length in which formulae such as (minimum) Hamming distance d of the 8B code=4, and (minimum) Hamming distance D of the 10B code=4 are satisfied are searched by performing a complete search. The control information encoding rule 3 is characterized in that a control information identification having 4 bit length and eleven or fewer symbols are allocated to any one of the 42 parts of control information identification codes which are obtained as a result of the entire search.

An example of the allocation is shown as follows.

First, bit p1 to p4 of the control information identification parity are calculated from each of the bit d1 to d4 of the control information identification according to the following formulae and are given (Step S131).

$p1 = d1 \cdot d2 \cdot d3 \cdot (\sim d4) XOR (\sim d1) \cdot d2 \cdot (\sim d3) XOR (\sim d1) \cdot (\sim d2) \cdot d3$ $p2 = (\sim d1) \cdot d2 \cdot (\sim d3) \cdot (\sim d4) XOR\ d1 \cdot (\sim d2) \cdot d3 \cdot (\sim d4) XOR\ d1 \cdot d2 \cdot (\sim d3) \cdot d4\ XOR (\sim d1) \cdot (\sim d2) \cdot d4$ $p3 = d1 \cdot d2 \cdot (\sim d3) \cdot (\sim 4d) XOR (\sim d1) \cdot (\sim d2) \cdot d3 \cdot (\sim d4)\ XOR \cdot d1 \cdot (\sim d2) \cdot d3 \cdot d4\ XOR (\sim d1) \cdot (\sim d3) \cdot d4$ $p4 = (\sim d1) \cdot (\sim d2) \cdot (\sim d3) \cdot d4\ XOR\ d2 \cdot (\sim d3) \cdot (\sim d4) XOR (\sim d2) \cdot d3 \cdot (\sim d4)$ In the formulae, "A·B" indicates "the logical product of A and B"

"A XOR B" indicates "the exclusive OR of A and B".

"~A" indicates "the logical negation of A".

Here, a control information identification having 5 symbols in which formulae such as (d1, d2, d3, d4)=(1, 0, 0, 0), (0, 1, 1, 0), (1, 0, 0, 1), (0, 1, 1, 1), (1, 1, 1, 1) are satisfied is not used. The rest of the eleven symbols are used.

Here, each of bit d1 to d4 in the control information identification and each of bit p1 to p4 in the control information identification parity are disposed according to the following control information identification bit array so as to obtain the control information identification code (Step S132). Here, bit location A to H indicate locations of octet bit in the 8B/10B code.

| | | |
|---|---|---|
| d1: bit location A | d2: bit location B | d3: bit location C |
| d4: bit location D | p1: bit location E | p2: bit location F |
| p3: bit location G | p4: bit location H | |

By the control information encoding rules, eleven parts of control information identification code are obtained which are indicated by the surrounded area in TABLE 25 by a thick line. Here, bit locations A to H which are described as follows indicate locations of octet bit in 8B/10B code. The control information identification parity and the control information identification bit array are not limited to the above-mentioned parity and array. When a control information identification having eleven symbols is selected so as to correspond to the control information identification codes 1 to 42 which are shown in TABLES 25 to 28 in one-to-one relationship, the control information identification having eleven symbols has the same error detecting capacity for 10B code as in the case of the above-mentioned array.

TABLE 25

LIST (1) OF CONTROL INFORMATION IDENTIFICATION CODE IN WHICH FORMULAE SUCH AS d = 4 and D = 4 ARE SATISFIED.

| CONTROL INFORMATION IDENTIFICATION CODE 1 | | | | | | | | CONTROL INFORMATION IDENTIFICATION CODE 2 | | | | | | | | CONTROL INFORMATION IDENTIFICATION CODE 3 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 1 | 1 | 0 | 1 | 0 | 1 | 0 | 0 | 1 | 1 | 0 | 1 | 0 | 1 | 0 | 0 | 1 | 0 | 1 | 1 |
| 1 | 1 | 0 | 0 | 0 | 0 | 1 | 1 | 1 | 1 | 0 | 0 | 0 | 0 | 1 | 1 | 1 | 1 | 0 | 0 | 0 | 1 | 0 | 1 |
| 0 | 0 | 1 | 0 | 1 | 0 | 1 | 1 | 0 | 0 | 1 | 0 | 1 | 0 | 1 | 1 | 0 | 0 | 1 | 0 | 1 | 1 | 0 | 1 |
| 1 | 0 | 1 | 0 | 1 | 0 | 0 | 1 | 1 | 0 | 1 | 0 | 1 | 0 | 0 | 1 | 1 | 0 | 1 | 0 | 0 | 0 | 1 | 1 |
| 1 | 1 | 1 | 0 | 1 | 0 | 0 | 0 | 1 | 1 | 1 | 0 | 1 | 0 | 0 | 0 | 1 | 1 | 1 | 0 | 1 | 0 | 0 | 0 |
| 0 | 0 | 0 | 1 | 0 | 1 | 1 | 1 | 0 | 1 | 0 | 1 | 1 | 0 | 1 | 0 | 0 | 0 | 0 | 1 | 0 | 1 | 1 | 1 |
| 0 | 1 | 0 | 1 | 1 | 0 | 1 | 0 | 1 | 1 | 0 | 1 | 0 | 1 | 0 | 0 | 0 | 1 | 0 | 1 | 1 | 1 | 0 | 0 |
| 1 | 1 | 0 | 1 | 0 | 1 | 0 | 0 | 0 | 0 | 1 | 1 | 1 | 1 | 0 | 0 | 1 | 1 | 0 | 1 | 0 | 0 | 1 | 0 |
| 0 | 0 | 1 | 1 | 1 | 1 | 0 | 0 | 1 | 0 | 1 | 1 | 0 | 0 | 1 | 0 | 0 | 0 | 1 | 1 | 1 | 0 | 1 | 0 |
| 1 | 0 | 1 | 1 | 0 | 0 | 1 | 0 | 1 | 1 | 1 | 1 | 1 | 1 | 1 | 1 | 1 | 0 | 1 | 1 | 0 | 1 | 0 | 0 |

| CONTROL INFORMATION IDENTIFICATION CODE 4 | | | | | | | | CONTROL INFORMATION IDENTIFICATION CODE 5 | | | | | | | | CONTROL INFORMATION IDENTIFICATION CODE 6 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 1 | 0 | 1 | 1 | 1 | 0 | 0 | 0 | 0 | 1 | 1 | 1 | 1 | 0 | 0 | 0 | 0 | 1 | 1 | 1 |
| 1 | 1 | 0 | 0 | 0 | 1 | 0 | 1 | 0 | 1 | 0 | 0 | 1 | 1 | 0 | 1 | 0 | 1 | 0 | 0 | 1 | 0 | 1 | 1 |
| 0 | 0 | 1 | 0 | 1 | 1 | 0 | 1 | 1 | 1 | 0 | 0 | 1 | 0 | 1 | 0 | 1 | 1 | 0 | 0 | 1 | 1 | 0 | 0 |
| 1 | 0 | 1 | 0 | 0 | 0 | 1 | 1 | 0 | 0 | 1 | 0 | 1 | 0 | 1 | 1 | 0 | 0 | 1 | 0 | 1 | 1 | 0 | 1 |
| 1 | 1 | 1 | 0 | 1 | 0 | 0 | 0 | 1 | 0 | 1 | 0 | 1 | 1 | 0 | 0 | 1 | 0 | 1 | 0 | 1 | 0 | 1 | 0 |
| 0 | 1 | 0 | 1 | 1 | 1 | 0 | 0 | 0 | 0 | 1 | 0 | 1 | 0 | 0 | 1 | 1 | 0 | 1 | 0 | 1 | 0 | 0 | 1 |
| 1 | 1 | 0 | 1 | 0 | 0 | 1 | 0 | 1 | 1 | 0 | 1 | 0 | 1 | 0 | 0 | 1 | 1 | 0 | 1 | 0 | 0 | 1 | 0 |
| 0 | 0 | 1 | 1 | 1 | 0 | 1 | 0 | 0 | 0 | 1 | 1 | 0 | 1 | 0 | 1 | 0 | 0 | 1 | 1 | 0 | 0 | 1 | 1 |
| 1 | 0 | 1 | 1 | 0 | 1 | 0 | 0 | 1 | 0 | 1 | 1 | 0 | 0 | 1 | 0 | 1 | 0 | 1 | 1 | 0 | 1 | 0 | 0 |
| 1 | 1 | 1 | 1 | 1 | 1 | 1 | 1 | 0 | 1 | 1 | 1 | 1 | 0 | 0 | 0 | 0 | 1 | 1 | 1 | 1 | 0 | 0 | 0 |

| CONTROL INFORMATION IDENTIFICATION CODE 7 | | | | | | | | CONTROL INFORMATION IDENTIFICATION CODE 8 | | | | | | | | CONTROL INFORMATION IDENTIFICATION CODE 9 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 0 | 1 | 1 | 1 | 0 | 0 | 1 | 0 | 0 | 1 | 1 | 0 | 1 | 1 | 0 | 0 | 0 | 1 | 1 | 1 | 0 |
| 0 | 1 | 0 | 0 | 1 | 1 | 0 | 1 | 1 | 1 | 0 | 0 | 0 | 0 | 1 | 1 | 0 | 1 | 0 | 0 | 1 | 1 | 0 | 1 |
| 1 | 1 | 0 | 0 | 0 | 0 | 1 | 1 | 0 | 0 | 1 | 0 | 1 | 0 | 1 | 1 | 1 | 1 | 0 | 0 | 0 | 0 | 1 | 1 |
| 0 | 0 | 1 | 0 | 1 | 0 | 1 | 1 | 1 | 0 | 1 | 0 | 0 | 1 | 0 | 1 | 0 | 0 | 1 | 0 | 1 | 0 | 1 | 1 |

TABLE 25-continued

LIST (1) OF CONTROL INFORMATION IDENTIFICATION CODE IN WHICH FORMULAE SUCH AS d = 4 and D = 4 ARE SATISFIED.

| 1 | 0 | 1 | 0 | 0 | 1 | 0 | 1 | 0 | 1 | 1 | 0 | 0 | 1 | 1 | 0 | 1 | 0 | 1 | 0 | 0 | 1 | 0 | 1 |
|---|---|---|---|---|---|---|---|---|---|---|---|---|---|---|---|---|---|---|---|---|---|---|---|
| 0 | 1 | 1 | 0 | 0 | 1 | 1 | 0 | 1 | 1 | 1 | 0 | 1 | 0 | 0 | 0 | 1 | 1 | 1 | 0 | 1 | 0 | 0 | 0 |
| 1 | 1 | 1 | 0 | 1 | 0 | 0 | 0 | 0 | 1 | 0 | 1 | 1 | 0 | 1 | 0 | 0 | 0 | 0 | 1 | 0 | 1 | 1 | 1 |
| 0 | 1 | 0 | 1 | 1 | 0 | 1 | 0 | 1 | 1 | 0 | 1 | 0 | 1 | 0 | 0 | 0 | 1 | 0 | 1 | 1 | 0 | 1 | 0 |
| 1 | 1 | 0 | 1 | 0 | 1 | 0 | 0 | 0 | 0 | 1 | 1 | 1 | 1 | 0 | 0 | 1 | 1 | 0 | 1 | 0 | 1 | 0 | 0 |
| 0 | 0 | 1 | 1 | 1 | 1 | 0 | 0 | 1 | 0 | 1 | 1 | 0 | 0 | 1 | 0 | 0 | 0 | 1 | 1 | 1 | 1 | 0 | 0 |
| 1 | 0 | 1 | 1 | 0 | 0 | 1 | 0 | 1 | 1 | 1 | 1 | 1 | 1 | 1 | 1 | 0 | 1 | 1 | 0 | 0 | 1 | 0 |   |

| CONTROL INFORMATION IDENTIFICATION CODE 10 | | | | | | | | CONTROL INFORMATION IDENTIFICATION CODE 11 | | | | | | | | CONTROL INFORMATION IDENTIFICATION CODE 12 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 0 | 1 | 1 | 0 | 1 | 1 | 0 | 0 | 0 | 1 | 1 | 0 | 1 | 1 | 0 | 0 | 0 | 1 | 1 | 0 | 1 |
| 0 | 1 | 0 | 0 | 1 | 1 | 1 | 0 | 0 | 1 | 0 | 0 | 1 | 1 | 1 | 0 | 0 | 1 | 0 | 0 | 1 | 1 | 1 | 0 |
| 1 | 1 | 0 | 0 | 0 | 0 | 1 | 1 | 1 | 1 | 0 | 0 | 0 | 1 | 1 | 1 | 1 | 0 | 0 | 0 | 0 | 0 | 1 | 1 |
| 0 | 0 | 1 | 0 | 1 | 0 | 1 | 1 | 0 | 0 | 1 | 0 | 1 | 1 | 1 | 0 | 0 | 0 | 1 | 0 | 1 | 0 | 1 | 1 |
| 1 | 0 | 1 | 0 | 0 | 1 | 1 | 0 | 0 | 1 | 1 | 0 | 0 | 1 | 0 | 1 | 0 | 1 | 1 | 0 | 0 | 1 | 0 | 1 |
| 0 | 1 | 1 | 0 | 0 | 1 | 0 | 1 | 1 | 1 | 1 | 0 | 1 | 0 | 0 | 0 | 1 | 1 | 1 | 0 | 1 | 0 | 0 | 0 |
| 1 | 1 | 1 | 0 | 1 | 0 | 0 | 0 | 0 | 0 | 0 | 1 | 0 | 1 | 1 | 1 | 1 | 0 | 0 | 1 | 1 | 0 | 1 | 0 |
| 1 | 0 | 0 | 1 | 1 | 0 | 1 | 0 | 1 | 0 | 0 | 1 | 1 | 0 | 1 | 0 | 1 | 1 | 0 | 1 | 0 | 1 | 0 | 0 |
| 1 | 1 | 0 | 1 | 0 | 1 | 0 | 0 | 1 | 1 | 0 | 1 | 0 | 1 | 0 | 0 | 0 | 0 | 1 | 1 | 1 | 1 | 0 | 0 |
| 0 | 0 | 1 | 1 | 1 | 1 | 0 | 0 | 0 | 0 | 1 | 1 | 1 | 1 | 0 | 0 | 0 | 1 | 1 | 1 | 0 | 0 | 1 | 0 |
| 0 | 1 | 1 | 1 | 0 | 0 | 1 | 0 | 0 | 1 | 1 | 1 | 0 | 0 | 1 | 0 | 1 | 1 | 1 | 1 | 1 | 1 | 1 | 1 |

BIT LOCATION A TO H INDICATES LOCATIONS OF OCTET BIT IN 8B/10B CODE.

TABLE 26

LIST (2) OF CONTROL INFORMATION IDENTIFICATION CODE IN WHICH FORMULAE SUCH AS d = 4 and D = 4 ARE SATISFIED.

| CONTROL INFORMATION IDENTIFICATION CODE 13 | | | | | | | | CONTROL INFORMATION IDENTIFICATION CODE 14 | | | | | | | |
|---|---|---|---|---|---|---|---|---|---|---|---|---|---|---|---|
| A | B | C | D | E | F | G | H | A | B | C | D | E | F | G | H |
| 1 | 0 | 0 | 0 | 1 | 1 | 1 | 0 | 0 | 1 | 0 | 0 | 1 | 0 | 1 | 1 |
| 0 | 1 | 0 | 0 | 1 | 0 | 1 | 1 | 1 | 1 | 0 | 0 | 0 | 1 | 0 | 1 |
| 1 | 1 | 0 | 0 | 0 | 1 | 0 | 1 | 0 | 0 | 1 | 0 | 1 | 1 | 0 | 1 |
| 0 | 0 | 1 | 0 | 1 | 1 | 0 | 1 | 1 | 0 | 1 | 0 | 0 | 0 | 1 | 1 |
| 1 | 0 | 1 | 0 | 0 | 0 | 1 | 1 | 0 | 1 | 1 | 0 | 0 | 1 | 1 | 0 |
| 0 | 1 | 1 | 0 | 0 | 1 | 1 | 0 | 1 | 1 | 1 | 0 | 1 | 0 | 0 | 0 |
| 1 | 1 | 1 | 0 | 1 | 0 | 0 | 0 | 0 | 1 | 0 | 1 | 1 | 1 | 0 | 0 |
| 0 | 1 | 0 | 1 | 1 | 1 | 0 | 0 | 1 | 1 | 0 | 1 | 0 | 0 | 1 | 0 |
| 1 | 1 | 0 | 1 | 0 | 0 | 0 | 1 | 0 | 0 | 1 | 1 | 0 | 1 | 0 | 0 |
| 0 | 0 | 1 | 1 | 1 | 0 | 1 | 0 | 1 | 0 | 1 | 1 | 0 | 1 | 0 | 0 |
| 1 | 0 | 1 | 1 | 0 | 1 | 0 | 0 | 1 | 1 | 1 | 1 | 1 | 1 | 1 | 1 |

| CONTROL INFORMATION IDENTIFICATION CODE 15 | | | | | | | | CONTROL INFORMATION IDENTIFICATION CODE 16 | | | | | | | |
|---|---|---|---|---|---|---|---|---|---|---|---|---|---|---|---|
| A | B | C | D | E | F | G | H | A | B | C | D | E | F | G | H |
| 1 | 0 | 0 | 0 | 1 | 1 | 1 | 0 | 1 | 0 | 0 | 0 | 1 | 1 | 0 | 1 |
| 0 | 1 | 0 | 0 | 1 | 0 | 1 | 1 | 0 | 1 | 0 | 0 | 1 | 0 | 1 | 1 |
| 1 | 1 | 0 | 0 | 0 | 1 | 0 | 1 | 1 | 1 | 0 | 0 | 0 | 1 | 1 | 0 |
| 0 | 0 | 1 | 0 | 1 | 1 | 0 | 1 | 0 | 0 | 1 | 0 | 1 | 1 | 1 | 0 |
| 1 | 0 | 1 | 0 | 0 | 0 | 1 | 1 | 1 | 0 | 1 | 0 | 0 | 1 | 0 | 1 |
| 1 | 1 | 1 | 0 | 1 | 0 | 0 | 0 | 0 | 1 | 1 | 0 | 0 | 1 | 0 | 1 |
| 0 | 0 | 0 | 1 | 0 | 1 | 1 | 1 | 1 | 1 | 1 | 0 | 1 | 0 | 0 | 0 |
| 0 | 1 | 0 | 1 | 1 | 1 | 0 | 0 | 1 | 0 | 0 | 1 | 1 | 0 | 1 | 0 |
| 1 | 1 | 0 | 1 | 0 | 0 | 1 | 0 | 0 | 1 | 0 | 1 | 1 | 0 | 0 | 0 |
| 0 | 0 | 1 | 1 | 0 | 1 | 0 | 0 | 1 | 0 | 1 | 1 | 0 | 1 | 0 | 0 |
| 0 | 1 | 1 | 0 | 1 | 0 | 0 | 0 | 1 | 1 | 1 | 0 | 0 | 1 | 0 | 0 |

TABLE 26-continued

LIST (2) OF CONTROL INFORMATION IDENTIFICATION CODE IN WHICH FORMULAE SUCH AS d = 4 and D = 4 ARE SATISFIED.

| CONTROL INFORMATION IDENTIFICATION CODE 17 | | | | | | | | CONTROL INFORMATION IDENTIFICATION CODE 18 | | | | | | |
|---|---|---|---|---|---|---|---|---|---|---|---|---|---|---|
| A | B | C | D | E | F | G | H | A | B | C | D | E | F | G | H |
| 1 | 0 | 0 | 0 | 1 | 1 | 0 | 1 | 1 | 0 | 0 | 0 | 1 | 1 | 0 | 1 |
| 0 | 1 | 0 | 0 | 1 | 0 | 1 | 1 | 0 | 1 | 0 | 0 | 1 | 0 | 1 | 1 |
| 1 | 1 | 0 | 0 | 0 | 1 | 1 | 0 | 0 | 0 | 1 | 0 | 1 | 1 | 1 | 0 |
| 1 | 0 | 1 | 0 | 0 | 1 | 1 | 1 | 1 | 0 | 1 | 0 | 0 | 0 | 1 | 1 |
| 0 | 1 | 1 | 0 | 1 | 0 | 0 | 1 | 0 | 1 | 1 | 0 | 0 | 1 | 0 | 1 |
| 1 | 1 | 1 | 0 | 1 | 0 | 0 | 0 | 1 | 1 | 1 | 0 | 1 | 0 | 0 | 0 |
| 1 | 0 | 0 | 1 | 1 | 0 | 1 | 0 | 0 | 0 | 0 | 1 | 0 | 1 | 1 | 1 |
| 0 | 1 | 0 | 1 | 1 | 1 | 0 | 0 | 1 | 0 | 0 | 1 | 1 | 0 | 1 | 0 |
| 1 | 0 | 1 | 1 | 0 | 1 | 0 | 0 | 0 | 1 | 0 | 1 | 1 | 1 | 0 | 0 |
| 0 | 1 | 1 | 1 | 0 | 0 | 1 | 0 | 1 | 0 | 1 | 1 | 0 | 1 | 0 | 0 |
| 1 | 1 | 1 | 1 | 1 | 1 | 1 | 1 | 0 | 1 | 1 | 1 | 0 | 0 | 1 | 0 |

| CONTROL INFORMATION IDENTIFICATION CODE 19 | | | | | | | | CONTROL INFORMATION IDENTIFICATION CODE 20 | | | | | | |
|---|---|---|---|---|---|---|---|---|---|---|---|---|---|---|
| A | B | C | D | E | F | G | H | A | B | C | D | E | F | G | H |
| 1 | 0 | 0 | 0 | 1 | 0 | 1 | 1 | 1 | 0 | 0 | 0 | 1 | 0 | 1 | 1 |
| 0 | 1 | 0 | 0 | 1 | 1 | 1 | 0 | 0 | 1 | 0 | 0 | 1 | 1 | 1 | 0 |
| 1 | 1 | 0 | 0 | 0 | 1 | 0 | 1 | 1 | 1 | 0 | 0 | 0 | 1 | 0 | 1 |
| 0 | 0 | 1 | 0 | 1 | 1 | 0 | 1 | 0 | 0 | 1 | 0 | 1 | 1 | 0 | 1 |
| 1 | 0 | 1 | 0 | 1 | 1 | 1 | 0 | 0 | 1 | 1 | 0 | 0 | 0 | 1 | 1 |
| 0 | 1 | 1 | 0 | 0 | 1 | 1 | 1 | 1 | 1 | 1 | 0 | 1 | 0 | 0 | 0 |
| 1 | 1 | 1 | 0 | 1 | 0 | 0 | 0 | 0 | 0 | 0 | 1 | 0 | 1 | 1 | 1 |
| 1 | 0 | 0 | 1 | 1 | 1 | 0 | 0 | 1 | 0 | 0 | 1 | 1 | 1 | 0 | 0 |
| 1 | 1 | 0 | 1 | 0 | 0 | 1 | 0 | 1 | 1 | 0 | 1 | 0 | 0 | 1 | 0 |
| 0 | 1 | 1 | 1 | 0 | 1 | 0 | 0 | 0 | 1 | 1 | 1 | 0 | 1 | 0 | 0 |
| 0 | 1 | 1 | 1 | 0 | 1 | 0 | 0 | 0 | 1 | 1 | 1 | 0 | 1 | 0 | 0 |

| CONTROL INFORMATION IDENTIFICATION CODE 21 | | | | | | | | CONTROL INFORMATION IDENTIFICATION CODE 22 | | | | | | |
|---|---|---|---|---|---|---|---|---|---|---|---|---|---|---|
| A | B | C | D | E | F | G | H | A | B | C | D | E | F | G | H |
| 1 | 0 | 0 | 0 | 1 | 0 | 1 | 1 | 1 | 0 | 0 | 0 | 1 | 0 | 1 | 1 |
| 0 | 1 | 0 | 0 | 1 | 1 | 1 | 0 | 0 | 1 | 0 | 0 | 1 | 1 | 0 | 1 |
| 1 | 1 | 0 | 0 | 0 | 1 | 0 | 1 | 1 | 1 | 0 | 0 | 0 | 1 | 1 | 0 |
| 0 | 1 | 1 | 0 | 0 | 1 | 1 | 1 | 1 | 0 | 1 | 0 | 0 | 1 | 0 | 1 |
| 1 | 1 | 1 | 0 | 1 | 0 | 0 | 0 | 0 | 1 | 1 | 0 | 0 | 0 | 1 | 1 |
| 1 | 0 | 0 | 1 | 1 | 1 | 0 | 0 | 1 | 1 | 1 | 0 | 1 | 0 | 0 | 0 |
| 1 | 1 | 0 | 1 | 0 | 0 | 1 | 0 | 1 | 0 | 0 | 1 | 1 | 1 | 0 | 0 |
| 0 | 0 | 1 | 1 | 1 | 0 | 1 | 0 | 0 | 1 | 0 | 1 | 1 | 0 | 1 | 0 |
| 0 | 1 | 1 | 1 | 0 | 1 | 0 | 0 | 1 | 0 | 1 | 1 | 0 | 0 | 1 | 0 |
| 1 | 1 | 1 | 1 | 1 | 1 | 1 | 1 | 0 | 1 | 1 | 1 | 0 | 1 | 0 | 0 |

| CONTROL INFORMATION IDENTIFICATION CODE 23 | | | | | | | | CONTROL INFORMATION IDENTIFICATION CODE 24 | | | | | | |
|---|---|---|---|---|---|---|---|---|---|---|---|---|---|---|
| A | B | C | D | E | F | G | H | A | B | C | D | E | F | G | H |
| 1 | 0 | 0 | 0 | 1 | 0 | 1 | 1 | 1 | 0 | 0 | 0 | 1 | 0 | 1 | 1 |
| 0 | 1 | 0 | 0 | 1 | 1 | 0 | 1 | 0 | 1 | 0 | 0 | 1 | 1 | 0 | 1 |
| 1 | 1 | 0 | 0 | 0 | 1 | 1 | 0 | 0 | 0 | 1 | 0 | 1 | 1 | 1 | 0 |
| 0 | 1 | 1 | 0 | 0 | 0 | 1 | 1 | 0 | 1 | 1 | 0 | 0 | 0 | 1 | 1 |
| 1 | 1 | 1 | 0 | 1 | 0 | 0 | 0 | 1 | 1 | 1 | 0 | 1 | 0 | 0 | 0 |
| 1 | 0 | 0 | 1 | 1 | 1 | 0 | 0 | 0 | 0 | 0 | 1 | 0 | 1 | 1 | 1 |
| 0 | 1 | 0 | 1 | 1 | 0 | 1 | 0 | 1 | 0 | 0 | 1 | 1 | 0 | 1 | 0 |
| 1 | 0 | 1 | 1 | 0 | 0 | 1 | 0 | 0 | 1 | 0 | 1 | 1 | 0 | 1 | 0 |
| 0 | 1 | 1 | 1 | 0 | 1 | 0 | 0 | 1 | 0 | 1 | 1 | 0 | 0 | 1 | 0 |
| 1 | 1 | 1 | 1 | 1 | 1 | 1 | 1 | 0 | 1 | 1 | 1 | 0 | 1 | 0 | 0 |

BIT LOCATION A TO H INDICATES LOCATIONS OF OCTET BIT IN 8B/10B CODE.

TABLE 27

LIST (3) OF CONTROL INFORMATION IDENTIFICATION CODE IN WHICH FORMULAE SUCH AS d = 4 and D = 4 ARE SATISFIED.

| CONTROL INFORMATION IDENTIFICATION CODE 25 | | | | | | | | CONTROL INFORMATION IDENTIFICATION CODE 26 | | | | | | | | CONTROL INFORMATION IDENTIFICATION CODE 27 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 0 | 1 | 0 | 0 | 1 | 0 | 1 | 0 | 0 | 1 | 0 | 0 | 1 | 0 | 1 | 0 | 1 | 0 | 0 | 0 | 1 | 0 | 1 | 0 |
| 1 | 1 | 0 | 0 | 0 | 1 | 0 | 0 | 1 | 1 | 0 | 0 | 0 | 1 | 0 | 0 | 1 | 1 | 0 | 0 | 0 | 1 | 0 | 0 |
| 0 | 0 | 1 | 0 | 1 | 1 | 0 | 0 | 0 | 0 | 1 | 0 | 1 | 1 | 0 | 0 | 0 | 0 | 1 | 0 | 1 | 1 | 0 | 0 |
| 1 | 0 | 1 | 0 | 0 | 0 | 1 | 0 | 1 | 0 | 1 | 0 | 0 | 0 | 1 | 0 | 1 | 1 | 0 | 0 | 0 | 0 | 1 | 0 |
| 1 | 1 | 1 | 0 | 1 | 0 | 0 | 1 | 1 | 1 | 1 | 0 | 1 | 1 | 1 | 1 | 1 | 1 | 1 | 0 | 1 | 0 | 0 | 1 |
| 1 | 0 | 0 | 1 | 1 | 1 | 1 | 0 | 1 | 0 | 0 | 1 | 1 | 1 | 1 | 0 | 1 | 0 | 0 | 1 | 1 | 1 | 0 | 1 |
| 0 | 1 | 0 | 1 | 1 | 1 | 0 | 1 | 0 | 1 | 0 | 1 | 1 | 1 | 0 | 1 | 0 | 1 | 0 | 1 | 1 | 1 | 1 | 0 |
| 1 | 1 | 0 | 1 | 0 | 0 | 1 | 1 | 1 | 1 | 0 | 1 | 0 | 0 | 1 | 1 | 1 | 1 | 0 | 1 | 0 | 0 | 1 | 1 |
| 0 | 0 | 1 | 1 | 1 | 0 | 1 | 1 | 0 | 0 | 1 | 1 | 1 | 0 | 1 | 1 | 0 | 0 | 1 | 1 | 1 | 0 | 1 | 1 |
| 1 | 0 | 1 | 1 | 0 | 1 | 0 | 1 | 1 | 0 | 1 | 1 | 0 | 1 | 0 | 1 | 1 | 0 | 1 | 1 | 0 | 1 | 1 | 0 |
| 0 | 1 | 1 | 1 | 0 | 1 | 1 | 0 | 0 | 1 | 1 | 1 | 0 | 1 | 1 | 0 | 0 | 1 | 1 | 1 | 0 | 1 | 0 | 1 |

| CONTROL INFORMATION IDENTIFICATION CODE 28 | | | | | | | | CONTROL INFORMATION IDENTIFICATION CODE 29 | | | | | | | | CONTROL INFORMATION IDENTIFICATION CODE 30 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 0 | 1 | 0 | 1 | 0 | 0 | 1 | 0 | 0 | 1 | 1 | 0 | 0 | 0 | 1 | 0 | 0 | 1 | 1 | 0 | 0 |
| 1 | 1 | 0 | 0 | 0 | 1 | 0 | 0 | 1 | 1 | 0 | 0 | 0 | 0 | 1 | 0 | 1 | 1 | 0 | 0 | 0 | 0 | 1 | 0 |
| 0 | 0 | 1 | 0 | 1 | 1 | 0 | 0 | 0 | 0 | 1 | 0 | 1 | 0 | 1 | 0 | 0 | 0 | 1 | 0 | 1 | 0 | 1 | 0 |
| 0 | 1 | 1 | 0 | 0 | 0 | 1 | 0 | 1 | 0 | 1 | 0 | 0 | 1 | 0 | 0 | 1 | 0 | 1 | 0 | 0 | 1 | 0 | 0 |
| 1 | 1 | 1 | 0 | 1 | 1 | 1 | 1 | 1 | 1 | 1 | 0 | 1 | 0 | 0 | 1 | 1 | 1 | 1 | 0 | 1 | 1 | 1 | 1 |
| 1 | 0 | 0 | 1 | 1 | 1 | 0 | 1 | 1 | 0 | 0 | 1 | 1 | 1 | 1 | 0 | 1 | 0 | 0 | 1 | 1 | 1 | 1 | 0 |
| 0 | 1 | 0 | 1 | 1 | 1 | 1 | 0 | 0 | 1 | 0 | 1 | 1 | 0 | 1 | 1 | 0 | 1 | 0 | 1 | 1 | 0 | 1 | 1 |
| 1 | 1 | 0 | 1 | 0 | 0 | 1 | 1 | 1 | 1 | 0 | 1 | 0 | 1 | 0 | 1 | 1 | 1 | 0 | 1 | 0 | 1 | 0 | 1 |
| 0 | 0 | 1 | 1 | 1 | 0 | 1 | 1 | 0 | 0 | 1 | 1 | 1 | 1 | 0 | 1 | 0 | 0 | 1 | 1 | 1 | 1 | 0 | 1 |
| 1 | 0 | 1 | 1 | 0 | 1 | 1 | 0 | 1 | 0 | 1 | 1 | 0 | 0 | 1 | 1 | 1 | 0 | 1 | 1 | 0 | 0 | 1 | 1 |
| 0 | 1 | 1 | 1 | 0 | 1 | 0 | 1 | 0 | 1 | 1 | 1 | 0 | 1 | 1 | 0 | 0 | 1 | 1 | 1 | 0 | 1 | 1 | 0 |

| CONTROL INFORMATION IDENTIFICATION CODE 31 | | | | | | | | CONTROL INFORMATION IDENTIFICATION CODE 32 | | | | | | | | CONTROL INFORMATION IDENTIFICATION CODE 33 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 0 | 1 | 0 | 1 | 0 | 1 | 0 | 0 | 0 | 1 | 0 | 1 | 0 | 1 | 0 | 0 | 0 | 1 | 1 | 0 | 0 |
| 0 | 1 | 0 | 0 | 1 | 1 | 0 | 0 | 0 | 1 | 0 | 0 | 1 | 1 | 0 | 0 | 1 | 1 | 0 | 0 | 0 | 0 | 1 | 0 |
| 1 | 0 | 1 | 0 | 0 | 1 | 0 | 0 | 1 | 0 | 1 | 0 | 0 | 1 | 0 | 0 | 0 | 0 | 1 | 0 | 1 | 0 | 1 | 0 |
| 0 | 1 | 1 | 0 | 0 | 0 | 1 | 0 | 0 | 1 | 1 | 0 | 0 | 0 | 1 | 0 | 0 | 1 | 1 | 0 | 0 | 1 | 0 | 0 |
| 1 | 1 | 1 | 0 | 1 | 0 | 0 | 1 | 1 | 1 | 1 | 0 | 1 | 1 | 1 | 1 | 1 | 1 | 1 | 0 | 1 | 0 | 0 | 1 |
| 1 | 0 | 0 | 1 | 1 | 1 | 0 | 1 | 1 | 0 | 0 | 1 | 1 | 1 | 0 | 1 | 1 | 0 | 0 | 1 | 1 | 0 | 1 | 1 |
| 0 | 1 | 0 | 1 | 0 | 1 | 1 | 1 | 0 | 1 | 0 | 1 | 0 | 1 | 1 | 1 | 0 | 1 | 0 | 1 | 1 | 1 | 1 | 0 |
| 1 | 1 | 0 | 1 | 0 | 1 | 1 | 0 | 1 | 1 | 0 | 1 | 0 | 1 | 1 | 0 | 1 | 1 | 0 | 1 | 0 | 1 | 0 | 1 |
| 0 | 0 | 1 | 1 | 1 | 1 | 0 | 1 | 0 | 0 | 1 | 1 | 1 | 1 | 0 | 1 | 0 | 0 | 1 | 1 | 1 | 1 | 0 | 1 |
| 1 | 0 | 1 | 1 | 0 | 0 | 1 | 1 | 1 | 0 | 1 | 1 | 0 | 0 | 1 | 1 | 1 | 0 | 1 | 1 | 0 | 1 | 1 | 0 |
| 0 | 1 | 1 | 1 | 0 | 1 | 0 | 1 | 0 | 1 | 1 | 1 | 0 | 1 | 0 | 1 | 0 | 1 | 1 | 1 | 0 | 0 | 1 | 1 |

| CONTROL INFORMATION IDENTIFICATION CODE 34 | | | | | | | | CONTROL INFORMATION IDENTIFICATION CODE 35 | | | | | | | | CONTROL INFORMATION IDENTIFICATION CODE 36 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 1 | 1 | 0 | 0 | 0 | 1 | 0 | 0 | 0 | 1 | 1 | 0 | 0 | 1 | 0 | 0 | 0 | 1 | 1 | 0 | 0 |
| 1 | 1 | 0 | 0 | 0 | 0 | 1 | 0 | 0 | 1 | 0 | 0 | 1 | 0 | 1 | 0 | 0 | 1 | 0 | 0 | 1 | 0 | 1 | 0 |
| 0 | 0 | 1 | 0 | 1 | 0 | 1 | 0 | 1 | 0 | 1 | 0 | 0 | 0 | 1 | 0 | 1 | 0 | 1 | 0 | 0 | 0 | 1 | 0 |
| 0 | 1 | 1 | 0 | 0 | 1 | 0 | 0 | 0 | 1 | 1 | 0 | 0 | 1 | 0 | 0 | 0 | 1 | 1 | 0 | 0 | 0 | 1 | 0 |
| 1 | 1 | 1 | 0 | 1 | 1 | 1 | 1 | 1 | 1 | 1 | 0 | 1 | 0 | 1 | 1 | 1 | 1 | 1 | 0 | 1 | 1 | 1 | 1 |
| 1 | 0 | 0 | 1 | 1 | 0 | 1 | 1 | 1 | 0 | 0 | 1 | 1 | 0 | 1 | 1 | 1 | 0 | 0 | 1 | 1 | 0 | 1 | 1 |
| 0 | 1 | 0 | 1 | 1 | 1 | 0 | 1 | 0 | 1 | 0 | 1 | 1 | 1 | 0 | 1 | 0 | 1 | 0 | 1 | 1 | 1 | 0 | 1 |
| 1 | 1 | 0 | 1 | 0 | 1 | 0 | 1 | 1 | 1 | 0 | 1 | 0 | 1 | 1 | 0 | 1 | 1 | 0 | 1 | 0 | 1 | 1 | 0 |
| 0 | 0 | 1 | 1 | 1 | 0 | 0 | 1 | 0 | 0 | 1 | 1 | 1 | 1 | 1 | 0 | 0 | 0 | 1 | 1 | 1 | 1 | 1 | 0 |
| 1 | 0 | 1 | 1 | 0 | 0 | 1 | 1 | 1 | 0 | 1 | 1 | 0 | 0 | 1 | 1 | 1 | 0 | 1 | 1 | 0 | 1 | 0 | 1 |
| 0 | 1 | 1 | 1 | 0 | 0 | 1 | 1 | 0 | 1 | 1 | 1 | 0 | 0 | 1 | 1 | 0 | 1 | 1 | 1 | 0 | 0 | 1 | 1 |

BIT LOCATION A TO H INDICATES LOCATIONS OF OCTET BIT IN 8B/10B CODE.

TABLE 28

LIST (4) OF CONTROL INFORMATION IDENTIFICATION CODE IN WHICH
FORMULAE SUCH AS d = 4 and D = 4 ARE SATISFIED.

| CONTROL INFORMATION IDENTIFICATION CODE 37 | | | | | | | | CONTROL INFORMATION IDENTIFICATION CODE 38 | | | | | | | | CONTROL INFORMATION IDENTIFICATION CODE 39 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 0 | 1 | 0 | 1 | 0 | 0 | 0 | 0 | 0 | 0 | 0 | 0 | 1 | 0 | 0 | 0 | 0 | 0 | 0 | 0 | 1 |
| 0 | 1 | 0 | 0 | 1 | 1 | 0 | 0 | 1 | 0 | 0 | 0 | 1 | 0 | 1 | 0 | 1 | 0 | 0 | 0 | 1 | 0 | 1 | 0 |
| 1 | 0 | 1 | 0 | 1 | 1 | 0 | 1 | 0 | 1 | 0 | 0 | 1 | 1 | 0 | 0 | 1 | 1 | 0 | 0 | 1 | 1 | 0 | 1 |
| 0 | 1 | 1 | 0 | 1 | 0 | 1 | 1 | 1 | 0 | 1 | 0 | 1 | 1 | 0 | 1 | 0 | 0 | 1 | 0 | 1 | 1 | 0 | 0 |
| 1 | 1 | 1 | 0 | 0 | 1 | 1 | 0 | 0 | 1 | 1 | 0 | 1 | 0 | 1 | 1 | 0 | 1 | 1 | 0 | 1 | 0 | 1 | 1 |
| 0 | 0 | 0 | 1 | 1 | 0 | 0 | 1 | 1 | 0 | 0 | 1 | 0 | 1 | 0 | 0 | 1 | 0 | 0 | 1 | 0 | 1 | 0 | 0 |
| 1 | 0 | 0 | 1 | 0 | 1 | 0 | 0 | 0 | 1 | 0 | 1 | 0 | 0 | 1 | 0 | 1 | 0 | 1 | 0 | 1 | 1 | 1 | 0 |
| 0 | 1 | 0 | 1 | 0 | 0 | 1 | 0 | 1 | 1 | 0 | 1 | 1 | 1 | 1 | 1 | 1 | 1 | 0 | 1 | 0 | 0 | 1 | 1 |
| 1 | 1 | 0 | 1 | 1 | 1 | 1 | 1 | 0 | 0 | 1 | 1 | 1 | 1 | 1 | 0 | 0 | 0 | 1 | 1 | 0 | 0 | 1 | 0 |
| 1 | 0 | 1 | 1 | 0 | 0 | 1 | 1 | 1 | 0 | 1 | 1 | 0 | 0 | 1 | 1 | 1 | 0 | 1 | 1 | 1 | 1 | 1 | 1 |
| 0 | 1 | 1 | 1 | 0 | 1 | 0 | 1 | 0 | 1 | 1 | 1 | 0 | 1 | 0 | 1 | 0 | 1 | 1 | 1 | 0 | 1 | 0 | 1 |

| CONTROL INFORMATION IDENTIFICATION CODE 40 | | | | | | | | CONTROL INFORMATION IDENTIFICATION CODE 41 | | | | | | | | CONTROL INFORMATION IDENTIFICATION CODE 42 | | | | | | | |
|---|---|---|---|---|---|---|---|---|---|---|---|---|---|---|---|---|---|---|---|---|---|---|---|
| A | B | C | D | E | F | G | H | A | B | C | D | E | F | G | H | A | B | C | D | E | F | G | H |
| 1 | 0 | 0 | 0 | 1 | 1 | 0 | 0 | 0 | 0 | 0 | 0 | 0 | 0 | 0 | 1 | 0 | 0 | 0 | 0 | 0 | 0 | 0 | 1 |
| 0 | 1 | 0 | 0 | 1 | 0 | 1 | 0 | 1 | 0 | 0 | 0 | 1 | 0 | 1 | 0 | 1 | 0 | 0 | 0 | 1 | 1 | 0 | 0 |
| 1 | 0 | 1 | 0 | 1 | 0 | 1 | 1 | 0 | 1 | 0 | 0 | 1 | 0 | 1 | 1 | 1 | 1 | 0 | 0 | 1 | 0 | 1 | 1 |
| 0 | 1 | 1 | 0 | 1 | 0 | 1 | 0 | 1 | 0 | 1 | 0 | 1 | 0 | 1 | 1 | 0 | 0 | 1 | 0 | 1 | 0 | 1 | 0 |
| 1 | 1 | 1 | 0 | 0 | 1 | 1 | 0 | 0 | 1 | 1 | 0 | 1 | 1 | 0 | 1 | 0 | 1 | 1 | 0 | 1 | 1 | 0 | 1 |
| 0 | 0 | 0 | 1 | 1 | 0 | 0 | 1 | 1 | 0 | 0 | 1 | 0 | 1 | 0 | 1 | 0 | 0 | 1 | 0 | 0 | 1 | 0 | 0 |
| 1 | 0 | 0 | 1 | 0 | 0 | 1 | 0 | 0 | 1 | 0 | 1 | 0 | 0 | 1 | 0 | 0 | 1 | 0 | 1 | 1 | 1 | 1 | 0 |
| 0 | 1 | 0 | 1 | 0 | 1 | 0 | 0 | 1 | 1 | 0 | 1 | 1 | 1 | 1 | 1 | 1 | 1 | 0 | 1 | 0 | 1 | 0 | 1 |
| 1 | 1 | 0 | 1 | 1 | 1 | 1 | 1 | 0 | 0 | 1 | 1 | 1 | 1 | 1 | 0 | 0 | 0 | 1 | 1 | 0 | 1 | 0 | 0 |
| 1 | 0 | 1 | 1 | 0 | 1 | 0 | 1 | 1 | 0 | 1 | 1 | 0 | 1 | 0 | 1 | 1 | 0 | 1 | 1 | 1 | 1 | 1 | 1 |
| 0 | 1 | 1 | 1 | 0 | 0 | 1 | 1 | 0 | 1 | 1 | 1 | 0 | 0 | 1 | 1 | 1 | 1 | 1 | 0 | 0 | 1 | 1 | 1 |

BIT LOCATION A TO H INDICATES LOCATIONS OF OCTET BIT IN 8B/10B CODE.

Operation at the receiving node is the same as the operation which is described in the first and the second embodiment except the control information encoding rule. The control information encoding rule at the receiving node as the third embodiment according to the present invention is explained as follows.

Here, first, each of bit d1' to d4' in the control information identification and each of bit p1' to p4' in the control information identification parity are separated from the control information identification code according to the control information identification bit array as shown as follows (Step S241). Here, bit location A to H indicate locations of octet bit in the 8B/10B code.

| d1': bit location A | d2': bit location B | d3': bit location C |
|---|---|---|
| d4': bit location D | p1': bit location E | p2': bit location F |
| p3': bit location G | p4': bit location H | |

Here, the control information identification bit array is not limited to the above-described array as long as the control information identification bit array coincides with the array at the transmission node as shown in TABLES 25 to 28.

Next, the control information identification containing bit d1' to d4' and the control information identification parity check value containing bit p1' to p4' are determined using following formula (Step S243).

Parity Check Value=$(p1$ XOR $d1 \cdot d2 \cdot d3 \cdot (\sim d4)$XOR
$(\sim d1) \cdot d2 \cdot (\sim d3)$XOR$(\sim d1) \cdot (\sim d2) \cdot d3)+(p2$ XOR
$(\sim d1) \cdot d2 \cdot (\sim d3) \cdot (\sim d4)$XOR $d1 \cdot (\sim d2) \cdot d3 \cdot (\sim d4)$XOR
$d1 \cdot d2 \cdot (\sim d3) \cdot d4$ XOR$(\sim d1) \cdot (\sim d2) \cdot d4)+(p3$ XOR
$d1 \cdot d2 \cdot (\sim d3) \cdot (\sim d4)$XOR$(\sim d1) \cdot (\sim d2) \cdot d3 \cdot (\sim d4)$XOR
$d1 \cdot (\sim d2) \cdot d3 \cdot d4$ XOR$(\sim d1) \cdot (\sim d3) \cdot d4)+(p4$ XOR
$(\sim d1) \cdot (\sim d2) \cdot (\sim d3) \cdot d4$ XOR $d2 \cdot (\sim d3) \cdot (\sim d4)$XOR
$(\sim d2) \cdot d3 \cdot (\sim d4))+(d1 \cdot (\sim d2) \cdot (\sim d3) \cdot (\sim d4))+((\sim d1)$
$\cdot d2 \cdot d3 \cdot (\sim d4))+(d1 \cdot (\sim d2) \cdot (\sim d3) \cdot d4)+((\sim d1)$
$\cdot d2 \cdot d3 \cdot d4)+(d1 \cdot d2 \cdot d3 \cdot d4)$ In the formulae, "A·B" indicates "the logical product of A and B".

"A XOR B" indicates "the exclusive OR of A and B".

"~A" indicates "the logical negation of A".

Here, when a parity check formula which is different from that of the present embodiment is used at the transmission node, it is certain that the parity check value becomes different.

If a parity check value is not 0 (zero), an error process is performed as follows. The error process advances a control information error counter and nullifies the received control information identification code and the control data code.

By the above-mentioned control information encoding rule, in a transmission interval using 10B code, it is possible to detect more than three errors in the control information identification code containing eleven symbols or less symbols. Also, it is possible to detect one to three errors in the transmission interval in which 8B codes are used having each of bit corresponding in one-to-one relationship. Also, according to the control information encoding rule of the present invention, an error control information is not used for transmitting and processing the communication data.

That is, such an error control information is nullified therein; therefore, it is possible to realize a reliable communication system easily.

Next, an encoding method of the control information in which formulae such as (minimum) Hamming distance d of the 8B code=3, (minimum) Hamming distance D of the 10B code=3 are satisfied are explained as follows as a fourth embodiment of the present invention.

Operations in the transmission node are the same as the operation disclosed in the first to third embodiment except the control information encoding rule. The control information encoding rule is explained as follows.

As a result of an entire search in the communication system, there are not more than fifteen control information identification codes in which formulae such as (minimum) Hamming distance d of the 8B code=4, and (minimum) Hamming distance D of the 10B code=4 are satisfied. Therefore, at first, the control information encoding rule searches for 14 parts of the control information identification codes having 8 bit length in which formulae such as (minimum) Hamming distance d of the 8B code=4, and (minimum) Hamming distance D of the 10B code=3 are satisfied by performing a complete search. As the above-mentioned entire research, 34 control information identification codes are obtained. Among such control information identification codes, there are twelve control information identification codes which can contain 16 parts of control information identification codes in which a condition such as d=3, and D=3 can be satisfied if two control information identification codes are added. The control information encoding rule of the present invention is characterized in that, among such control information identification codes, the control information identifications are allocated to 4 parts of control information identification codes having the fewest combination of code language in which a code distance of the 10B code is 3.

Four parts of the control information identification codes 1 to 4 are shown in TABLES 29 and 30 as follows. Sixteen parts of the control information identification codes having 8 bit length constitute one set. Here, the (minimum) Hamming distance d of the 8B code is at least 3 and the (minimum) Hamming distance D of the 10B code is 3. When a set of control information identification code containing fourteen control information identification codes which are shown in TABLE 29 is used, it is possible to realize the condition such as (minimum) Hamming distance d of the 8B code is at least 4, and the (minimum) Hamming distance D of the 10B code is 3.

TABLE 29

LIST OF CONTROL INFORMATION IDENTIFICATION CODE IN WHICH FORMULAE SUCH AS d = 4 and D = 3 ARE SATISFIED.

| CONTROL INFORMATION IDENTIFICATION CODE 1 | | | | | | | | CONTROL INFORMATION IDENTIFICATION CODE 2 | | | | | | | |
|---|---|---|---|---|---|---|---|---|---|---|---|---|---|---|---|
| A | B | C | D | E | F | G | H | A | B | C | D | E | F | G | H |
| 1 | 0 | 1 | 0 | 0 | 0 | 0 | 0 | 1 | 0 | 1 | 0 | 0 | 0 | 0 | 0 |
| 0 | 1 | 0 | 1 | 0 | 0 | 0 | 0 | 0 | 1 | 0 | 1 | 0 | 0 | 0 | 0 |
| 1 | 1 | 0 | 0 | 1 | 1 | 0 | 0 | 0 | 1 | 1 | 0 | 1 | 1 | 0 | 0 |
| 0 | 0 | 1 | 1 | 1 | 1 | 0 | 0 | 1 | 0 | 0 | 1 | 1 | 1 | 0 | 0 |
| 0 | 1 | 1 | 0 | 1 | 0 | 1 | 0 | 1 | 1 | 0 | 0 | 1 | 0 | 1 | 0 |
| 1 | 0 | 0 | 1 | 1 | 0 | 1 | 0 | 0 | 0 | 1 | 1 | 1 | 0 | 1 | 0 |
| 0 | 0 | 0 | 0 | 0 | 1 | 1 | 0 | 0 | 0 | 0 | 0 | 0 | 1 | 1 | 0 |
| 1 | 1 | 1 | 1 | 1 | 0 | 0 | 1 | 1 | 1 | 1 | 1 | 1 | 0 | 0 | 1 |
| 0 | 1 | 1 | 0 | 0 | 1 | 0 | 1 | 1 | 1 | 0 | 0 | 0 | 1 | 0 | 1 |
| 1 | 0 | 0 | 1 | 0 | 1 | 0 | 1 | 0 | 0 | 1 | 1 | 0 | 1 | 0 | 1 |
| 1 | 1 | 0 | 0 | 0 | 0 | 1 | 1 | 0 | 1 | 1 | 0 | 0 | 0 | 1 | 1 |
| 0 | 0 | 1 | 1 | 0 | 0 | 1 | 1 | 1 | 0 | 0 | 1 | 0 | 0 | 1 | 1 |
| 1 | 0 | 1 | 0 | 1 | 1 | 1 | 1 | 1 | 0 | 1 | 0 | 1 | 1 | 1 | 1 |
| 0 | 1 | 0 | 1 | 1 | 1 | 1 | 1 | 0 | 1 | 0 | 1 | 1 | 1 | 1 | 1 |

| CONTROL INFORMATION IDENTIFICATION CODE 3 | | | | | | | | CONTROL INFORMATION IDENTIFICATION CODE 4 | | | | | | | |
|---|---|---|---|---|---|---|---|---|---|---|---|---|---|---|---|
| A | B | C | D | E | F | G | H | A | B | C | D | E | F | G | H |
| 0 | 1 | 1 | 0 | 1 | 0 | 0 | 0 | 0 | 1 | 1 | 0 | 1 | 0 | 0 | 0 |
| 1 | 0 | 0 | 1 | 1 | 0 | 0 | 0 | 1 | 0 | 0 | 1 | 1 | 0 | 0 | 0 |
| 1 | 1 | 0 | 0 | 0 | 1 | 0 | 0 | 1 | 0 | 1 | 0 | 0 | 1 | 0 | 0 |
| 0 | 0 | 1 | 1 | 0 | 1 | 0 | 0 | 0 | 1 | 0 | 1 | 0 | 1 | 0 | 0 |
| 1 | 0 | 1 | 0 | 0 | 0 | 1 | 0 | 1 | 1 | 0 | 0 | 0 | 0 | 1 | 0 |
| 0 | 1 | 0 | 1 | 0 | 0 | 1 | 0 | 0 | 0 | 1 | 1 | 0 | 0 | 1 | 0 |
| 1 | 1 | 1 | 1 | 1 | 1 | 1 | 0 | 1 | 1 | 1 | 1 | 1 | 1 | 1 | 0 |
| 0 | 0 | 0 | 0 | 0 | 0 | 0 | 1 | 0 | 0 | 0 | 0 | 0 | 0 | 0 | 1 |
| 1 | 0 | 1 | 0 | 1 | 1 | 0 | 1 | 1 | 1 | 0 | 0 | 1 | 1 | 0 | 1 |
| 0 | 1 | 0 | 1 | 1 | 1 | 0 | 1 | 0 | 0 | 1 | 1 | 1 | 1 | 0 | 1 |
| 1 | 1 | 0 | 0 | 1 | 0 | 1 | 1 | 1 | 0 | 1 | 0 | 1 | 0 | 1 | 1 |
| 0 | 0 | 1 | 1 | 1 | 0 | 1 | 1 | 0 | 1 | 0 | 1 | 1 | 0 | 1 | 1 |
| 0 | 1 | 1 | 0 | 0 | 1 | 1 | 1 | 0 | 1 | 1 | 0 | 0 | 1 | 1 | 1 |
| 1 | 0 | 0 | 1 | 0 | 1 | 1 | 1 | 1 | 0 | 0 | 1 | 0 | 1 | 1 | 1 |

BIT LOCATION A TO H INDICATES LOCATIONS OF OCTET BIT IN 8B/10B CODE.

TABLE 30

LIST OF CONTROL INFORMATION IDENTIFICATION CODE IN WHICH
FORMULAE SUCH AS d = 3 and D = 3 ARE SATISFIED.

| CONTROL INFORMATION IDENTIFICATION CODE 1 | | | | | | | | CONTROL INFORMATION IDENTIFICATION CODE 2 | | | | | | | |
|---|---|---|---|---|---|---|---|---|---|---|---|---|---|---|---|
| A | B | C | D | E | F | G | H | A | B | C | D | E | F | G | H |
| 1 | 0 | 1 | 1 | 0 | 1 | 1 | 0 | 1 | 0 | 1 | 1 | 0 | 1 | 1 | 0 |
| 0 | 1 | 0 | 0 | 1 | 0 | 0 | 1 | 0 | 1 | 0 | 0 | 1 | 0 | 0 | 1 |

| CONTROL INFORMATION IDENTIFICATION CODE 3 | | | | | | | | CONTROL INFORMATION IDENTIFICATION CODE 4 | | | | | | | |
|---|---|---|---|---|---|---|---|---|---|---|---|---|---|---|---|
| A | B | C | D | E | F | G | H | A | B | C | D | E | F | G | H |
| 0 | 1 | 0 | 0 | 1 | 1 | 1 | 0 | 0 | 1 | 0 | 0 | 1 | 1 | 1 | 0 |
| 1 | 0 | 1 | 1 | 0 | 0 | 0 | 1 | 1 | 0 | 1 | 1 | 0 | 0 | 0 | 1 |

BIT LOCATION A TO H INDICATES LOCATIONS OF OCTET BIT IN 8B/10B CODE.

An example of the allocation is shown as follows.

First, bit $p1$ to $p4$ of the control information identification parity are calculated from each of the bit $d1$ to $d4$ of the control information identification according to the following formulae and are given (Step S131).

$$p1 = d1 \cdot (\sim d2) \cdot (\sim d3) \, XOR \, (\sim d1)d2 \cdot (\sim d3) \, XOR \cdot (\sim d1) \cdot (\sim d2) \cdot d3 \, XOR \, d1 \cdot d2 \cdot d3$$

$$p2 = (\sim d2) \cdot (\sim d3) \cdot (\sim d4) \, XOR \, d2 \cdot d3 \cdot (\sim d4) \, XOR \, d2 \cdot (\sim d3) \cdot d4 \, XOR (\sim d2) \cdot d3 \cdot d4$$

$$p3 = (\sim d1) \cdot (\sim d2) \cdot (\sim d4) \, XOR \, d1 \cdot d2 \cdot (\sim d4) \, XOR \, d1 \cdot (\sim d2) \cdot d4 \, XOR (\sim d1) \cdot d2 \cdot d4$$

$$p4 = d1 \cdot d2 \cdot d3 \cdot d4 \, XOR \cdot d1 \cdot (\sim d3) \cdot (\sim d4) \, XOR \, d2 \cdot (\sim d3) \cdot (\sim d4) XOR (\sim d1) \cdot d2 \cdot (\sim d4) XOR (\sim d1) \cdot d2 \cdot (\sim d3) \, XOR (\sim d1) \cdot d3 \cdot (\sim d4) XOR (\sim d1) \cdot (\sim d3) \cdot d4$$

In the formulae, "A·B" indicates "the logical product of A and B".

"A XOR B" indicates "the exclusive OR of A and B".

"~A" indicates "the logical negation of A".

Here, each of bit $d1$ to $d4$ in the control information identification and each of bit $p1$ to $p4$ in the control information identification parity are disposed according to the following control information identification bit array so as to obtain the control information identification code (Step S132). Here, bit location A to H indicate locations of octet bit in the 8B/10B code.

| d1: bit location A | d2: bit location H | d3: bit location C |
|---|---|---|
| d4: bit location D | p1: bit location E | p2: bit location F |
| p3: bit location G | p4: bit location B | |

The control information identification codes which are obtained by the control information encoding rules according to the present embodiment are shown in a column of "control information identification code 1" in TABLES 29 and 30. The control information identification parity and the control information identification bit array are not limited to the above-mentioned parity and array. When a control information identification having 4 bit length selects parity and array so as to correspond to the control information identification codes 1 to 4 in one-to-one relationship as shown in TABLES 29 and 30, the control information identification has the same error detecting capacity for 10B code as in the case of the above-mentioned parity and array.

Operation at the receiving node is the same as the operation which is described in the first to third embodiments except for the control information encoding rules. The control information encoding rules at the receiving node as in the third embodiment according to the present invention is explained as follows.

Here, first, each of bit $d1'$ to $d4'$ in the control information identification and each of bit $p1'$ to $p4'$ in the control information identification parity are separated from the control information identification code according to the control information identification bit array as shown as follows (Step S241). Here, bit location A to H indicate locations of octet bit in the 8B/10B code.

| d1': bit location A | d2': bit location H | d3': bit location C |
|---|---|---|
| d4': bit location D | p1': bit location E | p2': bit location F |
| p3': bit location G | p4': bit location B | |

Here, the control information identification bit array is not limited to the above-described array as long as the control information identification bit array coincides with the array at the transmission node as shown in TABLES 29 and 30.

Next, the control information identification containing bit $d1'$ to $d4'$ and the control information identification parity check value containing bit $p1'$ to $p4'$ are determined using following formula (Step S243).

$$\text{Parity Check Value} = (p1' \, XOR \, d1' \cdot (\sim d2') \cdot (\sim d3')$$

$$XOR (\sim d1') \cdot d2' \cdot (\sim d3')$$

$$XOR (\sim d1') \cdot (\sim d2') \cdot d3'$$

$$XOR \, d1' \cdot d2' \cdot d3') + (d2'$$

$$XOR (\sim d2') \cdot (\sim d3') \cdot (\sim d4')$$

$$XOR \, d2' \cdot d3' \cdot (\sim d4') XOR \, d2' \cdot (\sim d3') \cdot d4'$$

$$XOR (\sim d2') \cdot d3' \cdot d4') + (p3$$

$$XOR (\sim d1') \cdot (\sim d2') \cdot (\sim d4')$$

$XOR\ d1'\cdot d2'\cdot(\sim d4')XOR\ d1'\cdot(\sim d2')\cdot d4'$ $XOR(\sim d1')\cdot d2'\cdot d4')+(p4\ XOR\ d1'\cdot d2'\cdot d3'\cdot d4'$ $XOR\ d1'\cdot(\sim d3')\cdot(\sim d4')XOR\ d2'\cdot(\sim d3')\cdot(\sim d4')$ $XOR(\sim d1')\cdot d2'\cdot(\sim d4')XOR(\sim d1')\cdot d2'\cdot(\sim d3')$ $XOR(\sim d1')\cdot d3'\cdot(\sim d4')XOR(\sim d1')\cdot(\sim d3')\cdot d4')$ In the formulae, "A·B" indicates "the logical product of A and B".

"A XOR B" indicates "the exclusive OR of A and B".

"~A" indicates "the logical negation of A".

Here, when a parity check formula which is different from that of the present embodiment is used at the transmission node, it is certain that the parity check value becomes different (Steps S244, S245).

If a parity check value is not 0 (zero), an error process is performed as follows. The error process advances a control information error counter and nullifies the received control information identification code and the control data code.

By the above-mentioned control information encoding rule, in a transmission interval using 10B code, it is possible to detect at least two errors in the control information identification code. Also, it is possible to detect one to two errors in the transmission interval in which 8B codes are used each having a bit corresponding in one-to-one relationship. Also, when the control information identification has 14 symbols or less, the codes are allocated such that three errors or less can be detected in the transmission interval having 8B code in which each bit is corresponding in one-to-one relationship.

Furthermore, an erroneous control information is not used in transmission and processing operation for the communication data and is nullified. Therefore, the reliability of the communication system increases.

In the above-explained embodiments 1 to 4, codes having desirable Hamming distance are obtained by employing four methods as follows.

(1). The (minimum) Hamming distance d of an 8B code is 4, and (minimum) Hamming distance D of 10B code is 2 by using (8, 4) SEC-DED code as a control information identification parity.

(2). The (minimum) Hamming distance d of an 8B code is 3, and (minimum) Hamming distance D of 10B code is 3 by using a code in which 1 ibt is added to (7, 4) Hamming code as a control information identification parity.

(3). The (minimum) Hamming distance d of an 8B code is 4, and (minimum) Hamming distance D of 10B code is 4 by determining the array and the control information identification parity such that the control information identification having eleven symbols or less correspond to the control information identification codes which are shown in TABLES 25 to 28.

(4). The (minimum) Hamming distance d of an 8B code is 3, and (minimum) Hamming distance D of 10B code is 3 by determining the array and the control information identification parity such that the control information identification having eleven symbols or less corresponds to the control information identification codes which are shown in TABLES 29 and 30.

The present invention is not limited to the array and parity which are shown in the above-explained embodiments. In the present invention, it is possible to realize a control information encoding rule having different value of "d" and "D" from those described in the above-mentioned embodiments by employing a different method for generating the control information identification parity and disposing the control information bit array. Thus, it is possible to realize a desirable error detection capacity according to the characteristics of errors generated in the transmission line.

By the present invention, it is possible to detect errors in the control information. Also, by using the present invention, it is possible to detect errors of the control information which occur in any one of 64B/66B-encoded transmission interval or 8B/10B-encoded transmission interval by a common control information encoding rule.

For one area to which the present invention can be applied, it is possible to apply the encoding method according to the present invention to WAN (Wide Area Network) by adding a monitoring function for maintenance use on a Giga-bit Ethernet or 10 Giga-bit Ethernet. In such a network, the control information is transmitted by using IPG (Inter-Packet Gap). However, when an error occurs in the control information, an erroneous operation is caused on the network monitoring function. Such erroneous operation may cause a serious adverse effect on the entire network.

By applying the encoding method according to the present invention to the control information, it is possible to improve error detecting capacity; thus, it is possible to enhance the reliability of network management.

The invention claimed is:

1. An encoding method for a communication system for transmitting communication data, in which at least a portion of encoded control information is added for transmitting and the communication data is processed to M (M is an integer) parts of control information code according to a control information encoding rule comprising the steps of:

encoding the M parts of control information code into 8B/10B code, or 8B code, or 8B code with one to one mapping on each bit, according to said control information encoding rule;

sending the encoded M parts of control information code;

receiving the encoded M parts of control information code;

decoding the encoded M parts of control information code into the M parts of control information code, according to said control information encoding rule;

decoding the M parts of control information code into at least a portion of the control information according to said control information encoding rule, said encoding method separating at least a portion of the control information into M parts of control information blocks having N (N is an integer from 1 to 7) bit length; and encoding each of the control information blocks into M parts of the control information code having 8 bit length, according to said control information encoding rule;

wherein said control information encoding rule regulates that Hamming distance of each of the control information code parts having 8 bit length to be at least d (d is an integer from 2 to 8), and only when M parts of the control information code are encoded into M parts of control information having 10 (ten) bit length according to the 8B/10B encoding rule, and the Hamming distance of each of the control information code having 10 bit length is at least D (D is an integer from 2 to 10).

2. An encoding method according to claim 1 further comprising:

separating at least a portion of the control information into M parts of control information blocks having 4 bit length;

performing an exclusive OR operation for second, third, and fourth bit in the control information block i (i is an integer from 1 to M) and regarding a result of the exclusive OR operation as a first parity bit of the control information parity corresponding to the control information block i;

performing an exclusive OR operation for first, third, and fourth bit in the control information block i and regarding a result of the exclusive OR operations as a second parity bit of the control information parity corresponding to the control information block i;

performing an exclusive OR operation for first, second, and fourth bit in the control information block i and regarding a result of the exclusive OR operation as a third party bit of the control information parity corresponding to the control information block i;

performing an exclusive OR operation for first, second, and third bit in the control information block i and regarding a result of the exclusive OR operation as a fourth parity bit of the control information parity corresponding to the control information block i;

adding a control information parity having 4 bit length to the control information block i and arranging the control information block according to a predetermined control information bit array; and encoding the control information block i to M parts of control information code having 8 bit length and Hamming distance of at least 4.

3. An encoding method according to claim 2 wherein a Hamming distance of the code of the control information parity and the control information bit array is at least 2 when M parts of the control information code having 8 bit length are encoded to M parts of control information 10B code according to 8B/10B encoding rule.

4. An encoding method according to claim 1, further comprising:

separating each of M parts of the control information code into a control information block and control information parity;

performing an exclusive OR operation for second, third, and fourth bit in the control information block i and comparing a result of the exclusive OR operation to a first parity bit of the control information parity corresponding to the control information block i;

performing an exclusive OR operation for first, third, and fourth bit in the control information block i and comparing a result of the exclusive OR operation to a second parity bit of the control information parity corresponding to the control information block i;

performing an exclusive OR operation for first, second, and fourth bit in the control information block i and comparing a result of the exclusive OR operation to a third parity bit of the control information parity corresponding to the control information block i;

performing an exclusive OR operation for first, second, and third bit in the control information block i and comparing a result of the exclusive OR operation to a fourth parity bit of the control information parity corresponding to the control information block i; and a predetermined control information error processing when at least one or more inconsistency is found in the comparisons.

5. An encoding method according to claim 1, further comprising:

separating at least a portion of the control information into M parts of the control information block i (i is an integer from 1 to M) having 4 bit length indicating L symbols (L is an integer which is 11 or less) among 16 symbols which can be represented by 4 bit;

adding control information parities having 4 bit length to each of the control information block i and arranging the control information block i according to a predetermined control information bit array; and encoding the control information block i which is disposed according to the control information bit array to M parts of control information code having 8 bit length and Hamming distance such as at least 4; wherein Hamming distances of control information code of the control information parity and the control information bit array are at least 4 when M parts of control information code having 8 bit length are encoded to M parts of control information 10B code having 10 bit length according to 8B/10B encoding rule.

6. An encoding method according to claim 1, further comprising:

separating at least a portion of the control information into M parts of the control information block i having 4 bit length;

adding control information panties having 4 bit length to each of the control information block i (i is an integer from 1 to M) and arranging the control information block i according to a predetermined control information bit array; and encoding the control information block i which is disposed according to the control information bit array to M parts of control information code having 8 bit length and Hamming distance such as at least 3; wherein Hamming distances of control information code of the control information parity and the control information bit array are at least 3 when M parts of control information code having 8 bit length are encoded to M parts of control information 10B code having 10 bit length according to 8B/10B encoding rule.

* * * * *